United States Patent
Gawase et al.

(10) Patent No.: US 10,985,027 B2
(45) Date of Patent: Apr. 20, 2021

(54) METHOD FOR MANUFACTURING SEMICONDUCTOR DEVICE

(71) Applicant: Kioxia Corporation, Minato-ku (JP)

(72) Inventors: Akifumi Gawase, Kuwana (JP); Yukiteru Matsui, Nagoya (JP); Mikiya Sakashita, Nagoya (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/820,888

(22) Filed: Mar. 17, 2020

(65) Prior Publication Data

US 2021/0082711 A1 Mar. 18, 2021

(30) Foreign Application Priority Data

Sep. 13, 2019 (JP) .............................. JP2019-167605

(51) Int. Cl.
*H01L 21/31* (2006.01)
*H01L 21/3105* (2006.01)
*H01L 21/311* (2006.01)
*H01L 21/033* (2006.01)

(52) U.S. Cl.
CPC .... *H01L 21/31053* (2013.01); *H01L 21/0332* (2013.01); *H01L 21/31144* (2013.01)

(58) Field of Classification Search
None
See application file for complete search history.

(56) References Cited

U.S. PATENT DOCUMENTS

2013/0078332 A1 3/2013 Satou et al.
2013/0217228 A1 8/2013 Kodera et al.

FOREIGN PATENT DOCUMENTS

| JP | 2006-310678 A | 11/2006 |
| JP | 2013-73999 A | 4/2013 |
| JP | 6162417 B2 | 7/2017 |

*Primary Examiner* — Roberts P Culbert
(74) *Attorney, Agent, or Firm* — Oblon, McClelland, Maier & Neustadt, L.L.P.

(57) ABSTRACT

A method for manufacturing a semiconductor device according to an embodiment includes: forming a first layer on a semiconductor substrate, a surface of the first layer having a first plane of which distance from the semiconductor substrate is a first distance and a second plane of which distance from the semiconductor substrate is a second distance smaller than the first distance, and a difference between the first distance and the second distance being 30 nm or more; performing planarization processing on the first layer to have the difference of less than 30 nm; forming a second layer directly on the first layer after performing the planarization processing; supplying a resist to the second layer; bringing a template having a pattern into contact with the resist to form a resist layer to which the pattern has been transferred; and etching the second layer using the resist layer as a mask.

20 Claims, 84 Drawing Sheets

METHOD FOR MANUFACTURING SEMICONDUCTOR DEVICE

CROSS-REFERENCE TO RELATED APPLICATION

This application is based upon and claims the benefit of priority from Japanese Patent Application No. 2019-167605, filed on Sep. 13, 2019, the entire contents of which are incorporated herein by reference. And, the entire contents of United States Patent Application Publication No. 2017/0076953, published on Mar. 16, 2017, are incorporated herein by reference.

FIELD

Embodiments described herein relate generally to a method for manufacturing a semiconductor device.

BACKGROUND

In order to realize high integration of a semiconductor device, it is necessary to form a fine pattern on a semiconductor substrate. As one of methods for forming the fine pattern on the semiconductor substrate, a nanoimprint method is known.

In the nanoimprint method, a template (mold) having a pattern is brought into contact with a resist supplied to a surface of a layer to be processed to form a resist layer to which the pattern has been transferred. The pattern is formed on the layer to be processed by etching the layer to be processed using the resist layer as a mask.

If an amount of the resist supplied to the surface of the layer to be processed is insufficient, an amount of the resist to be filled in the pattern of the template is insufficient, and pattern defects may occur.

DETAILED DESCRIPTION

Figure 1:
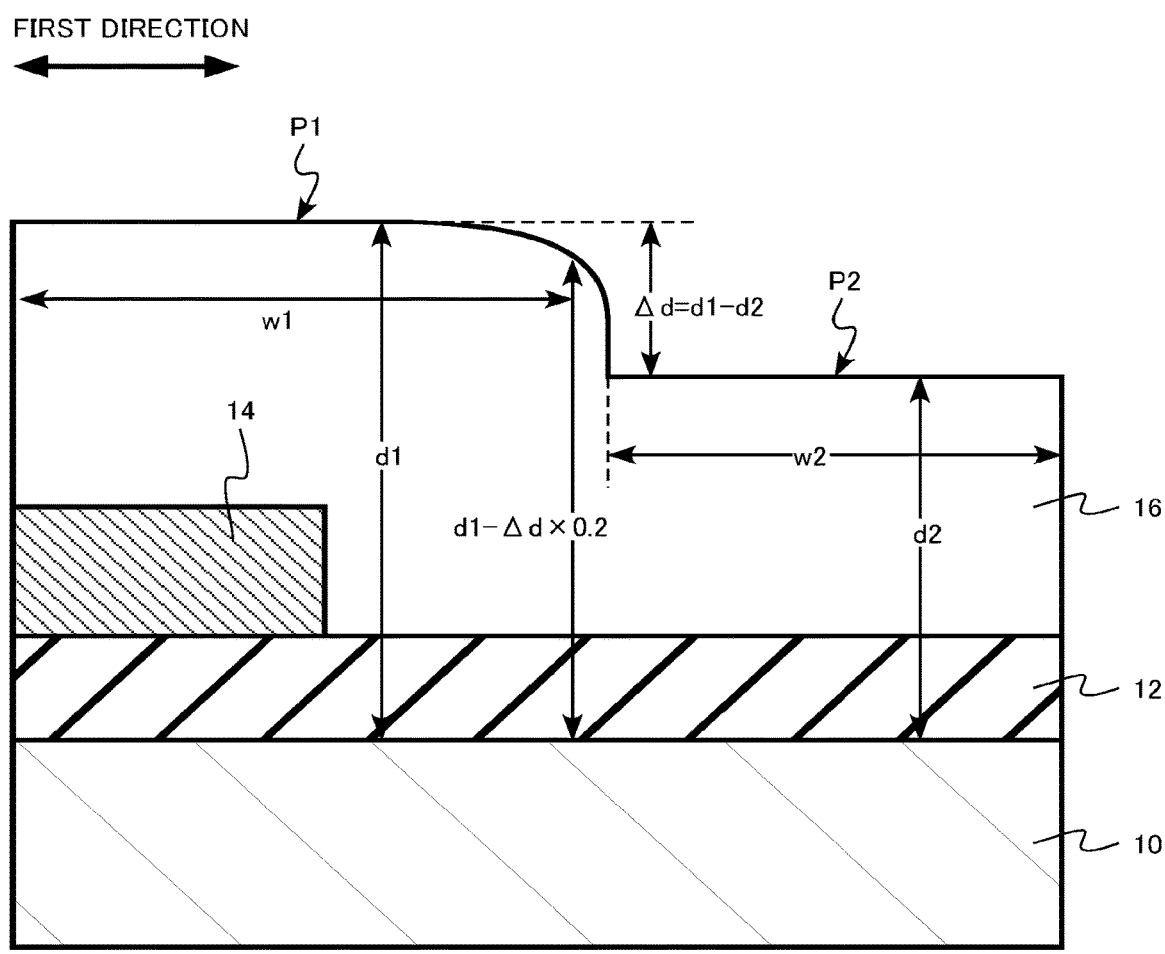
FIG. 1 is a schematic cross-sectional view showing an example of a method for manufacturing a semiconductor device according to a first embodiment.

A method for manufacturing a semiconductor device according to an embodiment includes: forming a first layer on a semiconductor substrate, a surface of the first layer having a first plane of which distance from the semiconductor substrate is a first distance and a second plane of which distance from the semiconductor substrate is a second distance smaller than the first distance, and a difference between the first distance and the second distance being 30 nm or more; performing planarization processing on the first layer to have the difference of less than 30 nm; forming a second layer directly on the first layer after performing the planarization processing; supplying a resist on the second layer; bringing a template having a pattern into contact with the resist to form a resist layer to which the pattern has been transferred; and etching the second layer using the resist layer as a mask.

Hereinafter, embodiments of the present disclosure will be described with reference to the drawings. In the following description, the same or similar members are denoted by the same reference numerals and the description of the members described once is appropriately omitted.

Qualitative analysis and quantitative analysis of chemical compositions of members used in a method for manufacturing a semiconductor device in the present specification can be performed by secondary ion mass spectroscopy (SIMS) or energy dispersive X-ray spectroscopy (EDX), for example. Further, thicknesses of the members used in the method for manufacturing the semiconductor device, distances between the members, and the like can be measured using a scanning electron microscope (SEM) or a transmission electron microscope (TEM), for example.

Hereinafter, a method for manufacturing a semiconductor device according to an embodiment will be described with reference to the drawings.

First Embodiment

A method for manufacturing a semiconductor device according to a first embodiment includes: forming a first layer on a semiconductor substrate, a surface of the first layer having a first plane of which distance from the semiconductor substrate is a first distance and a second plane of which distance from the semiconductor substrate is a second distance smaller than the first distance, and a difference between the first distance and the second distance being 30 nm or more; performing planarization processing on the first layer to have the difference of less than 30 nm; forming a second layer directly on the first layer after performing the planarization processing; supplying a resist to the second layer; bringing a template having a pattern into contact with the resist to form a resist layer to which the pattern has been transferred; and etching the second layer using the resist layer as a mask.

FIGS. 1 to 10 are schematic cross-sectional views showing an example of the method for manufacturing the semiconductor device according to the first embodiment. In the method for manufacturing the semiconductor device according to the first embodiment, a chemical mechanical polishing method (CMP method) is used in planarization processing.

Hereinafter, an example of the method for manufacturing the semiconductor device according to the first embodiment will be described with reference to the drawings. In the method for manufacturing the semiconductor device according to the first embodiment, a pattern is formed using a nanoimprint method. In the method for manufacturing the semiconductor device according to the first embodiment, a case where a metal layer having a line-and-space pattern is formed using the nanoimprint method will be described as an example.

First, a semiconductor substrate 10 is prepared. The semiconductor substrate 10 is, for example, single crystal silicon.

Next, a first insulating layer 12 is formed on the semiconductor substrate 10. The first insulating layer 12 is formed by using a known chemical vapor deposition method (CVD method), for example. The first insulating layer 12 is, for example, silicon oxide or silicon nitride.

Next, a patterned first metal layer 14 is formed on the first insulating layer 12. Next, a second insulating layer 16 is formed on the first metal layer 14 (FIG. 1). The second insulating layer 16 is an example of a first layer.

The second insulating layer 16 is formed by using a known CVD method, for example. The second insulating layer 16 is, for example, silicon oxide or silicon nitride.

The second insulating layer 16 has a first plane P1 and a second plane P2 on a surface. A second distance (d2 in FIG. 1) from the semiconductor substrate 10 to the second plane P2 is smaller than a first distance (d1 in FIG. 1) from the semiconductor substrate 10 to the first plane P1. The second distance d2 is a minimum distance from the semiconductor substrate 10 to the second plane P2. Further, the first distance d1 is a maximum distance from the semiconductor substrate 10 to the first plane P1.

A difference ($\Delta d = d1 - d2$ in FIG. 1) between the first distance d1 and the second distance d2 is 30 nm or more. Hereinafter, the difference $\Delta d$ between the first distance d1 and the second distance d2 is also referred to as a surface step $\Delta d$ of the second insulating layer 16. The difference $\Delta d$ between the first distance d1 and the second distance d2 represents an absolute value of the difference between the first distance d1 and the second distance d2.

A first width (w1 in FIG. 1) of the first plane P1 in a first direction perpendicular to a thickness direction of the semiconductor substrate 10 is, for example, 1 mm or more. Further, a second width (w2 in FIG. 1) of the second plane P2 in the first direction perpendicular to the thickness direction of the semiconductor substrate 10 is, for example, 1 mm or more. The first width w1 is defined as a width of a region where the distance from the semiconductor substrate 10 to the first plane P1 is (d1−Δd×0.2) or more, in the first plane P1. Further, the second width w2 is defined as a width of a region where the distance from the semiconductor substrate 10 is (d2+Δd×0.2) or less, in the second plane P2.

Figure 2:
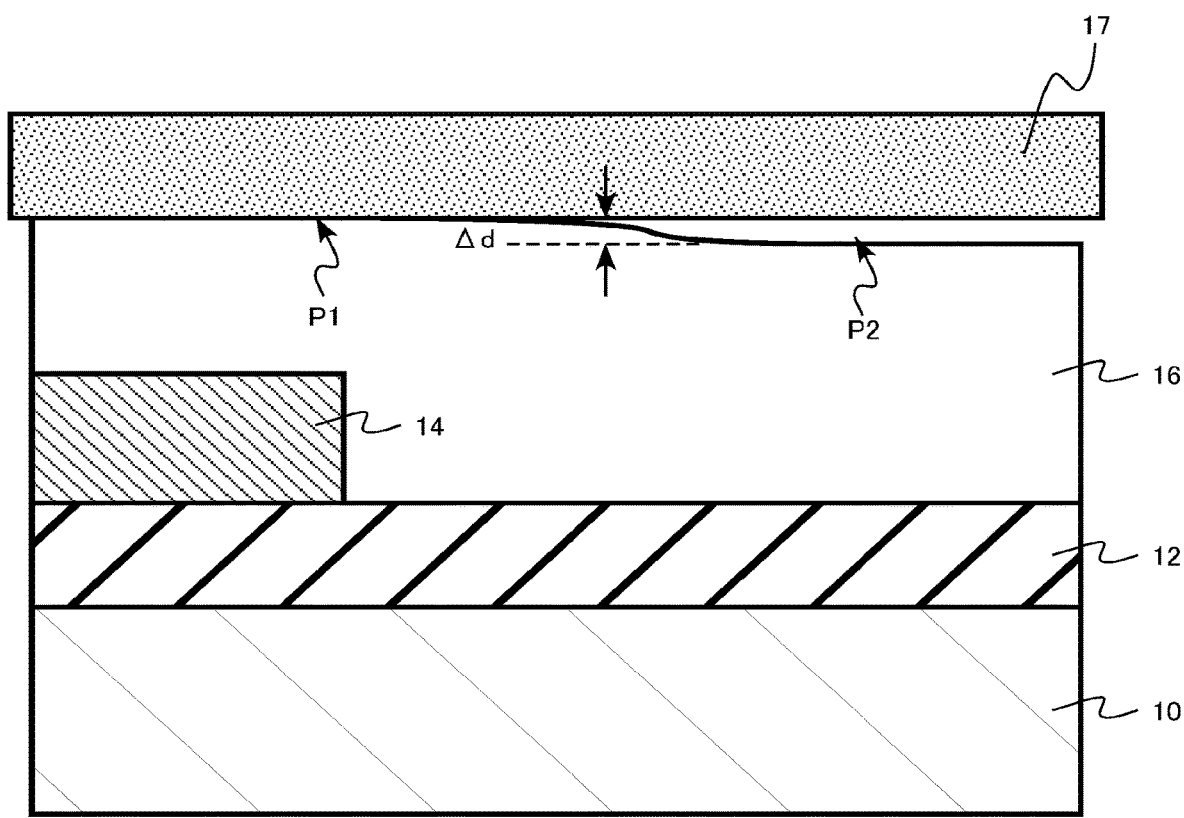
FIG. 2 is a schematic cross-sectional view showing an example of the method for manufacturing the semiconductor device according to the first embodiment.

Next, the second insulating layer 16 is polished by using a chemical mechanical polishing method so that the surface step Δd becomes less than 30 nm (FIG. 2). The polishing of the second insulating layer 16 is performed, for example, by rotating the semiconductor substrate 10, supplying slurry to the surface of the second insulating layer 16, and bringing a polishing pad 17 into contact with the surface of the second insulating layer 16.

The slurry includes abrasive grains. The abrasive grains are, for example, particles including silicon oxide, aluminum oxide, or cerium oxide. The polishing pad 17 includes, for example, a resin or a nonwoven fabric. The polishing pad 17 is, for example, a polyurethane resin.

When the second insulating layer 16 is polished, for example, the second insulating layer 16 is polished while the polishing pad 17 is cooled. The cooling of the polishing pad 17 is performed using, for example, a gas or a liquid. When the second insulating layer 16 is polished, the polishing pad 17 is cooled, and the second insulating layer 16 is polished while the polishing pad 17 is maintained at 50° C. or lower, for example.

When the second insulating layer 16 is polished, for example, the polishing pad 17 having a storage elastic modulus of 500 MPa or more and 10 GPa or less is brought into contact with a surface of the second insulating layer 16 and the second insulating layer 16 is polished. The storage elastic modulus of the polishing pad 17 during polishing of the second insulating layer 16 becomes 500 MPa or more and 10 GPa or less.

Figure 3:
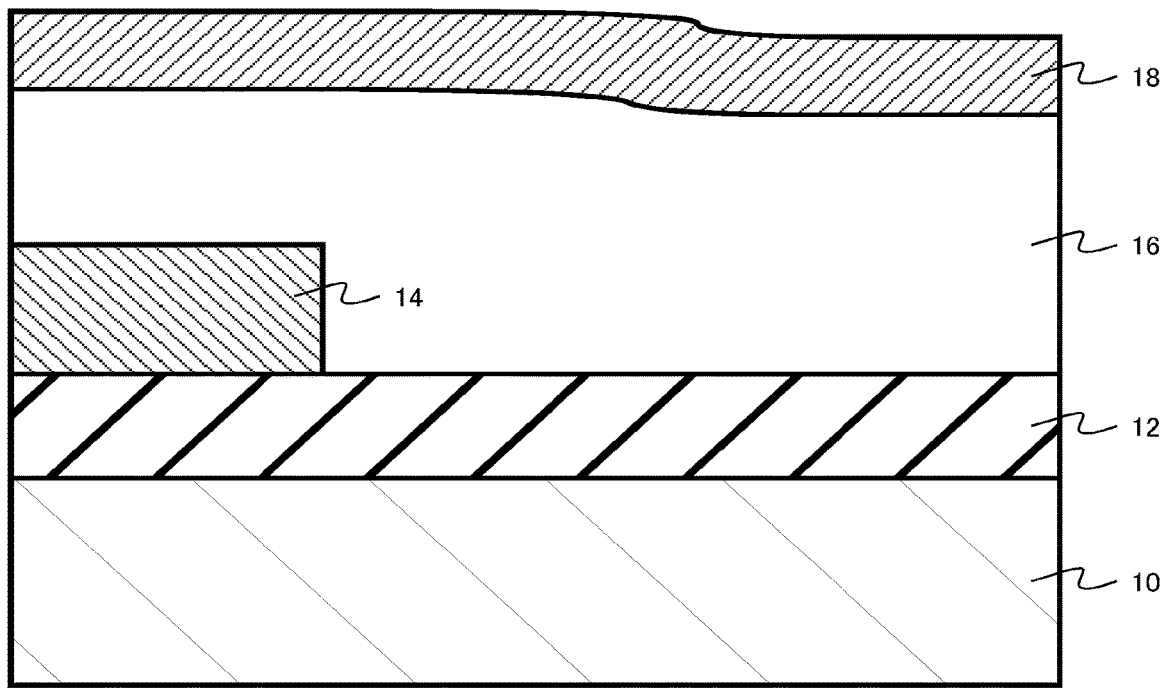
FIG. 3 is a schematic cross-sectional view showing an example of the method for manufacturing the semiconductor device according to the first embodiment.

Next, a second metal layer 18 is formed on the second insulating layer 16 (FIG. 3). The second metal layer 18 is an example of a second layer. The second metal layer 18 is a processed layer on which a pattern is formed using a nanoimprint method.

The second metal layer 18 is formed using, for example, a known CVD method. The second metal layer 18 is, for example, tungsten, titanium nitride, or aluminum.

Figure 4:
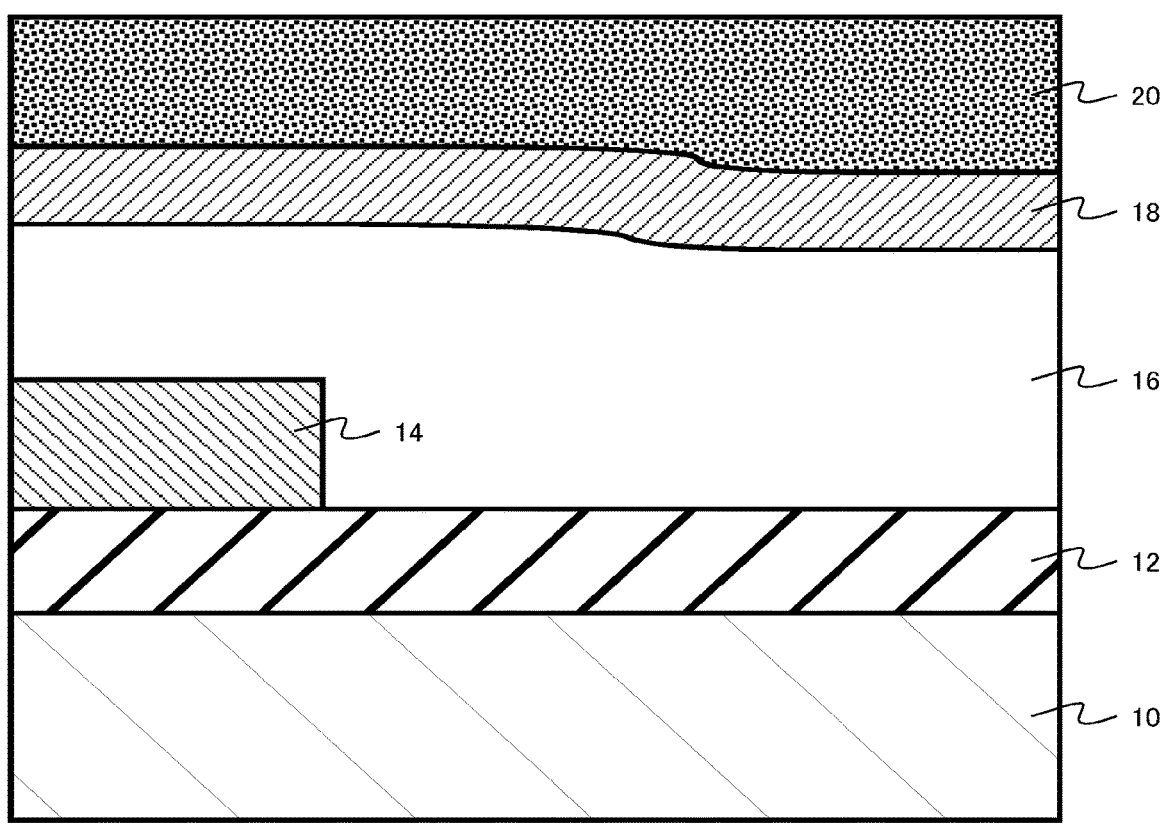
FIG. 4 is a schematic cross-sectional view showing an example of the method for manufacturing the semiconductor device according to the first embodiment.

Next, a resist 20 is supplied to a surface of the second metal layer 18 (FIG. 4). The resist 20 is applied to the entire surface of the second metal layer 18 using, for example, a spin coating method. Further, the resist 20 is dropped on the surface of the second metal layer 18 using, for example, an inkjet method.

The resist 20 is a resist used for the nanoimprint method. The resist 20 includes, for example, a photocurable resin or a thermosetting resin.

Figure 5:
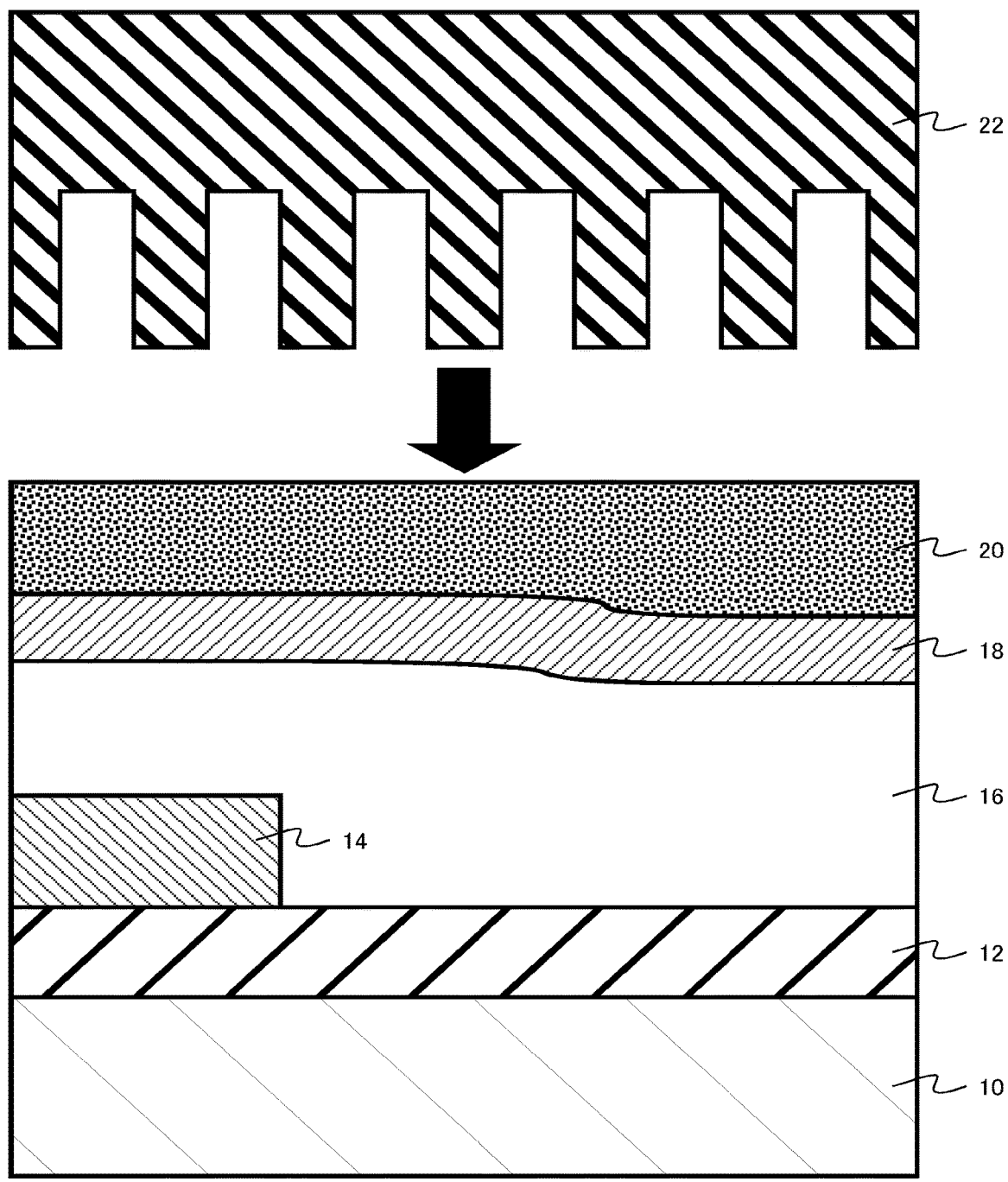
FIG. 5 is a schematic cross-sectional view showing an example of the method for manufacturing the semiconductor device according to the first embodiment.

Next, a template 22 (mold) having a pattern is brought into contact with the resist 20 on the surface of the second metal layer 18 (FIG. 5). As a material of the template 22, for example, when the resist 20 includes a photocurable resin, a material transmitting light is used. The template 22 is, for example, quartz glass.

Figure 6:
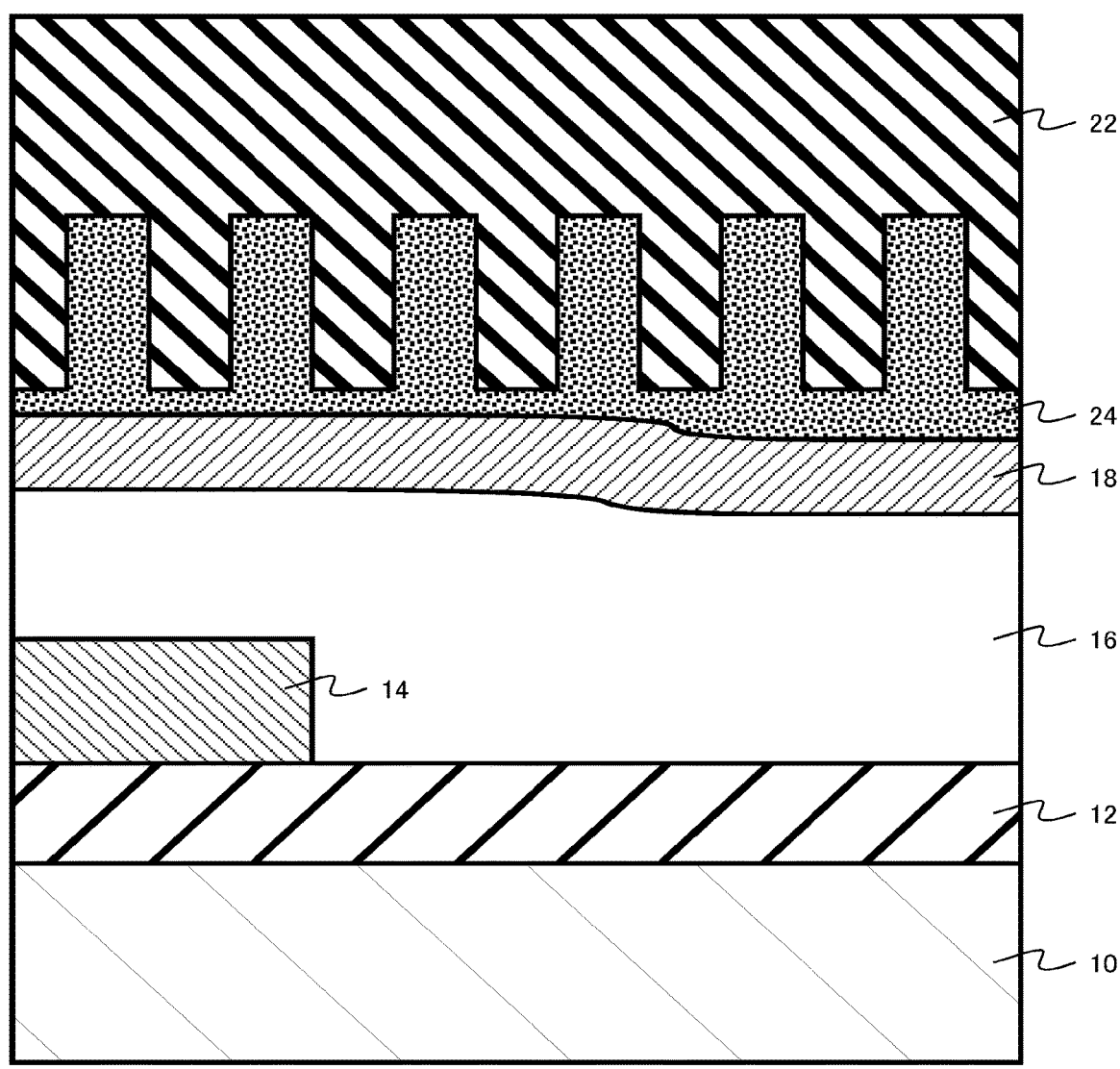
FIG. 6 is a schematic cross-sectional view showing an example of the method for manufacturing the semiconductor device according to the first embodiment.

By bringing the template 22 into contact with the resist 20 on the surface of the second metal layer 18, the resist 20 is sucked up into a concave portion of the template 22. The pattern of the template 22 is transferred to the resist 20, and a resist layer 24 is formed on the surface of the second metal layer 18 (FIG. 6).

Figure 7:
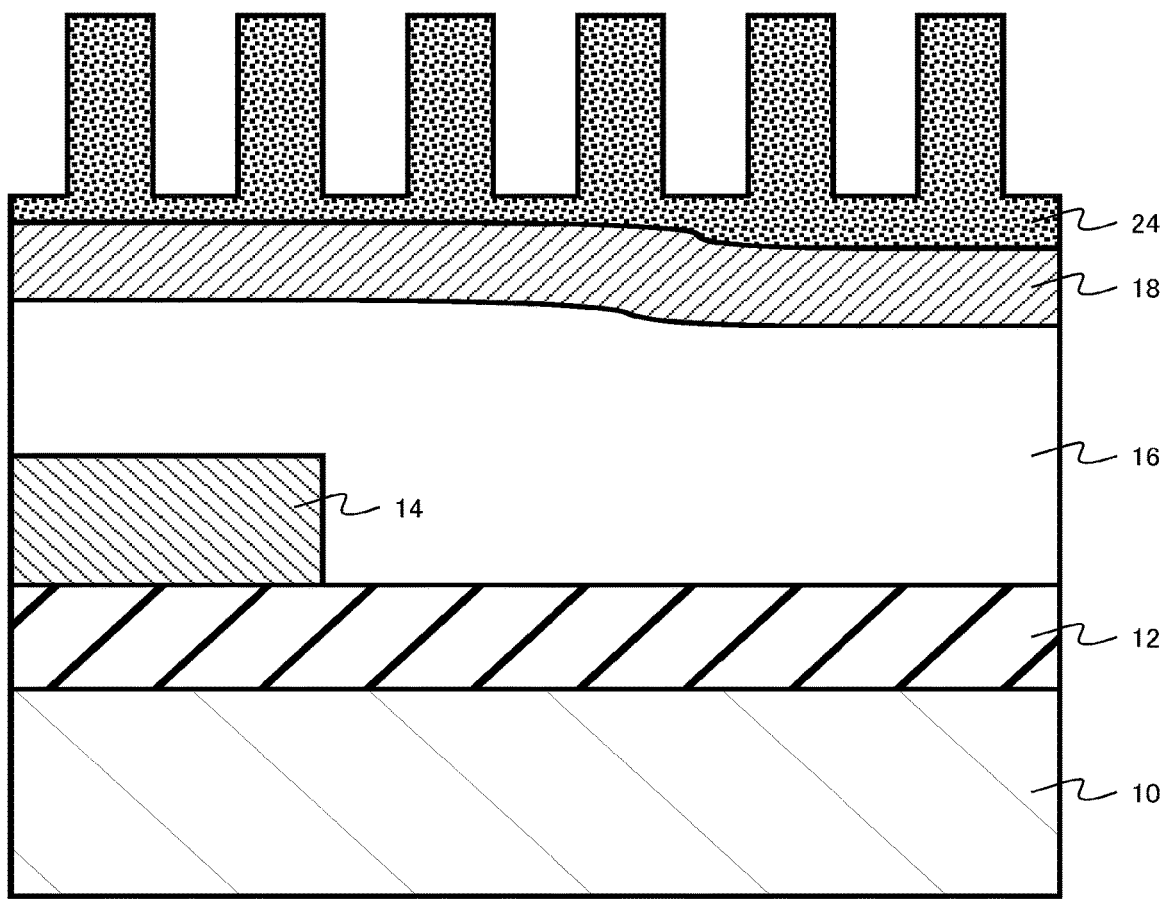
FIG. 7 is a schematic cross-sectional view showing an example of the method for manufacturing the semiconductor device according to the first embodiment.

After forming the resist layer 24 to which the pattern of the template 22 has been transferred, the template 22 is separated from the resist layer 24 (FIG. 7).

Figure 8:
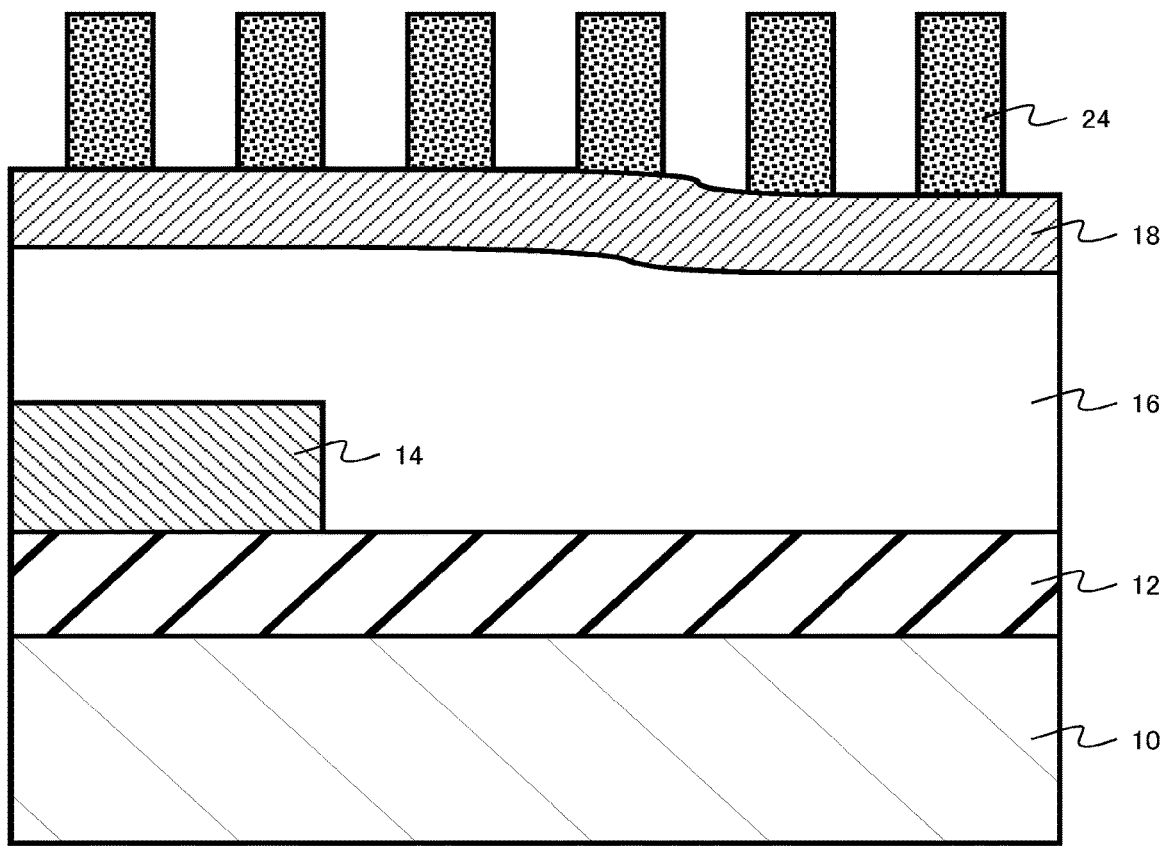
FIG. 8 is a schematic cross-sectional view showing an example of the method for manufacturing the semiconductor device according to the first embodiment.

Next, the entire surface of the resist layer 24 is etched, so that the thin resist layer 24 remaining in a space portion of a line pattern is removed (FIG. 8). The entire surface etching is performed using, for example, a known reactive ion etching device.

Figure 9:
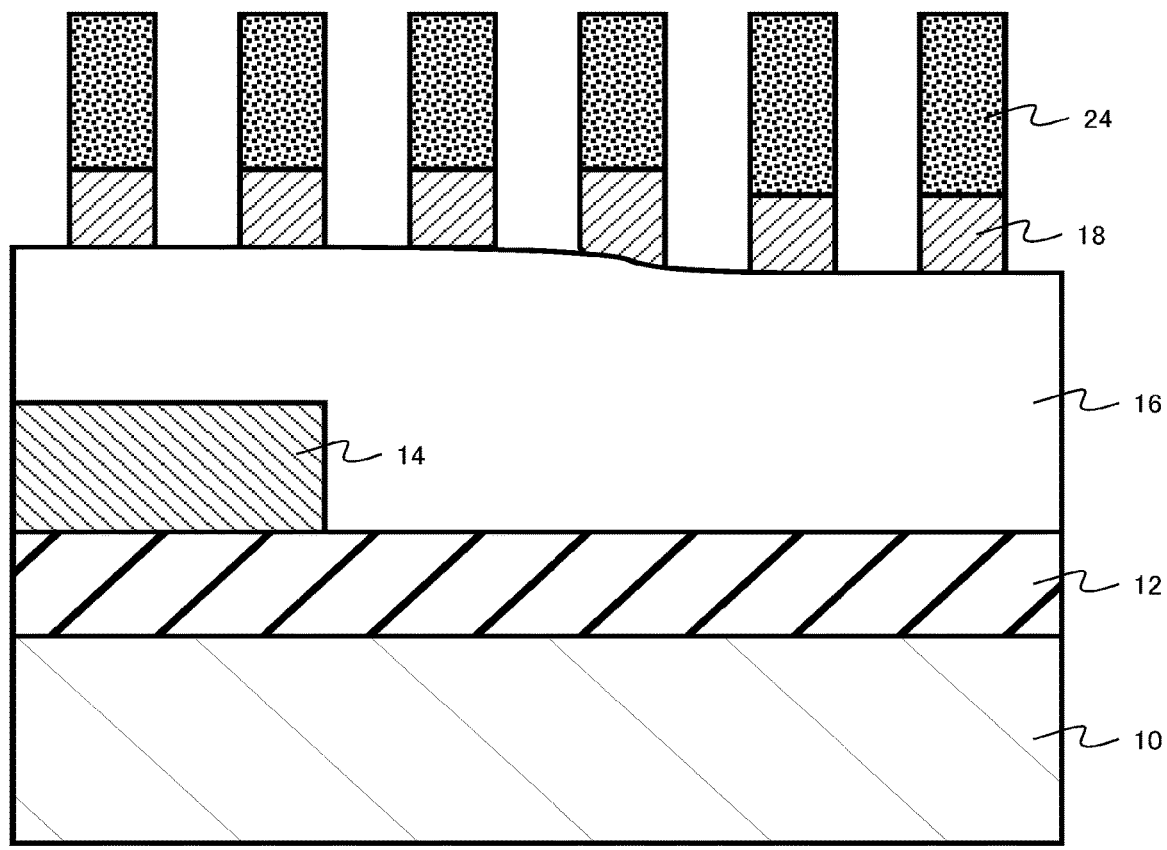
FIG. 9 is a schematic cross-sectional view showing an example of the method for manufacturing the semiconductor device according to the first embodiment.

Next, the second metal layer 18 is etched using the resist layer 24 as a mask (FIG. 9). The etching of the second metal layer 18 is performed using, for example, the known reactive ion etching device.

Figure 10:
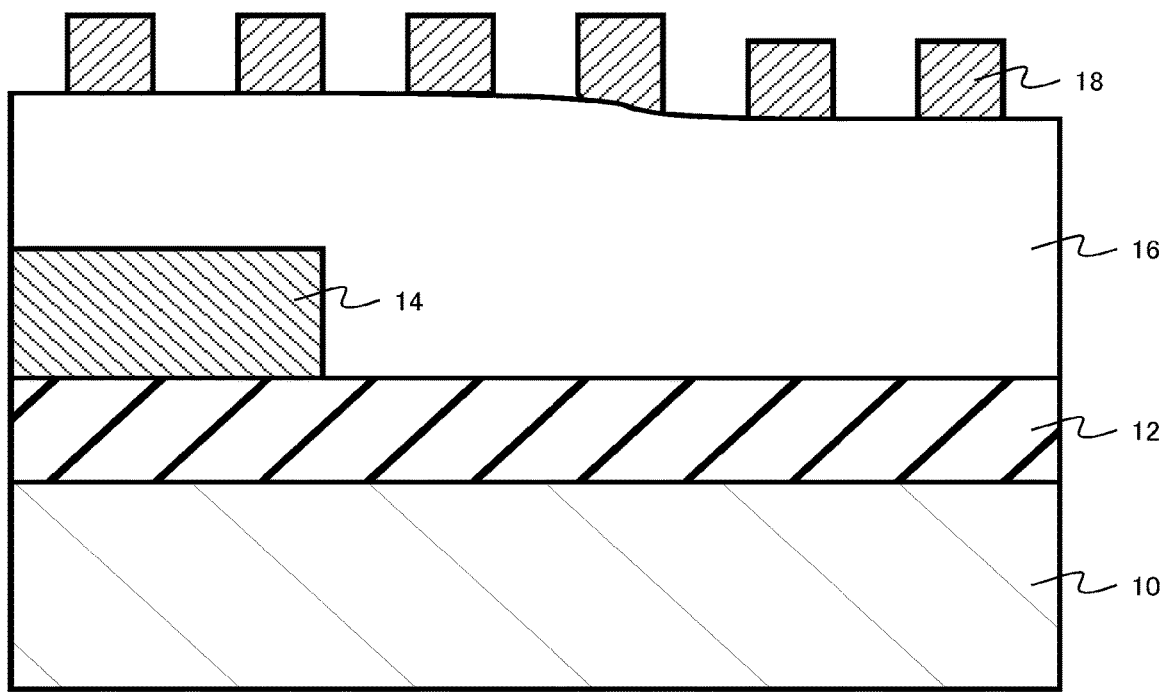
FIG. 10 is a schematic cross-sectional view showing an example of the method for manufacturing the semiconductor device according to the first embodiment.

Next, the resist layer 24 remaining on the patterned second metal layer 18 is removed (FIG. 10).

The pattern of the second metal layer 18 is formed on the semiconductor substrate 10 by the method for manufacturing the semiconductor device described above.

Hereinafter, functions and effects of the method for manufacturing the semiconductor device according to the first embodiment will be described.

Figure 11:
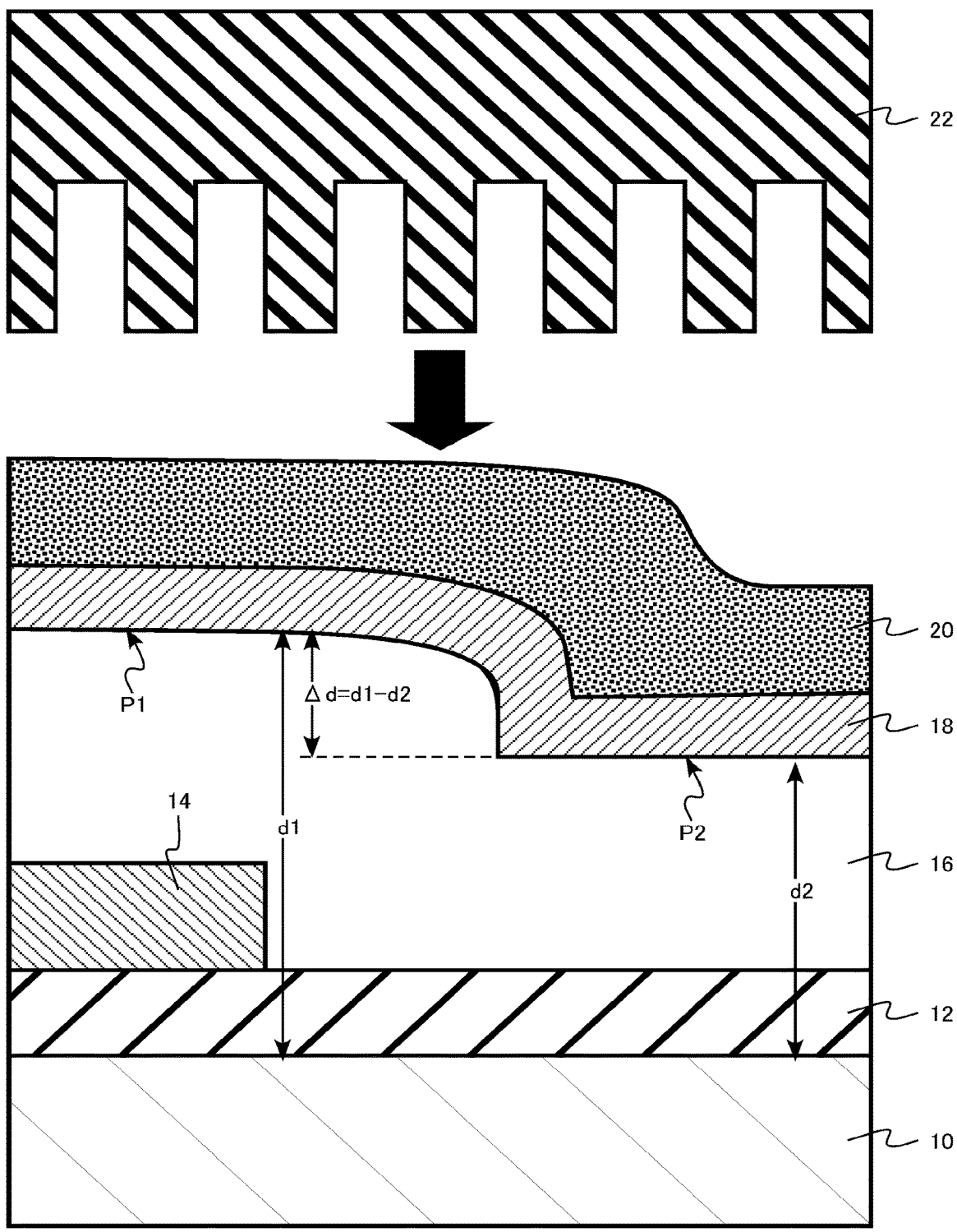
FIG. 11 is a schematic cross-sectional view showing a method for manufacturing a semiconductor device according to a comparative example.
Figure 12:
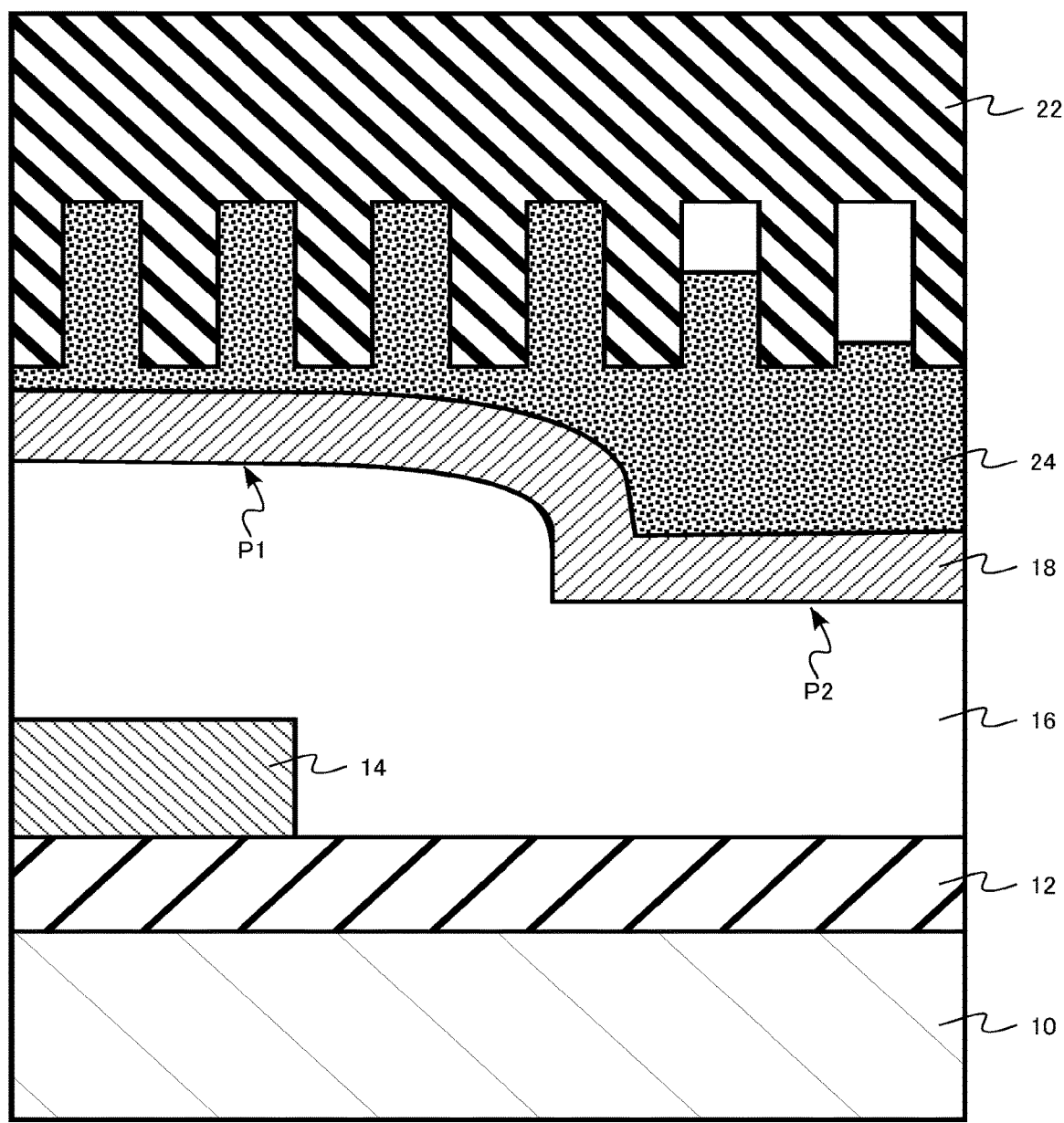
FIG. 12 is a schematic cross-sectional view showing the method for manufacturing the semiconductor device according to the comparative example.

FIGS. 11 and 12 are schematic cross-sectional views showing a method for manufacturing a semiconductor device according to a comparative example. The method for manufacturing the semiconductor device according to the comparative example is different from the method for manufacturing the semiconductor device according to the first embodiment in that the surface of the second insulating layer 16 is not polished by the CMP method.

As shown in FIG. 11, the template 22 having the pattern is brought into contact with the resist 20 on the surface of the second metal layer 18. At this time, the surface step Δd of the second insulating layer 16 is 30 nm or more. Since there is a step of 30 nm or more between the first plane P1 and the second plane P2, a step is also formed on the surface of the resist 20.

By bringing the template 22 into contact with the resist 20 on the surface of the second metal layer 18, the resist 20 is sucked up into a concave portion of the template 22. The pattern of the template 22 is transferred to the resist 20, and the resist layer 24 is formed on the surface of the second metal layer 18 (FIG. 12).

For example, as shown in FIG. 12, since an amount of the resist 20 is insufficient on the second plane P2, an amount of the resist 20 filled in the pattern of the template 22 is insufficient, and pattern defects occur in the resist layer 24.

If the second metal layer 18 is processed in a state where the pattern defects have occurred in the resist layer 24, the pattern defects are transferred to the second metal layer 18, and the pattern defects also occur in the second metal layer 18.

For example, from the viewpoint of compensating for the shortage of the amount of the resist 20 on the second plane P2, a method for drastically increasing an amount of the resist 20 dropped on the second plane P2 locally when the resist 20 is supplied using an inkjet method is considered. However, if a method for drastically changing the dropping amount of the resist 20 locally is adopted, this is not preferable because a time required for supplying the resist 20 becomes long.

In the method for manufacturing the semiconductor device according to the first embodiment, before supplying the resist 20, the surface of the second insulating layer 16 is polished by the CMP method to reduce the surface step Δd of the second insulating layer 16 to less than 30 nm. By reducing the surface step Δd, when the resist 20 is supplied, the amount of the resist 20 does not become insufficient, and the occurrence of the pattern defects is suppressed. The surface step Δd of the second insulating layer 16 is preferably less than 25 nm and is more preferably less than 20 nm.

Figure 13:
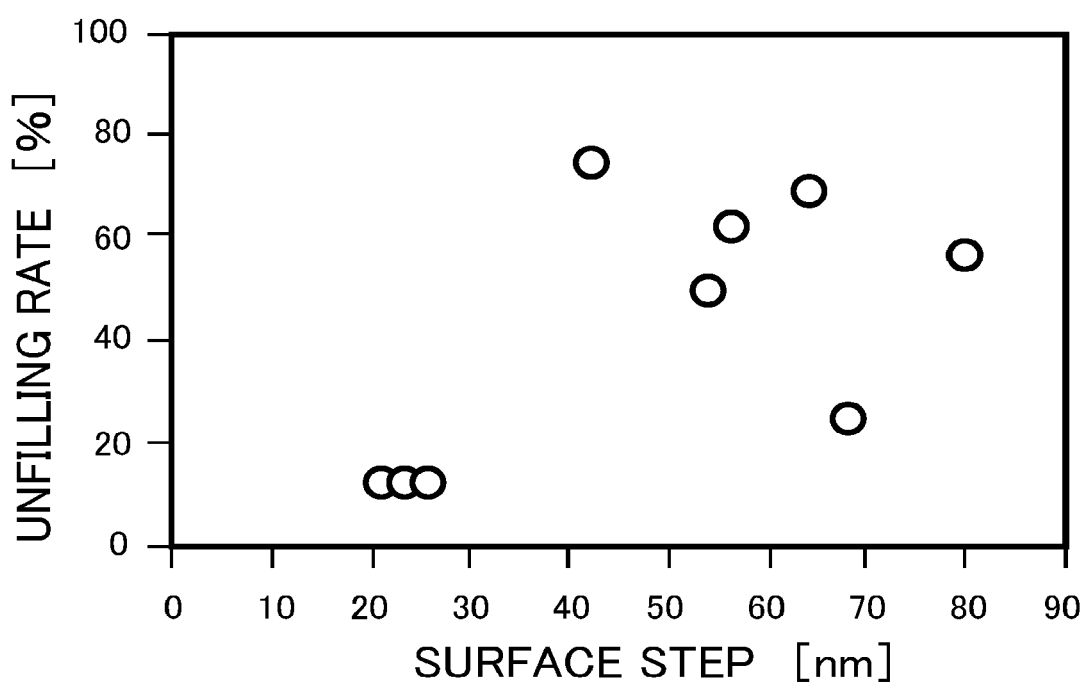
FIG. 13 is a diagram illustrating a function and an effect of the method for manufacturing the semiconductor device according to the first embodiment.

FIG. 13 is a diagram illustrating the function and the effect of the method for manufacturing the semiconductor device according to the first embodiment. FIG. 13 shows an unfilling rate of the resist to the pattern of the template when the surface step of the insulating layer is changed. The unfilling rate represents the frequency of occurrence of pattern defects by a percentage when patterning of the resist using the template is performed a plurality of times.

As is clear from FIG. 13, when the surface step is less than 30 nm, the unfilling rate is drastically reduced. In other words, the frequency of occurrence of pattern defects in the resist layer decreases.

Figure 14:
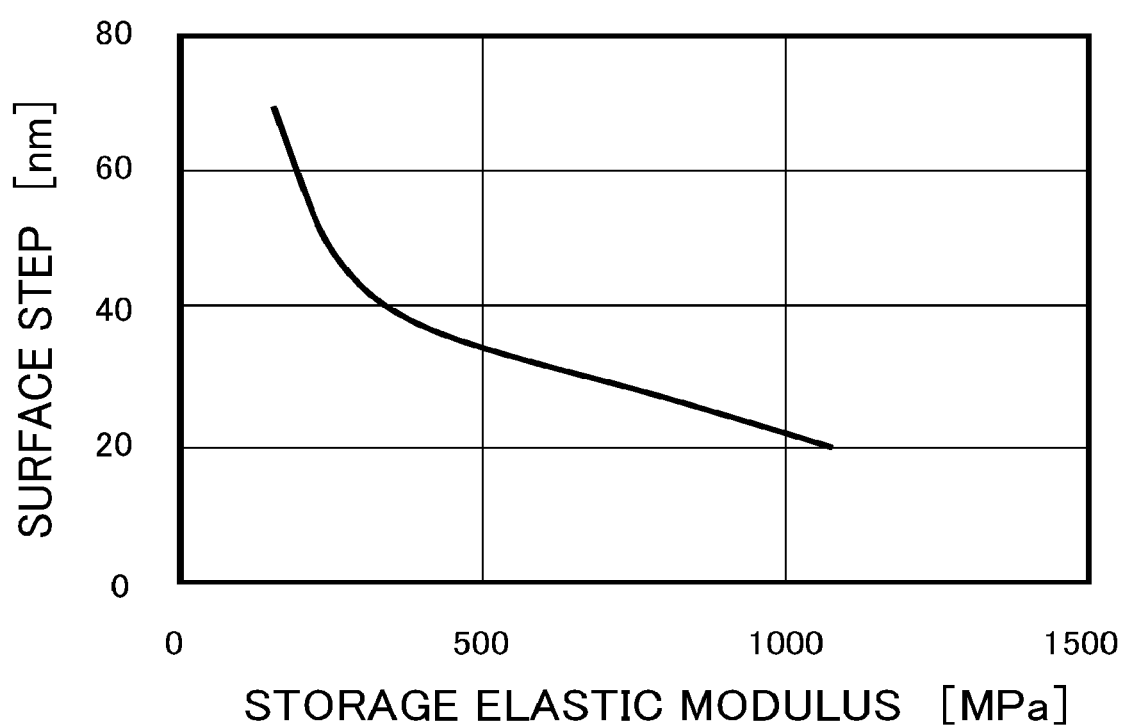
FIG. 14 is a diagram illustrating a function and an effect of the method for manufacturing the semiconductor device according to the first embodiment.

FIG. 14 is a diagram illustrating the function and the effect of the method for manufacturing the semiconductor device according to the first embodiment. FIG. 14 is a diagram showing a relation between the storage elastic modulus of the polishing pad and the surface step after polishing, when the insulating layer having the surface step is polished using the CMP method. The storage elastic modulus of the polishing pad represents a storage elastic modulus of polishing cloth at a surface temperature of the polishing cloth during polishing of the insulating layer.

As is clear from FIG. 14, when the storage elastic modulus of the polishing pad is higher, the surface step after polishing is smaller. In the method for manufacturing the semiconductor device according to the first embodiment, from the viewpoint of reducing the surface step after polishing the second insulating layer 16, the storage elastic modulus of the polishing pad 17 is preferably 500 MPa or more and is more preferably 750 MPa or more.

Figure 15:
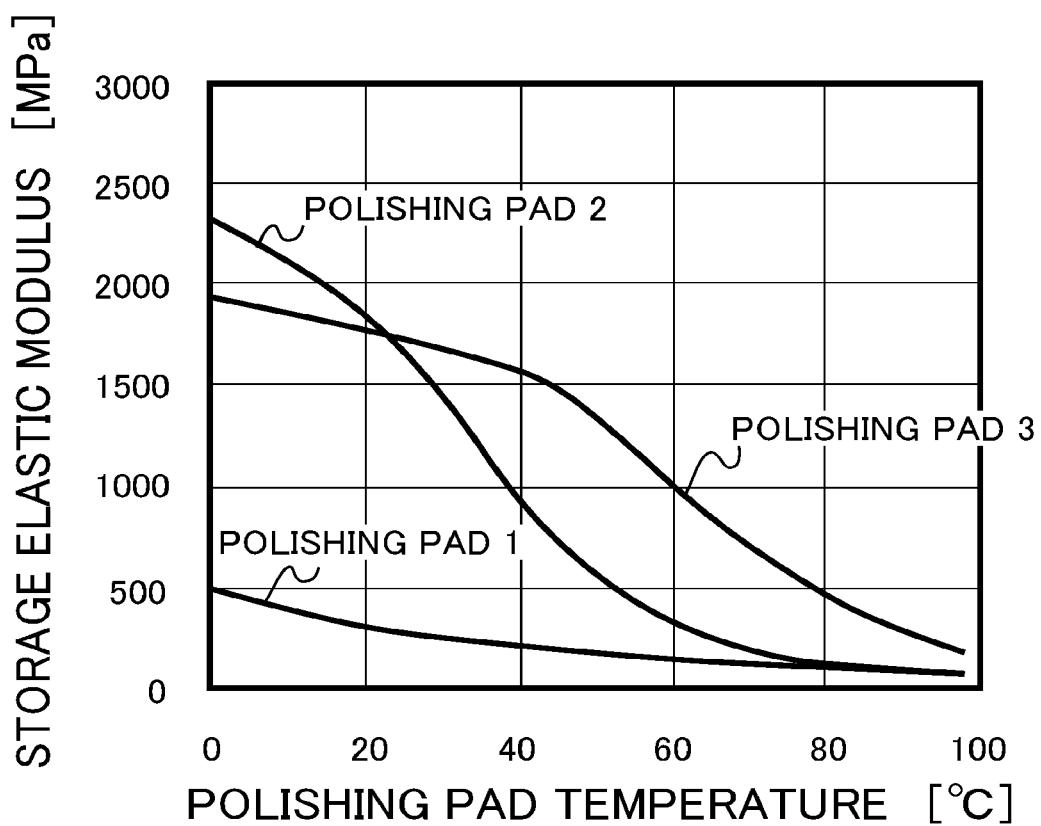
FIG. 15 is a diagram illustrating a function and an effect of the method for manufacturing the semiconductor device according to the first embodiment.

FIG. 15 is a diagram illustrating the function and the effect of the method for manufacturing the semiconductor device according to the first embodiment. FIG. 15 shows a relation between the temperature of the polishing pad and the storage elastic modulus of the polishing pad. FIG. 15 shows three types of polishing pads.

As is clear from FIG. 15, when the temperature of the polishing pad is lower, the storage elastic modulus of the polishing pad is higher. Therefore, in the method for manufacturing the semiconductor device according to the first embodiment, from the viewpoint of reducing the surface step after polishing of the second insulating layer 16, when the second insulating layer 16 is polished, it is preferable to polish the second insulating layer 16 while cooling the polishing pad 17. When the second insulating layer 16 is polished, the second insulating layer 16 is preferably polished while the polishing pad 17 is maintained at 50° C. or lower, and the second insulating layer 16 is more preferably polished while the polishing pad 17 is maintained at 40° C. or less.

In the method for manufacturing the semiconductor device according to the first embodiment, when the resist 20 is supplied to the surface of the second metal layer 18, the resist 20 is preferably applied to the entire surface of the second metal layer 18 by using a spin coating method. A time required for supplying the resist 20 can be reduced.

The first width w1 of the first plane P1 in the first direction perpendicular to the thickness direction of the semiconductor substrate 10 is preferably 1 mm or more. Further, the second width w2 of the second plane P2 in the first direction perpendicular to the thickness direction of the semiconductor substrate 10 is preferably 1 mm or more. When the widths of the first plane P1 and the second plane P2 are larger, the amount of the resist 20 on the second plane P2 is more likely to be insufficient. Therefore, the method for manufacturing the semiconductor device according to the first embodiment functions effectively.

As described above, according to the method for manufacturing the semiconductor device according to the first embodiment, it is possible to suppress the occurrence of the pattern defects.

Second Embodiment

A method for manufacturing a semiconductor device according to a second embodiment is different from a method for manufacturing a semiconductor device according to the first embodiment in that, before forming a first layer, a first memory cell array and a second memory cell array are formed on a semiconductor substrate to be separated from each other in a direction perpendicular to a thickness direction of the semiconductor substrate, the first memory cell array and the first layer are located between a first plane and the semiconductor substrate, and the first layer sandwiched between the first memory cell array and the second memory cell array is located between a second plane and the semiconductor substrate. Hereinafter, description of contents overlapping with those of the first embodiment may be partially omitted.

FIGS. 16, 18, 19, 20, 21, 22, 23, 24, 25, and 26 are schematic cross-sectional views showing an example of the method for manufacturing the semiconductor device according to the second embodiment. FIG. 17 is a circuit diagram of a memory cell array manufactured by the method for manufacturing the semiconductor device according to the second embodiment.

The method for manufacturing the semiconductor device according to the second embodiment is a method for manufacturing a semiconductor memory in which memory cells are three-dimensionally disposed. The semiconductor memory is a three-dimensional NAND flash memory.

First, a semiconductor substrate 10 is prepared. The semiconductor substrate 10 is, for example, single crystal silicon.

Next, a first insulating layer 12 is formed on the semiconductor substrate 10. The first insulating layer 12 is formed by using a known chemical vapor deposition method (CVD method), for example. The first insulating layer 12 is, for example, silicon oxide or silicon nitride.

Figure 16:
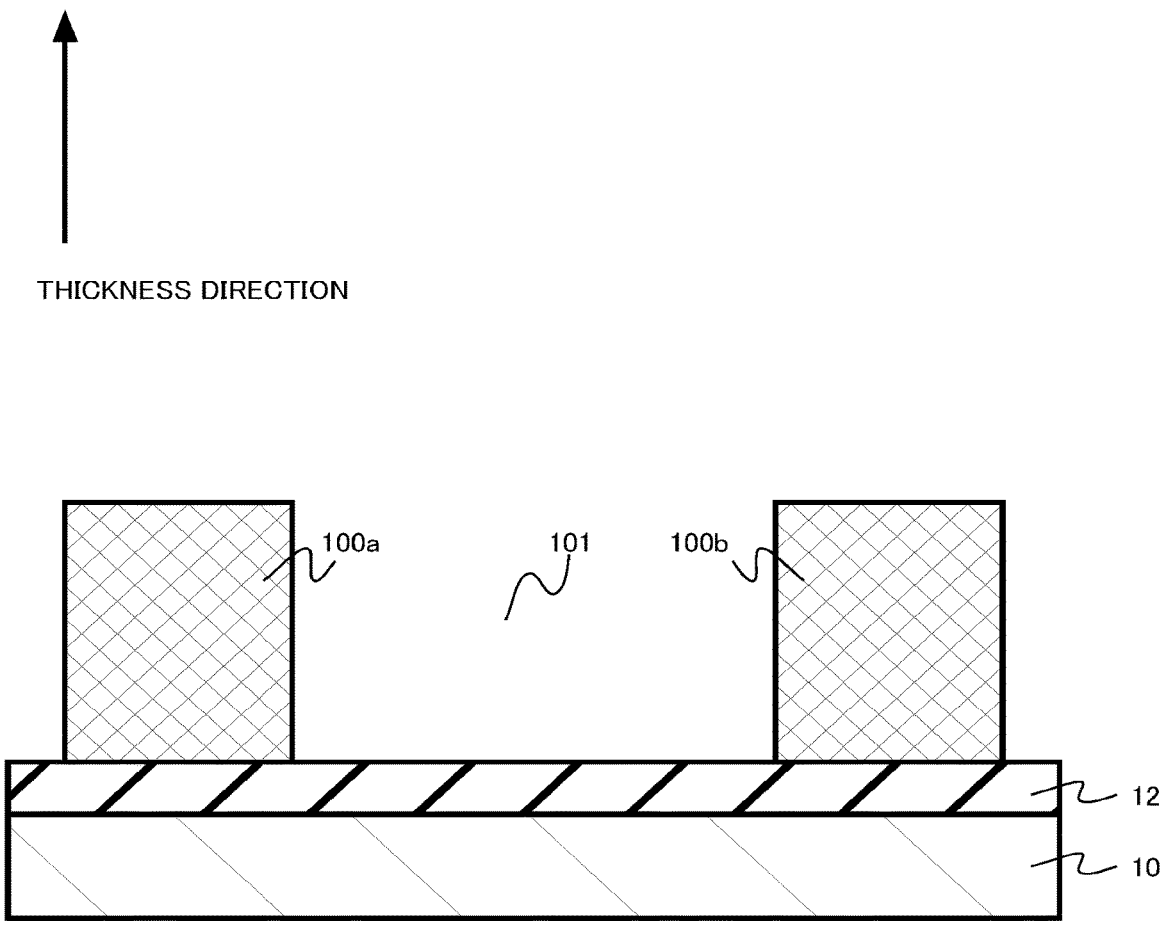
FIG. 16 is a schematic cross-sectional view showing an example of a method for manufacturing a semiconductor device according to a second embodiment.
Figure 17:
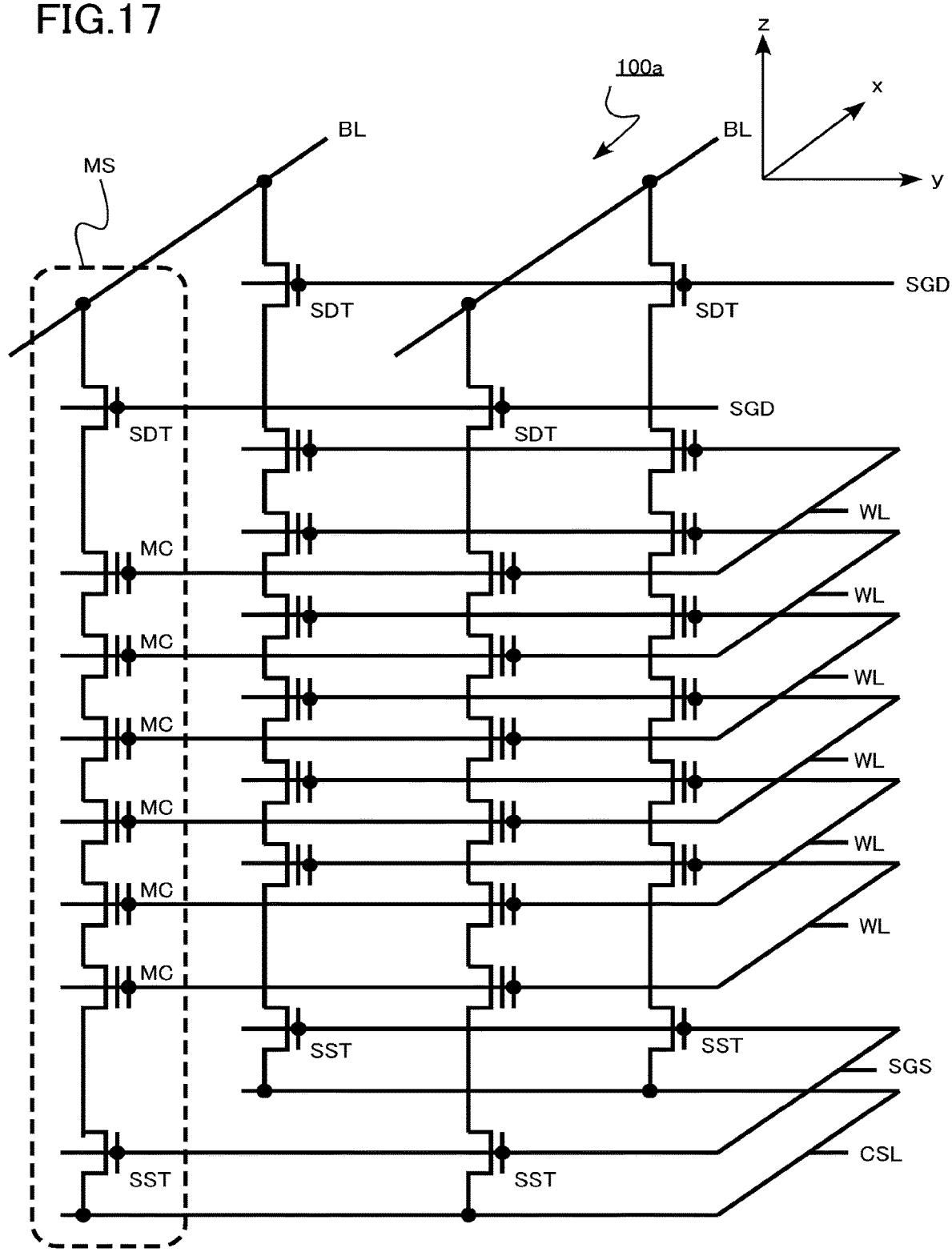
FIG. 17 is a circuit diagram of a memory cell array manufactured by the method for manufacturing the semiconductor device according to the second embodiment.

Next, a first memory cell array 100a and a second memory cell array 100b are formed on the first insulating layer 12 (FIG. 16). The first memory cell array 100a and the second memory cell array 100b are formed to be separated from each other in a direction perpendicular to a thickness direction of the semiconductor substrate 10. The first memory cell array 100a and the second memory cell array 100b include a plurality of memory cells MC arranged in the thickness direction of the semiconductor substrate 10.

FIG. 17 is a circuit diagram of the first memory cell array 100a.

As shown in FIG. 17, the first memory cell array 100a includes a plurality of word lines WL, a common source line CSL, a source selection gate line SGS, a plurality of drain selection gate lines SGD, a plurality of bit lines BL, and a plurality of memory strings MS.

The plurality of word lines WL is stacked and disposed in a z direction. The plurality of memory strings MS extends in the z direction. The plurality of bit lines BL extends, for example, in an x direction. The z direction is the thickness direction of the semiconductor substrate 10.

As shown in FIG. 17, the memory string MS includes a source selection transistor SST, a plurality of memory cells MC, and a drain selection transistor SDT connected in series between the common source line CSL and the bit line BL. One memory string MS is selected by the bit line BL and the drain selection gate line SGD, and one memory cell MC can be selected by the word line WL. The memory cell MC is a three-terminal element.

As shown in FIG. 17, the first memory cell array 100a includes a plurality of memory cells MC arranged in the thickness direction (the z direction in FIG. 17) of the semiconductor substrate 10. The second memory cell array 100b also has the same structure as the first memory cell array 100a.

Figure 18:
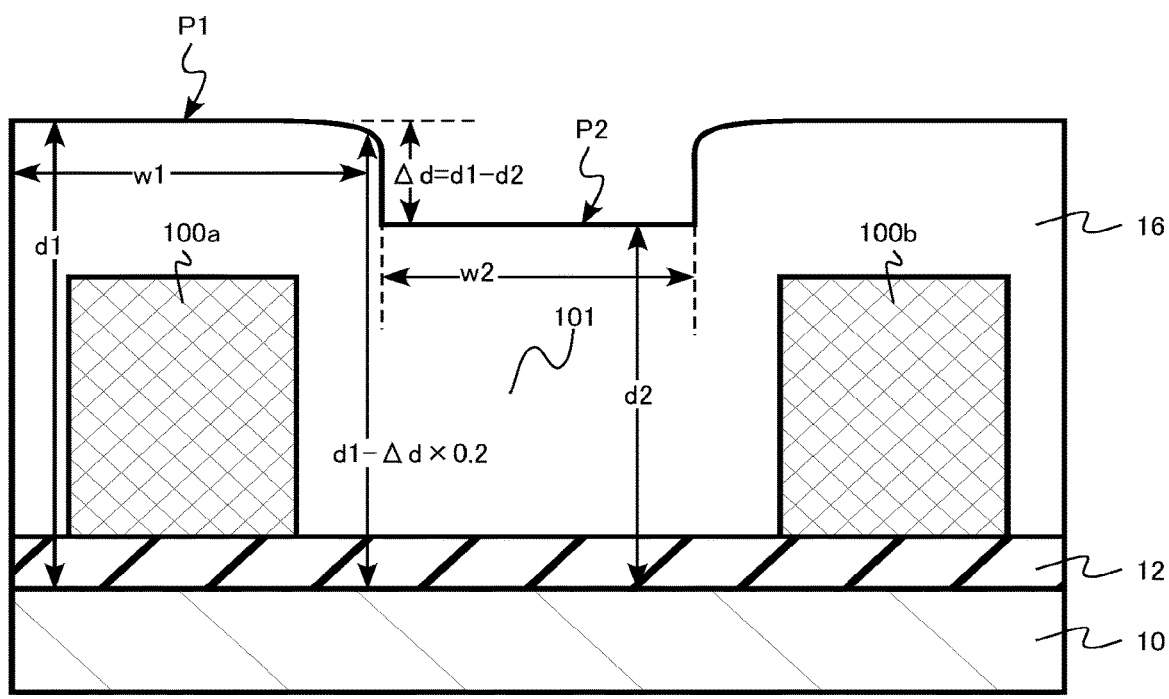
FIG. 18 is a schematic cross-sectional view showing an example of the method for manufacturing the semiconductor device according to the second embodiment.

Next, a second insulating layer 16 (first layer) is formed on the first memory cell array 100a and the second memory cell array 100b (FIG. 18). The second insulating layer 16 is an example of a first layer.

The second insulating layer 16 is formed by using a known CVD method, for example. The second insulating layer 16 is, for example, silicon oxide or silicon nitride.

The second insulating layer 16 has a first plane P1 and a second plane P2 on a surface. A second distance (d2 in FIG. 18) from the semiconductor substrate 10 to the second plane P2 is smaller than a first distance (d1 in FIG. 18) from the semiconductor substrate 10 to the first plane P1.

The first memory cell array 100a and the second insulating layer 16 are located between the first plane P1 and the semiconductor substrate 10. The second insulating layer 16 sandwiched between the first memory cell array 100a and the second memory cell array 100h is located between the second plane P2 and the semiconductor substrate 10. An intermediate region 101 (region) between the first memory cell array 100a and the second memory cell array 100b is located between the second plane P2 and the semiconductor substrate 10. On the semiconductor substrate 10 below the intermediate region 101, for example, a peripheral circuit for driving the first memory cell array 100a or the second memory cell array 100b is provided.

A difference ($\Delta d = d1 - d2$ in FIG. 18) between the first distance d1 and the second distance d2 is 30 nm or more. Hereinafter, the difference $\Delta d$ between the first distance d1 and the second distance d2 is also referred to as a surface step $\Delta d$ of the second insulating layer 16. The difference $\Delta d$ between the first distance d1 and the second distance d2 represents an absolute value of the difference between the first distance d1 and the second distance d2.

A first width (w1 in FIG. 18) of the first plane P1 in a first direction perpendicular to the thickness direction of the semiconductor substrate 10 is, for example, 1 mm or more. Further, a second width (w2 in FIG. 18) of the second plane P2 in the first direction perpendicular to the thickness direction of the semiconductor substrate 10 is, for example, 1 mm or more.

Figure 19:
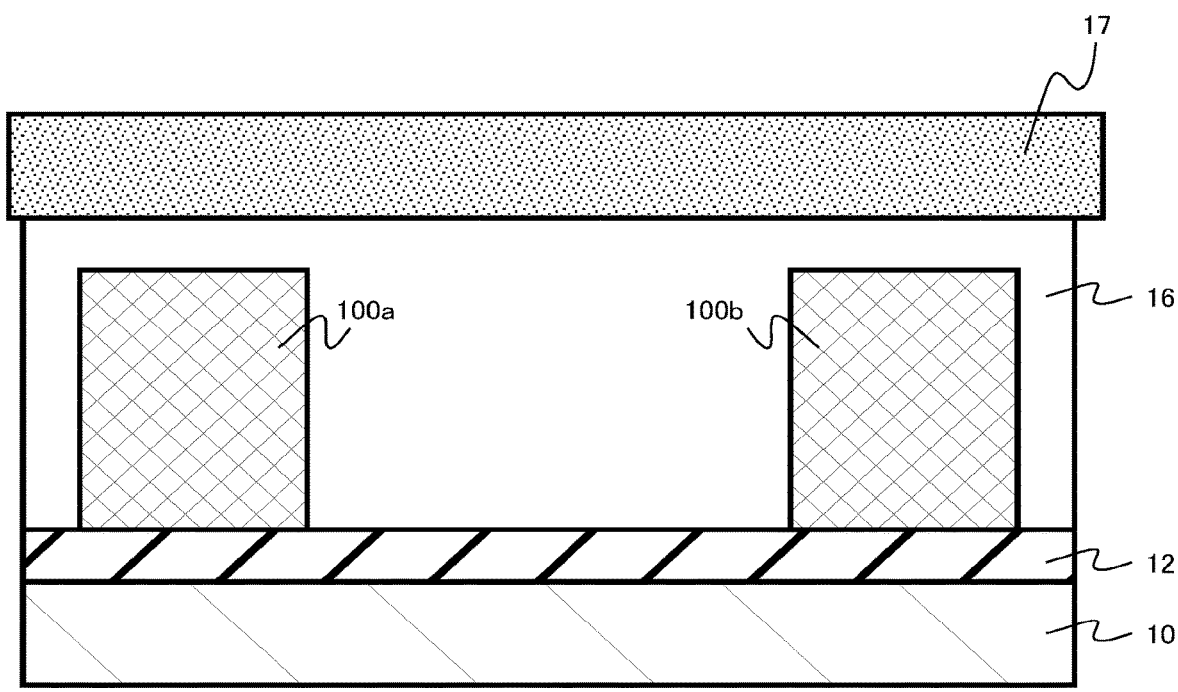
FIG. 19 is a schematic cross-sectional view showing an example of the method for manufacturing the semiconductor device according to the second embodiment.

Next, the second insulating layer 16 is polished using a chemical mechanical polishing method (CMP method) so that the surface step $\Delta d$ is less than 30 nm (FIG. 19). The polishing of the second insulating layer 16 is performed, for example, by rotating the semiconductor substrate 10, supplying slurry to the surface of the second insulating layer 16, and bringing a polishing pad 17 into contact with the surface of the second insulating layer 16.

When the second insulating layer 16 is polished, for example, the second insulating layer 16 is polished while the polishing pad 17 is cooled. The cooling of the polishing pad 17 is performed using, for example, a gas or a liquid. When the second insulating layer 16 is polished, the polishing pad 17 is cooled, and the second insulating layer 16 is polished while the polishing pad 17 is maintained at 50° C. or lower, for example.

When the second insulating layer 16 is polished, for example, the polishing pad 17 having a storage elastic modulus of 500 MPa or more and 10 GPa or less is brought into contact with a surface of the second insulating layer 16 and the second insulating layer 16 is polished. The storage elastic modulus of the polishing pad 17 during polishing of the second insulating layer 16 becomes 500 MPa or more and 10 GPa or less.

Figure 20:
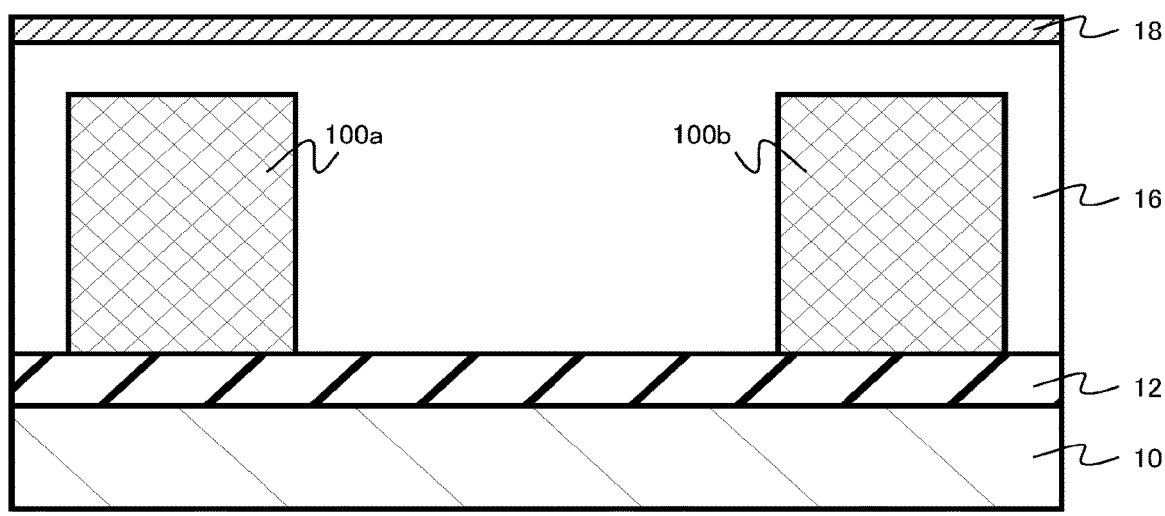
FIG. 20 is a schematic cross-sectional view showing an example of the method for manufacturing the semiconductor device according to the second embodiment.

Next, a second metal layer 18 (second layer) is formed on the second insulating layer 16 (FIG. 20). The second metal layer 18 is an example of a second layer. The second metal layer 18 is a processed layer on which a pattern is formed using a nanoimprint method.

The second metal layer 18 is formed using, for example, a known CVD method. The second metal layer 18 is, for example, tungsten, titanium nitride, or aluminum.

Next, a resist 20 is supplied to the surface of the second metal layer 18. The resist 20 is applied to the entire surface of the second metal layer 18 using, for example, a spin coating method.

Figure 21:
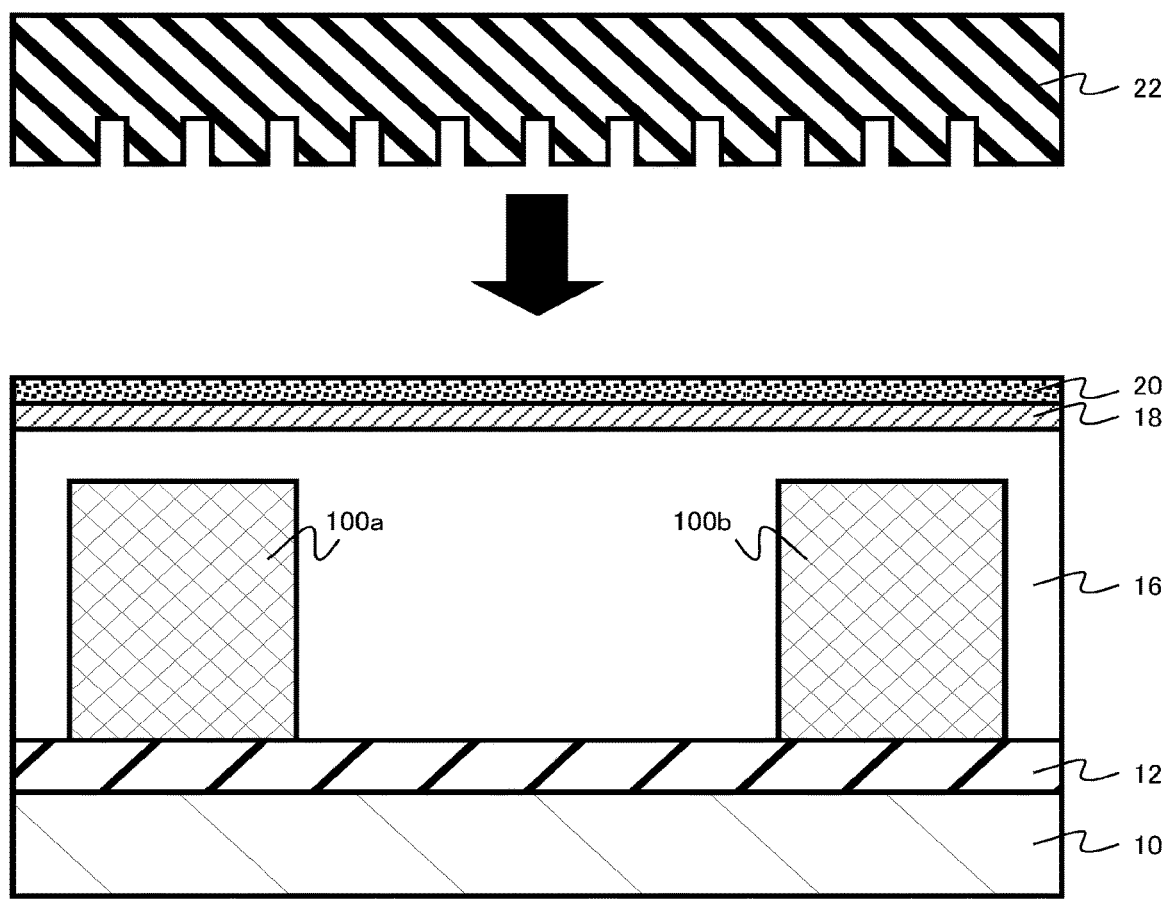
FIG. 21 is a schematic cross-sectional view showing an example of the method for manufacturing the semiconductor device according to the second embodiment.

Next, a template 22 (mold) having a pattern is brought into contact with the resist 20 on the surface of the second metal layer 18 (FIG. 21).

Figure 22:
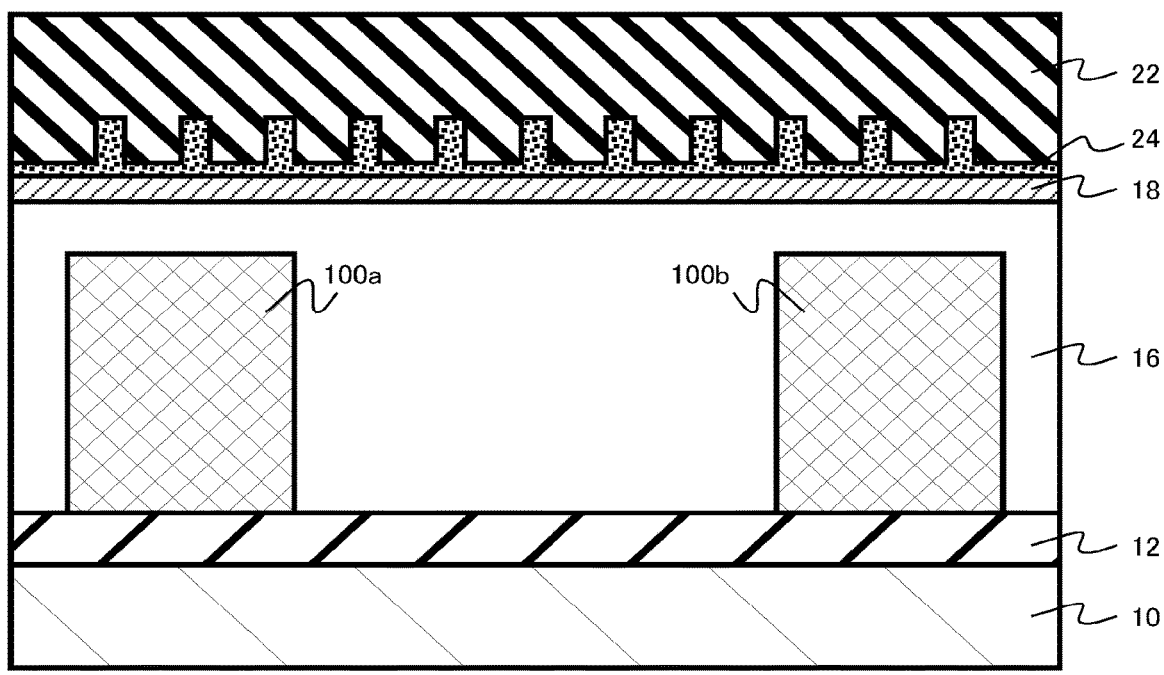
FIG. 22 is a schematic cross-sectional view showing an example of the method for manufacturing the semiconductor device according to the second embodiment.

By bringing the template 22 into contact with the resist 20 on the surface of the second metal layer 18, the resist 20 is sucked up into a concave portion of the template 22. The pattern of the template 22 is transferred to the resist 20, and a resist layer 24 is formed on the surface of the second metal layer 18 (FIG. 22).

Figure 23:
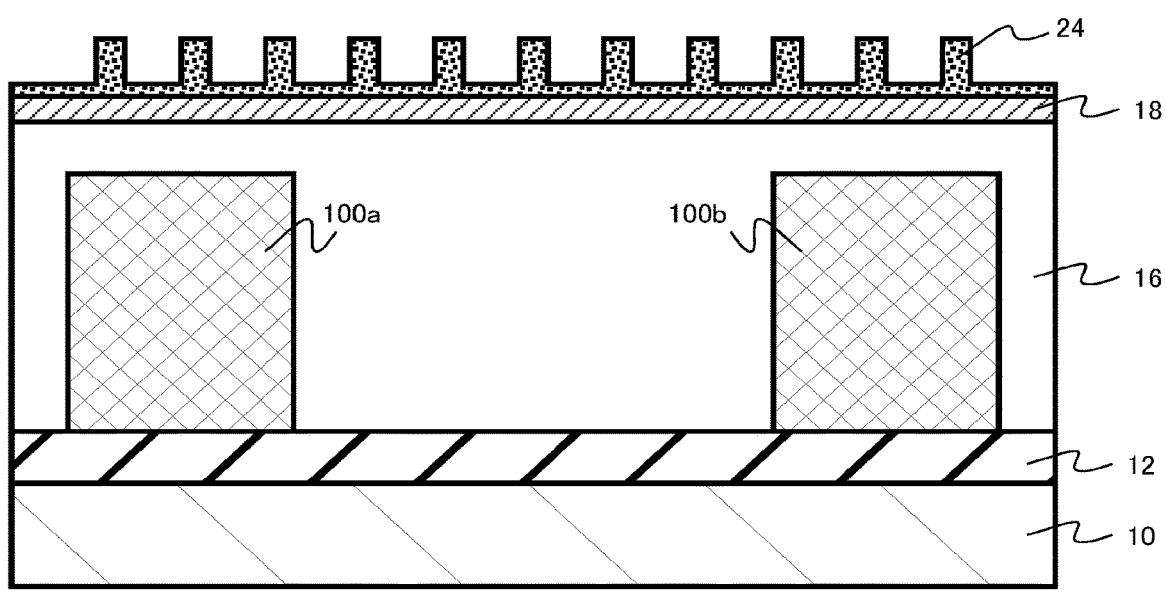
FIG. 23 is a schematic cross-sectional view showing an example of the method for manufacturing the semiconductor device according to the second embodiment.

After forming the resist layer 24 to which the pattern of the template 22 has been transferred, the template 22 is separated from the resist layer 24 (FIG. 23).

Figure 24:
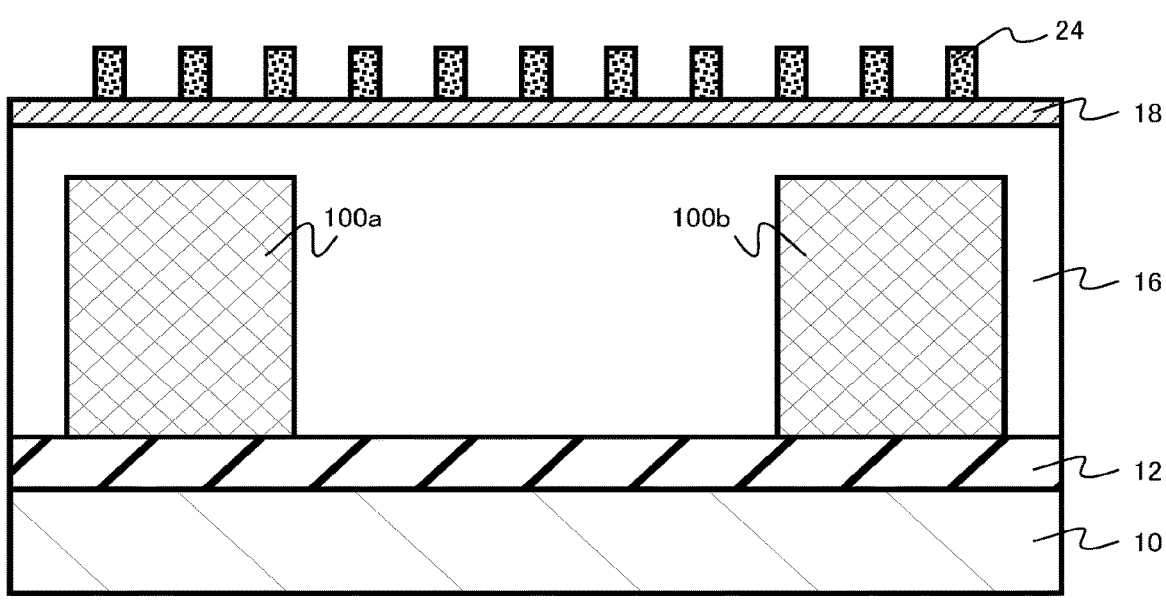
FIG. 24 is a schematic cross-sectional view showing an example of the method for manufacturing the semiconductor device according to the second embodiment.

Next, the entire surface of the resist layer 24 is etched, so that the thin resist layer 24 remaining in a space portion of a line pattern is removed (FIG. 24). The entire surface etching is performed using, for example, a known reactive ion etching device.

Figure 25:
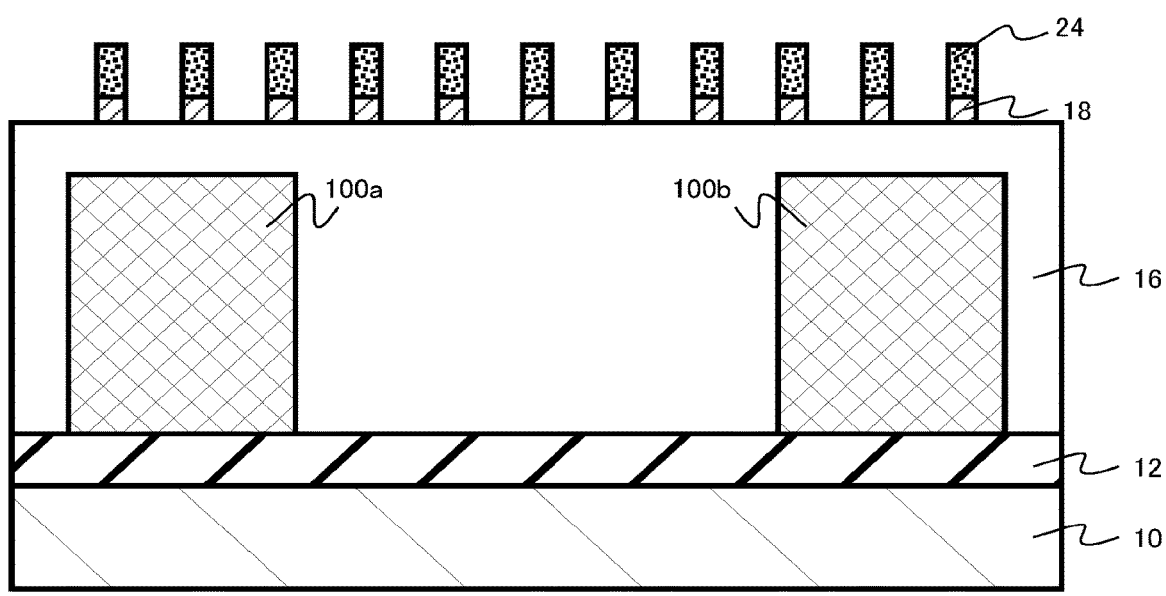
FIG. 25 is a schematic cross-sectional view showing an example of the method for manufacturing the semiconductor device according to the second embodiment.

Next, the second metal layer 18 is etched using the resist layer 24 as a mask (FIG. 25). The second metal layer 18 is patterned by etching. The etching of the second metal layer 18 is performed using, for example, the known reactive ion etching device.

Figure 26:
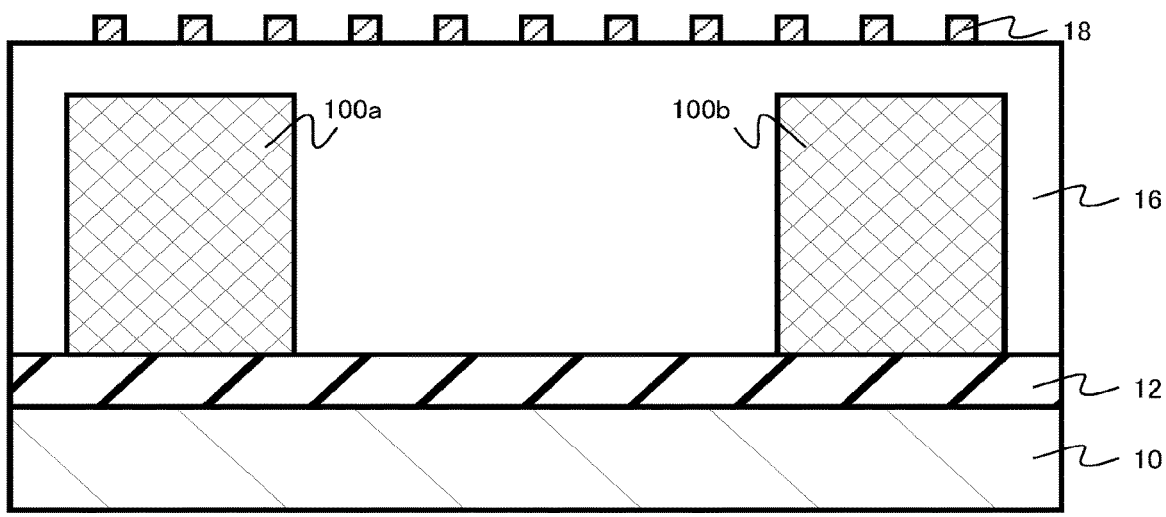
FIG. 26 is a schematic cross-sectional view showing an example of the method for manufacturing the semiconductor device according to the second embodiment.

Next, the resist layer 24 remaining on the patterned second metal layer 18 is removed (FIG. 26).

The pattern of the second metal layer 18 is formed on the semiconductor substrate 10 by the method for manufacturing the semiconductor device described above.

As described above, according to the method for manufacturing the semiconductor device according to the second embodiment, it is possible to suppress the occurrence of pattern defects, similarly to the first embodiment.

Third Embodiment

A method for manufacturing a semiconductor device according to a third embodiment includes: forming a first layer on a semiconductor substrate, a surface of the first layer having a first plane of which distance from the semiconductor substrate is a first distance and a second plane of which distance from the semiconductor substrate is a second distance smaller than the first distance, and a difference between the first distance and the second distance being 30 nm or more; performing planarization processing on the first layer to have the difference of less than 30 nm; supplying a resist to the first layer after performing the planarization processing; bringing a template having a pattern into contact with the resist to form a resist layer to which the pattern has been transferred; and etching the first layer using the resist layer as a mask. The method for manufacturing the semiconductor device according to the third embodiment is different from a method for manufacturing a semiconductor device according to the first embodiment in that the first layer on which the planarization processing has been performed is etched using the resist layer as the mask. Hereinafter, description of contents overlapping with those of the first embodiment may be partially omitted.

FIGS. 27 to 34 are schematic cross-sectional views showing an example of the method for manufacturing the semiconductor device according to the third embodiment. In the method for manufacturing the semiconductor device according to the third embodiment, a chemical mechanical polishing method (CMP method) is used in the planarization processing.

Figure 27:
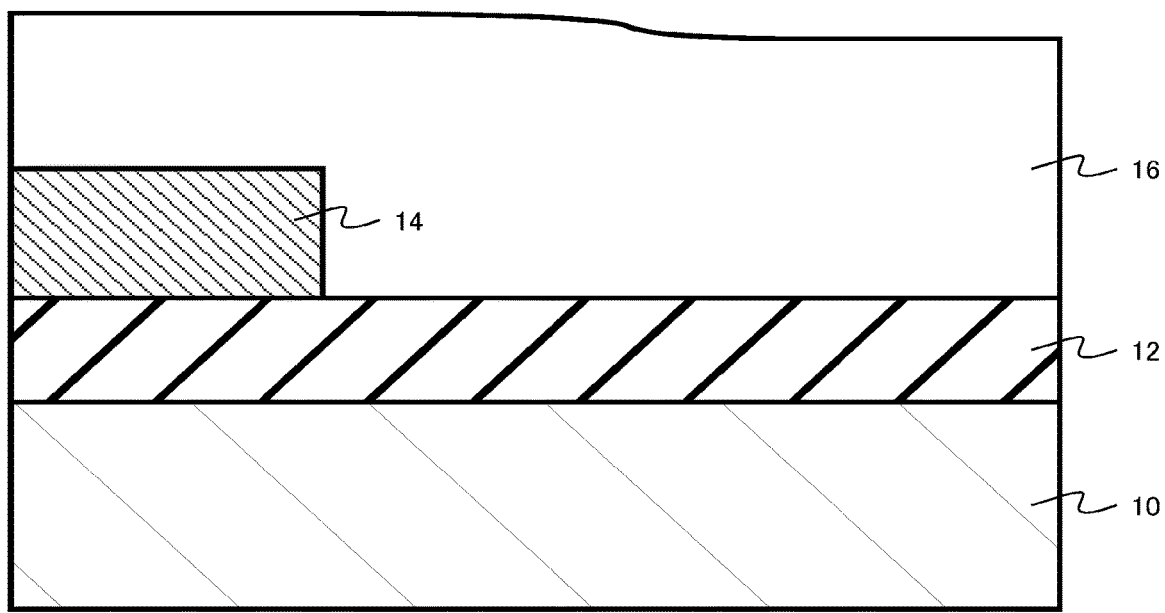
FIG. 27 is a schematic cross-sectional view showing an example of a method for manufacturing a semiconductor device according to a third embodiment.

The method for manufacturing the semiconductor device according to the third embodiment is the same as the method for manufacturing the semiconductor device according to the first embodiment until a second insulating layer 16 is polished using the chemical mechanical polishing method so that a surface step Δd is less than 30 nm (FIG. 27). The second insulating layer 16 is an example of a first layer. The second insulating layer 16 is a processed layer on which a pattern is formed using a nanoimprint method.

The polishing of the second insulating layer 16 is performed, for example, by rotating the semiconductor substrate 10, supplying slurry to the surface of the second insulating layer 16, and bringing a polishing pad 17 into contact with the surface of the second insulating layer 16.

The slurry includes abrasive grains. The abrasive grains are, for example, particles including silicon oxide, aluminum oxide, or cerium oxide. The polishing pad 17 includes, for example, a resin or a nonwoven fabric. The polishing pad 17 is, for example, a polyurethane resin.

When the second insulating layer 16 is polished, for example, the second insulating layer 16 is polished while the polishing pad 17 is cooled. The cooling of the polishing pad 17 is performed using, for example, a gas or a liquid. When the second insulating layer 16 is polished, the polishing pad 17 is cooled, and the second insulating layer 16 is polished while the polishing pad 17 is maintained at 50° C. or lower, for example.

When the second insulating layer 16 is polished, for example, the polishing pad 17 having a storage elastic modulus of 500 MPa or more and 10 GPa or less is brought into contact with a surface of the second insulating layer 16 and the second insulating layer 16 is polished. The storage elastic modulus of the polishing pad 17 during polishing of the second insulating layer 16 becomes 500 MPa or more and 10 GPa or less.

Figure 28:
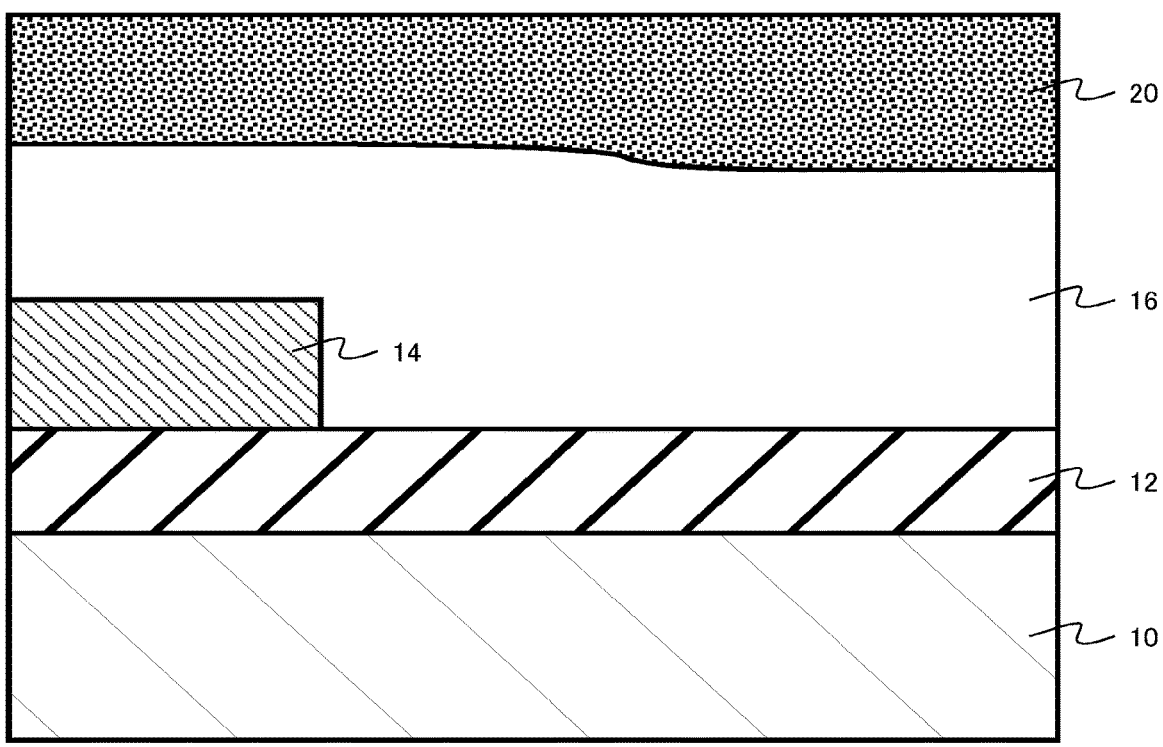
FIG. 28 is a schematic cross-sectional view showing an example of the method for manufacturing the semiconductor device according to the third embodiment.

Next, a resist 20 is supplied to the surface of the second insulating layer 16 (FIG. 28). The resist 20 is applied to the entire surface of the second insulating layer 16 using, for example, a spin coating method. Further, the resist 20 is dropped on the surface of the second insulating layer 16 by using, for example, an inkjet method.

The resist 20 is a resist used for the nanoimprint method. The resist 20 includes, for example, a photocurable resin or a thermosetting resin.

Figure 29:
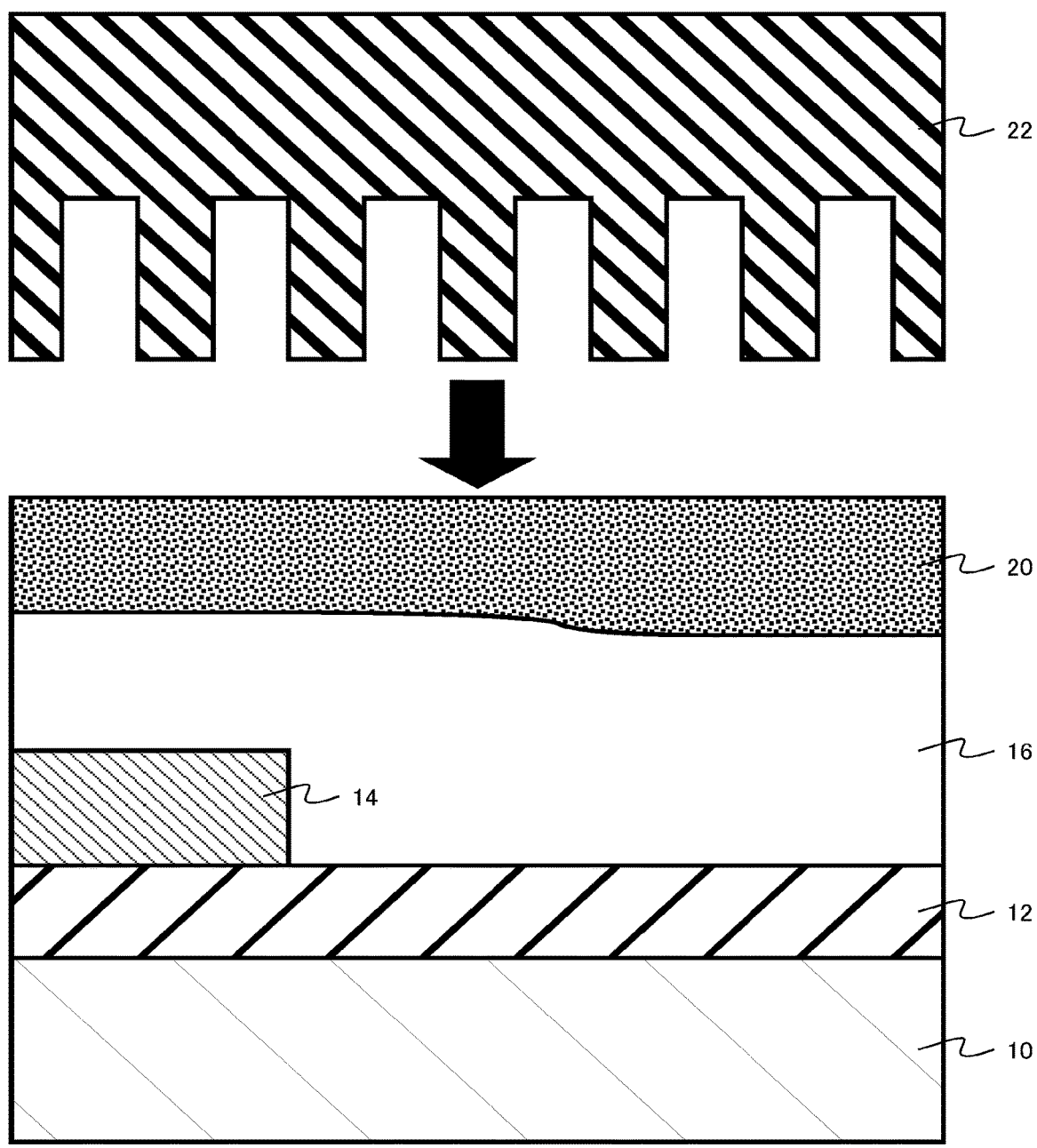
FIG. 29 is a schematic cross-sectional view showing an example of the method for manufacturing the semiconductor device according to the third embodiment.

Next, a template 22 (mold) having a pattern is brought into contact with the resist 20 on the surface of the second insulating layer 16 (FIG. 29). As a material of the template 22, for example, when the resist 20 includes a photocurable resin, a material transmitting light is used. The template 22 is, for example, quartz glass.

Figure 30:
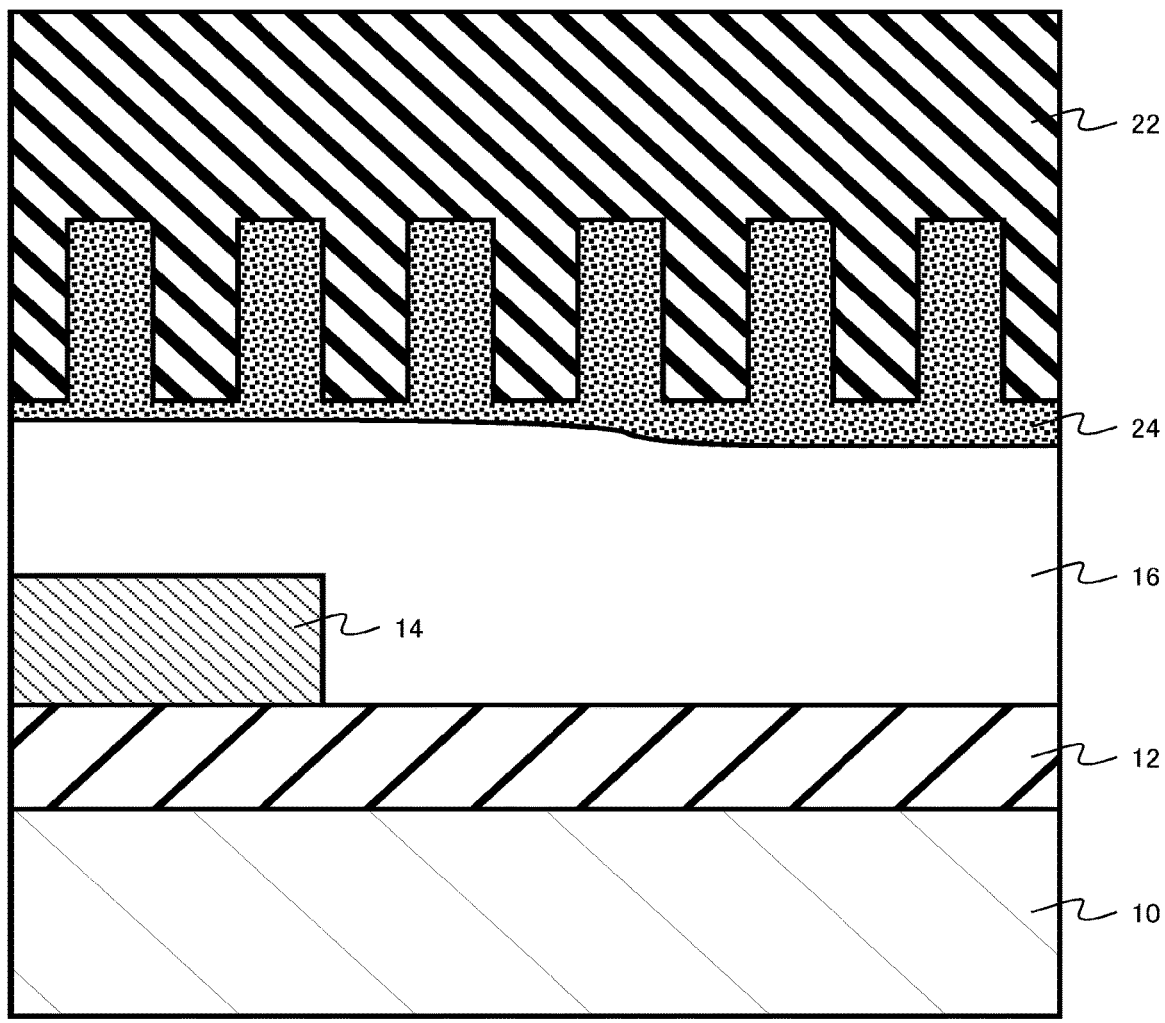
FIG. 30 is a schematic cross-sectional view showing an example of the method for manufacturing the semiconductor device according to the third embodiment.

By bringing the template 22 into contact with the resist 20 on the surface of the second insulating layer 16, the resist 20 is sucked up into a concave portion of the template 22. The pattern of the template 22 is transferred to the resist 20, and a resist layer 24 is formed on the surface of the second insulating layer 16 (FIG. 30).

Figure 31:
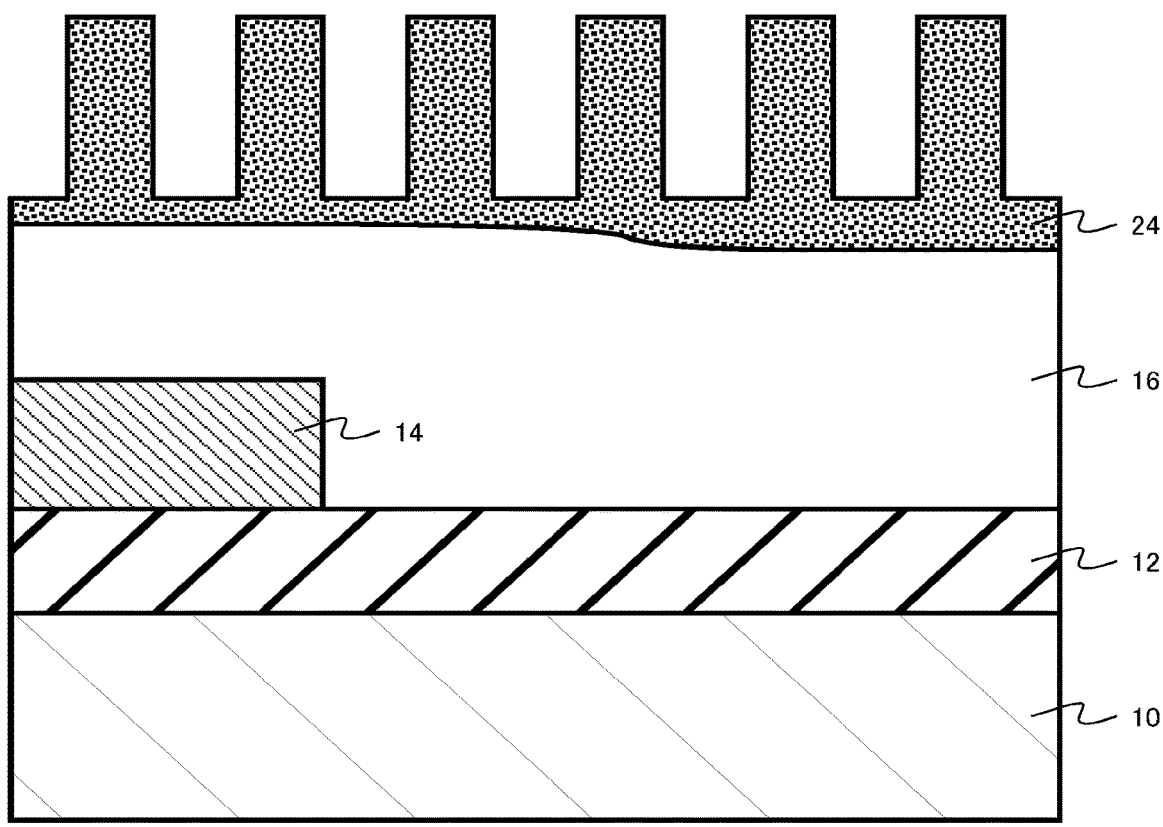
FIG. 31 is a schematic cross-sectional view showing an example of the method for manufacturing the semiconductor device according to the third embodiment.

After forming the resist layer 24 to which the pattern of the template 22 has been transferred, the template 22 is separated from the resist layer 24 (FIG. 31).

Figure 32:
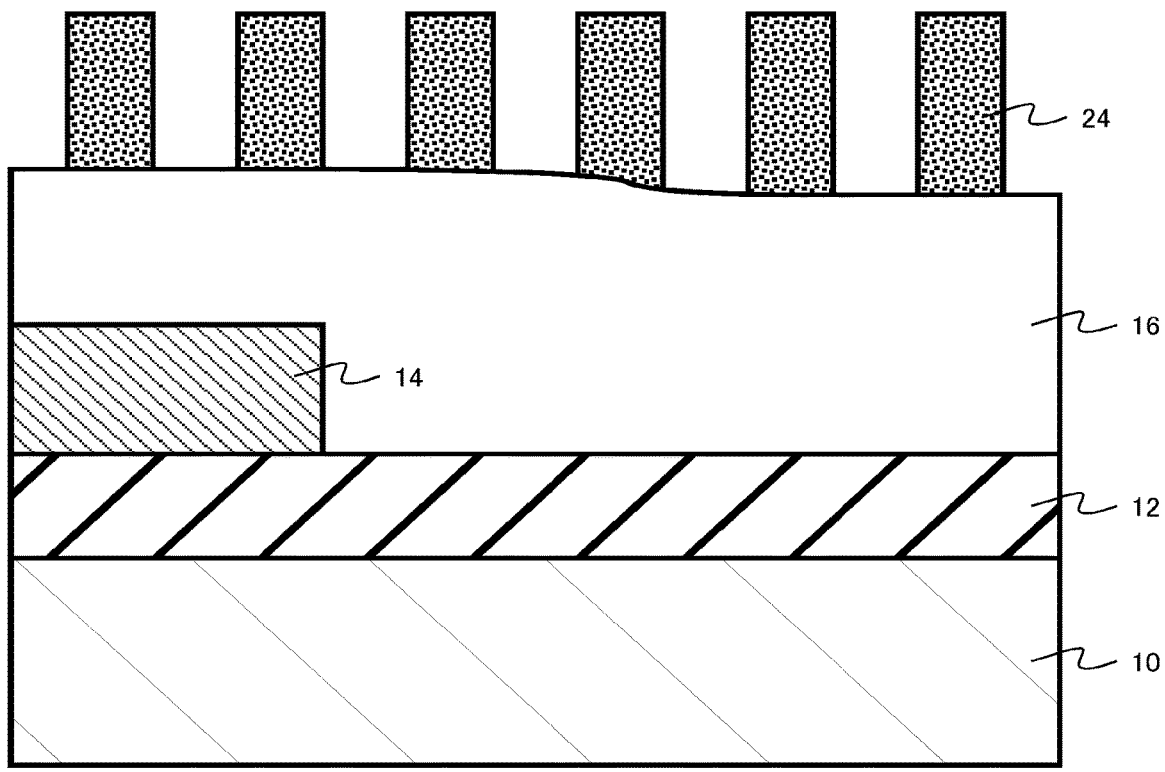
FIG. 32 is a schematic cross-sectional view showing an example of the method for manufacturing the semiconductor device according to the third embodiment.

Next, the entire surface of the resist layer 24 is etched, so that the thin resist layer 24 remaining in a space portion of a line pattern is removed (FIG. 32). The entire surface etching is performed using, for example, a known reactive ion etching device.

Figure 33:
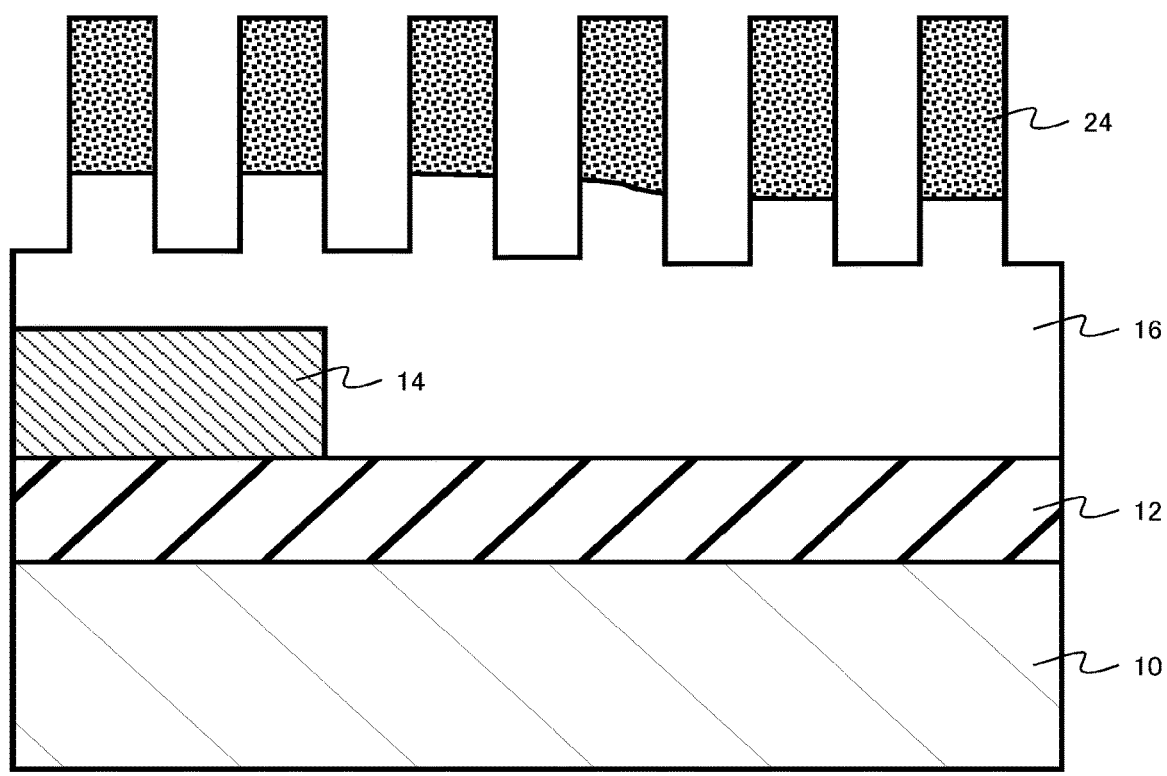
FIG. 33 is a schematic cross-sectional view showing an example of the method for manufacturing the semiconductor device according to the third embodiment.

Next, the second insulating layer 16 is etched using the resist layer 24 as a mask (FIG. 33). The second insulating layer 16 is patterned by etching. A groove is formed on the surface of the second insulating layer 16. The etching of the second insulating layer 16 is performed using, for example, the known reactive ion etching device.

Figure 34:
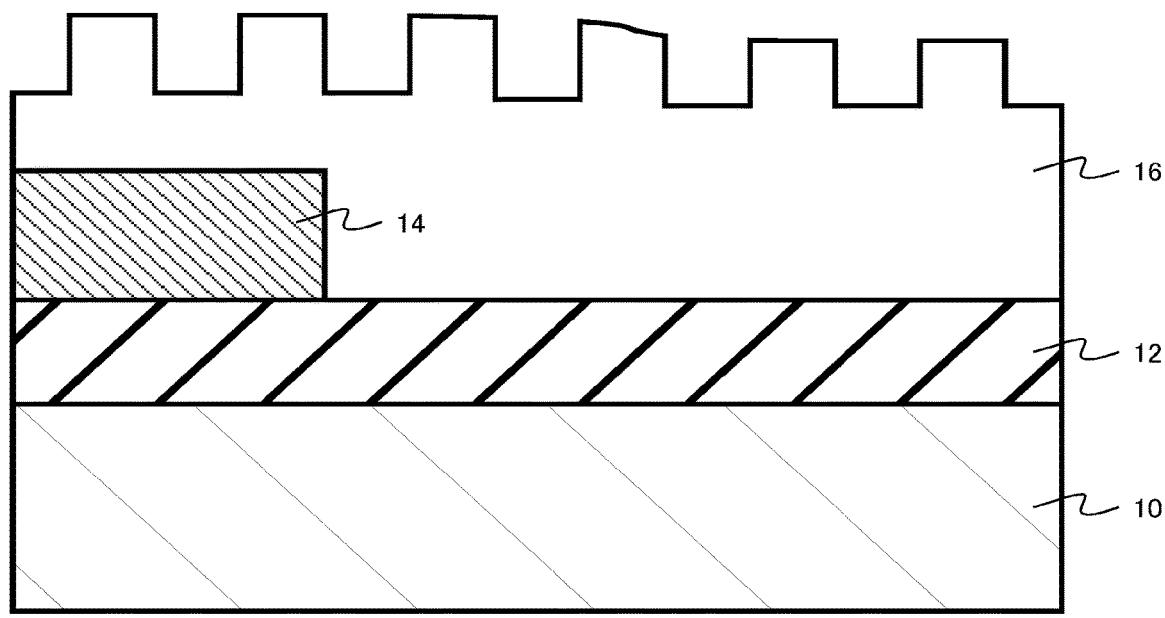
FIG. 34 is a schematic cross-sectional view showing an example of the method for manufacturing the semiconductor device according to the third embodiment.

Next, the resist layer 24 remaining on the patterned second insulating layer 16 is removed (FIG. 34).

The pattern of the second insulating layer 16 is formed on the semiconductor substrate 10 by the method for manufacturing the semiconductor device described above.

Then, for example, a metal wiring layer can be formed by embedding a metal in the groove on the surface of the second insulating layer 16.

In the method for manufacturing the semiconductor device according to the third embodiment, from the viewpoint of reducing the surface step after polishing the second insulating layer 16, the storage elastic modulus of the polishing pad 17 is preferably 500 MPa or more and is more preferably 750 MPa or more.

In the method for manufacturing the semiconductor device according to the third embodiment, from the viewpoint of reducing the surface step after polishing of the second insulating layer 16, when the second insulating layer 16 is polished, it is preferable to polish the second insulating layer 16 while cooling the polishing pad 17. When the second insulating layer 16 is polished, the second insulating layer 16 is preferably polished while the polishing pad 17 is maintained at 50° C. or lower, and the second insulating layer 16 is more preferably polished while the polishing pad 17 is maintained at 40° C. or less.

In the method for manufacturing the semiconductor device according to the third embodiment, when the resist 20 is supplied to the surface of the second insulating layer 16, the resist 20 is preferably applied to the entire surface of the second insulating layer 16 by using the spin coating method. A time required for supplying the resist 20 can be reduced.

The first width w1 of the first plane P1 in the first direction perpendicular to the thickness direction of the semiconductor substrate 10 is preferably 1 mm or more. Further, the second width w2 of the second plane P2 in the first direction perpendicular to the thickness direction of the semiconductor substrate 10 is preferably 1 mm or more. When the widths of the first plane P1 and the second plane P2 are larger, the amount of the resist 20 on the second plane P2 is more likely to be insufficient. Therefore, the method for manufacturing the semiconductor device according to the third embodiment functions effectively.

As described above, according to the method for manufacturing the semiconductor device according to the third embodiment, it is possible to suppress the occurrence of pattern defects, similarly to the method for manufacturing the semiconductor device according to the first embodiment.

Fourth Embodiment

A method for manufacturing a semiconductor device according to a fourth embodiment includes: forming a first layer on a semiconductor substrate, a surface of the first layer having a first plane of which distance from the semiconductor substrate is a first distance and a second plane of which distance from the semiconductor substrate is a second distance smaller than the first distance, and a difference between the first distance and the second distance being 30 nm or more; performing planarization processing on the first layer to have the difference of less than 30 nm; forming a second layer directly on the first layer after performing the planarization processing; forming a third layer directly on the second layer; supplying a resist to the third layer; bringing a template having a pattern into contact with the resist to form a resist layer to which the pattern has been transferred; and etching the third layer using the resist layer as a mask. The method for manufacturing the semiconductor device according to the fourth embodiment is different from a method for manufacturing a semiconductor device according to the first embodiment in that the first layer on which the third layer is formed on the second layer and the third layer is etched using the resist layer as the mask. Hereinafter, description of contents overlapping with those of the first embodiment may be partially omitted.

FIGS. 35 to 45 are schematic cross-sectional views showing an example of the method for manufacturing the semiconductor device according to the fourth embodiment. In the method for manufacturing the semiconductor device according to the fourth embodiment, a chemical mechanical polishing method (CMP method) is used in the planarization processing.

Figure 35:
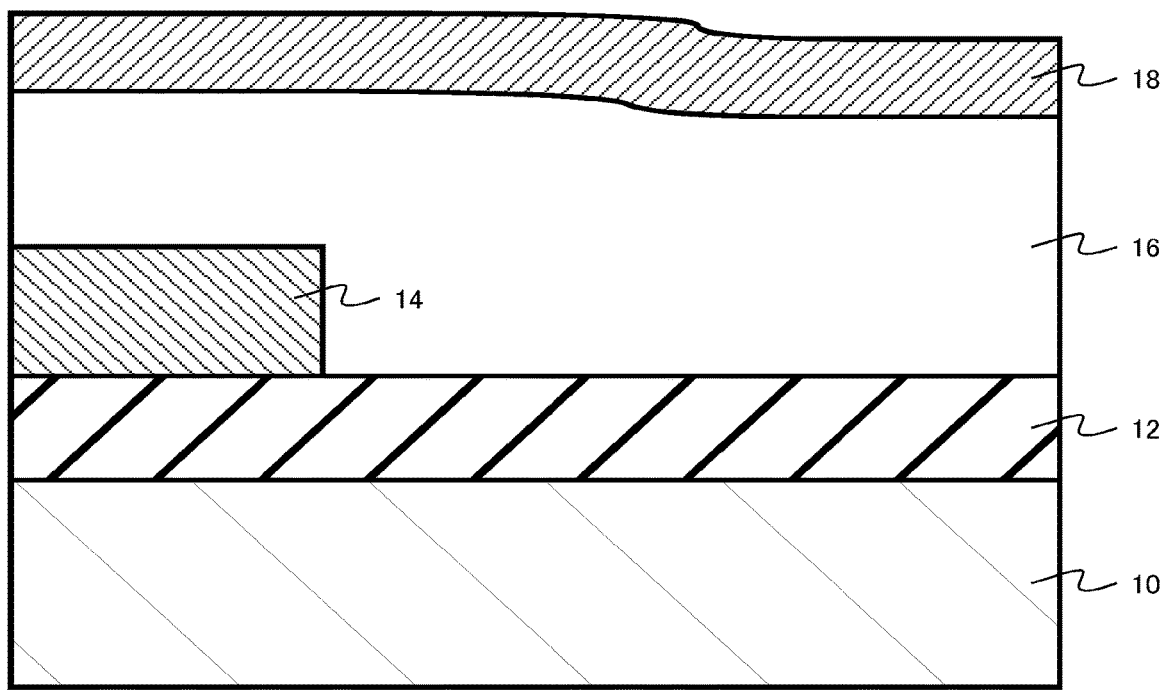
FIG. 35 is a schematic cross-sectional view showing an example of a method for manufacturing a semiconductor device according to a fourth embodiment.

The method for manufacturing the semiconductor device according to the fourth embodiment is the same as the method for manufacturing the semiconductor device according to the first embodiment until a second insulating layer 16 is polished using the chemical mechanical polishing method so that a surface step Δd is less than 30 nm, and a second metal layer 18 is formed on the second insulating layer 16 (FIG. 35). The second insulating layer 16 is an example of a first layer. The second metal layer 18 is an example of a second layer. The second metal layer 18 is a processed layer on which a pattern is formed using a nanoimprint method.

Figure 36:
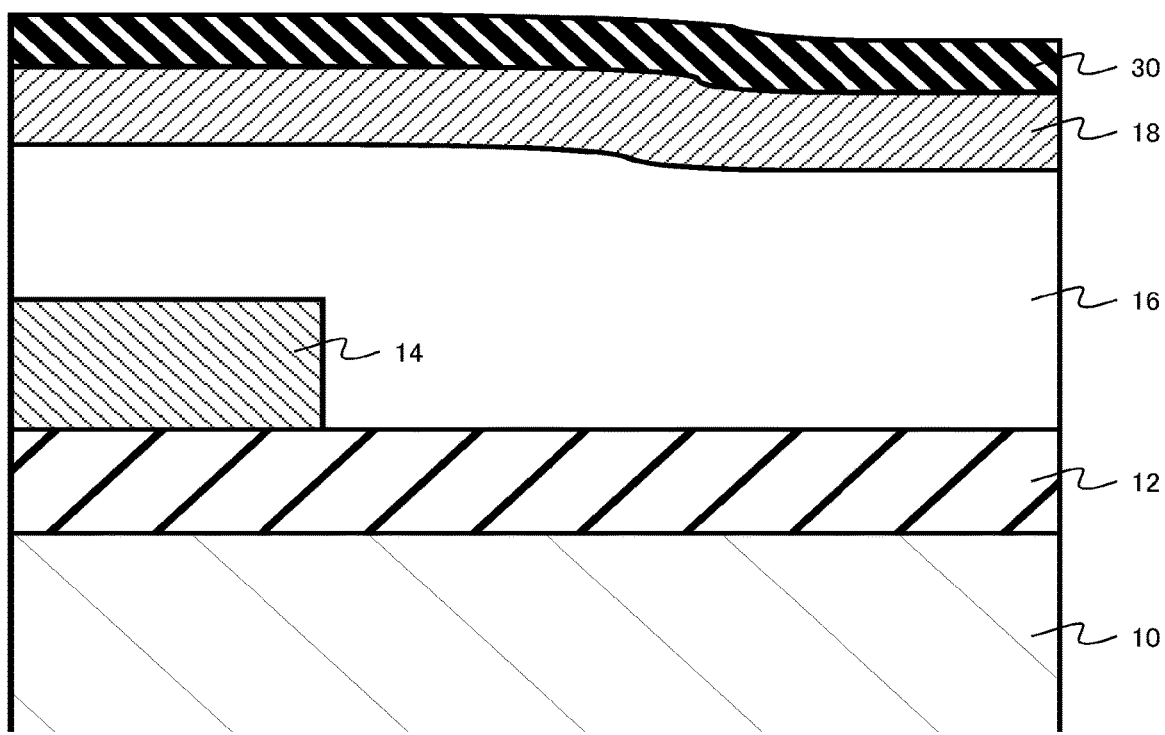
FIG. 36 is a schematic cross-sectional view showing an example of the method for manufacturing the semiconductor device according to the fourth embodiment.

A hard mask layer 30 is formed on a surface of the second metal layer 18 (FIG. 36). The hard mask layer 30 is an example of the third layer.

The hard mask layer 30 is, for example, an insulating layer formed by a CVD method. Further, the hard mask layer 30 is, for example, a stacked film of a carbon film and spin-on-glass (SOG) formed by a spin coating method.

Figure 37:
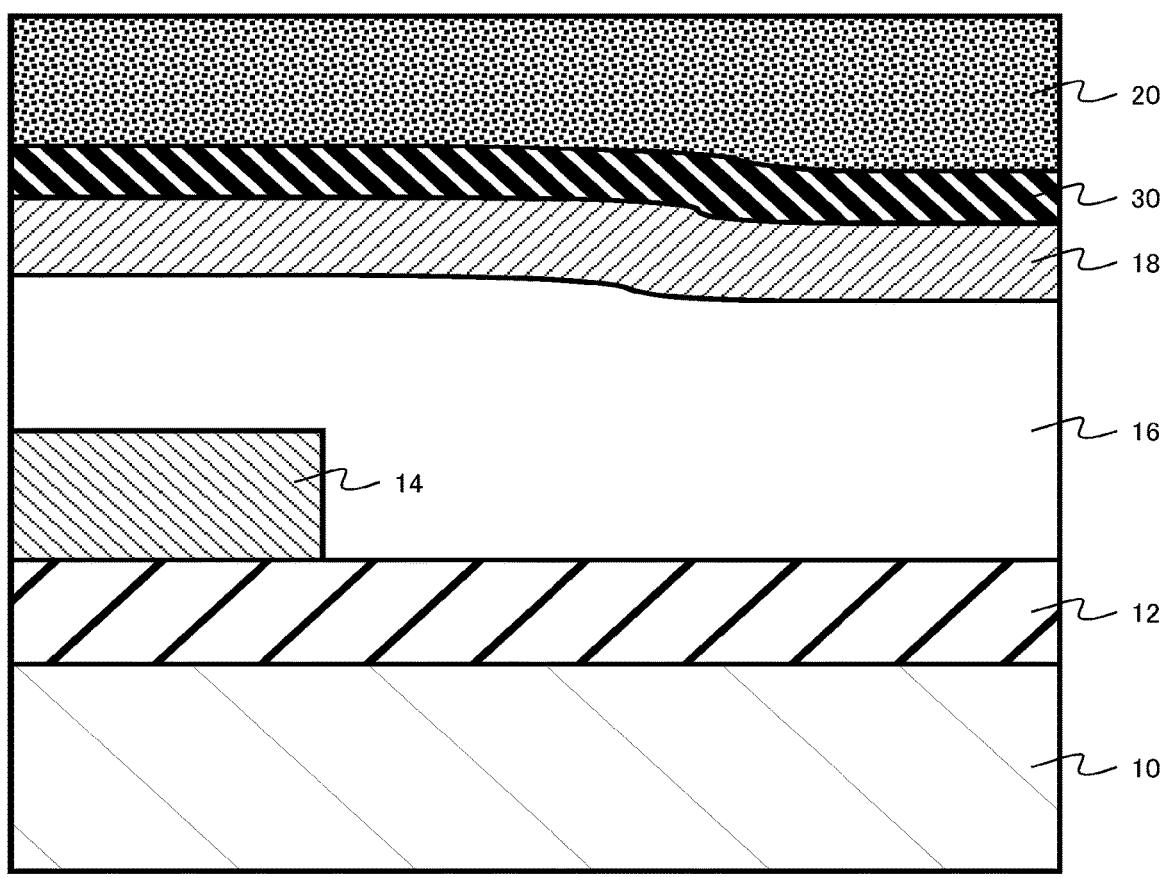
FIG. 37 is a schematic cross-sectional view showing an example of the method for manufacturing the semiconductor device according to the fourth embodiment.

Next, a resist 20 is supplied to a surface of the hard mask layer 30 (FIG. 37). The resist 20 is applied to the entire surface of the hard mask layer 30 using, for example, the spin coating method. Further, the resist 20 is dropped on the surface of the hard mask layer 30, for example, using an inkjet method.

The resist 20 is a resist used for the nanoimprint method. The resist 20 includes, for example, a photocurable resin or a thermosetting resin.

Figure 38:
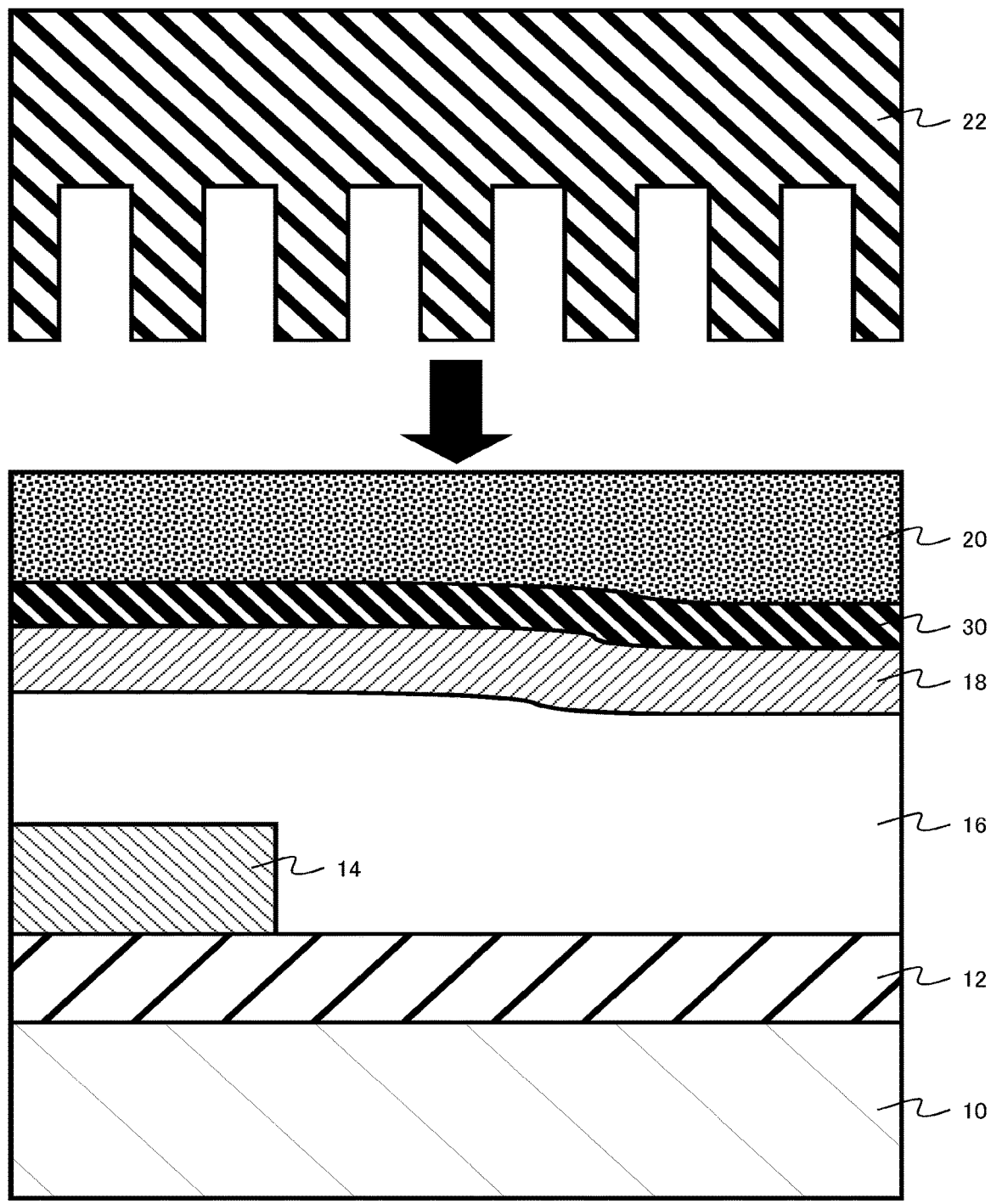
FIG. 38 is a schematic cross-sectional view showing an example of the method for manufacturing the semiconductor device according to the fourth embodiment.

Next, a template 22 (mold) having a pattern is brought into contact with the resist 20 on the surface of the hard mask layer 30 (FIG. 38). As a material of the template 22, for example, when the resist 20 includes a photocurable resin, a material transmitting light is used. The template 22 is, for example, quartz glass.

Figure 39:
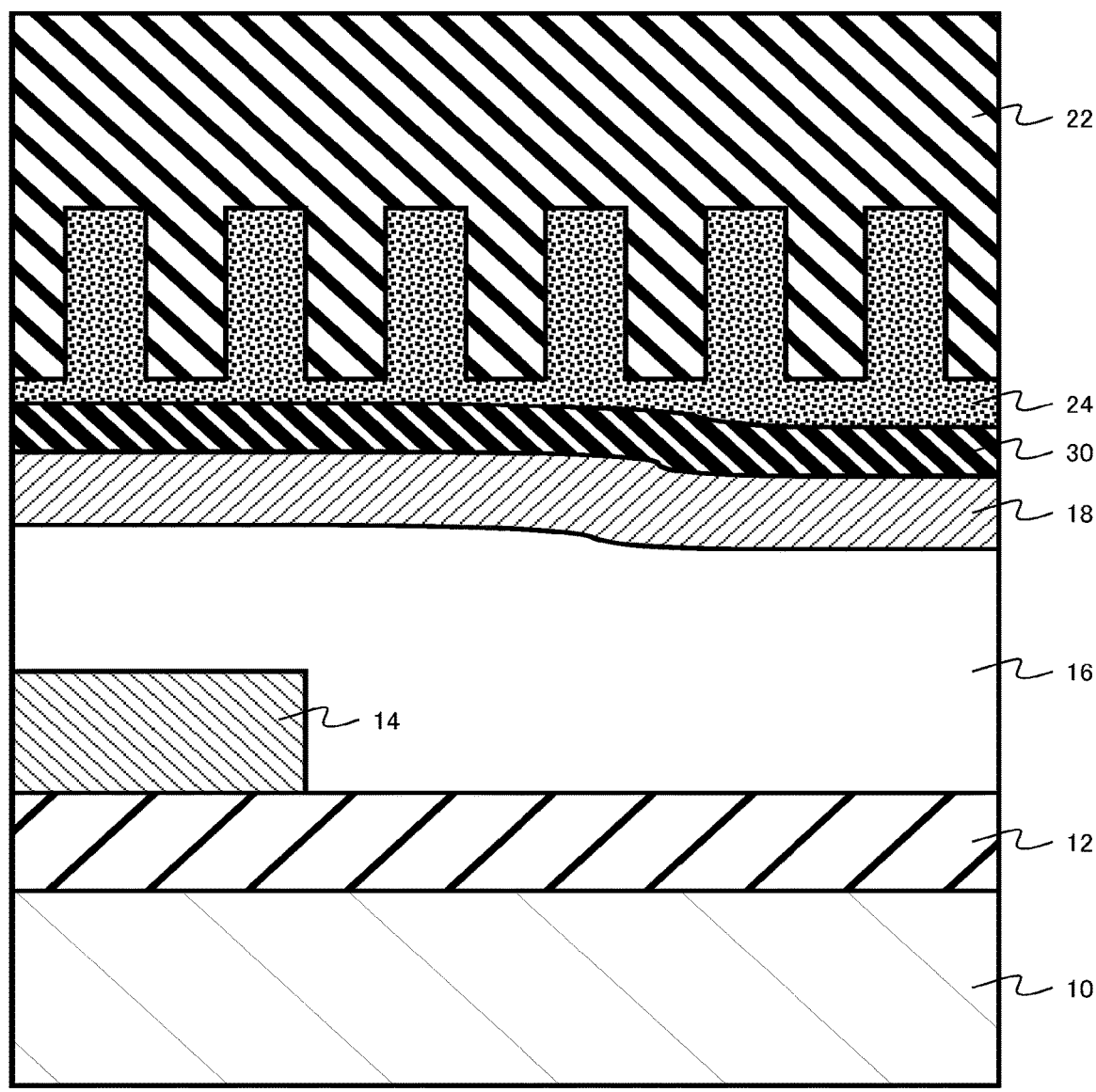
FIG. 39 is a schematic cross-sectional view showing an example of the method for manufacturing the semiconductor device according to the fourth embodiment.

By bringing the template 22 into contact with the resist 20 on the surface of the hard mask layer 30, the resist 20 is sucked up into a concave portion of the template 22. The pattern of the template 22 is transferred to the resist 20, and a resist layer 24 is formed on the surface of the hard mask layer 30 (FIG. 39).

Figure 40:
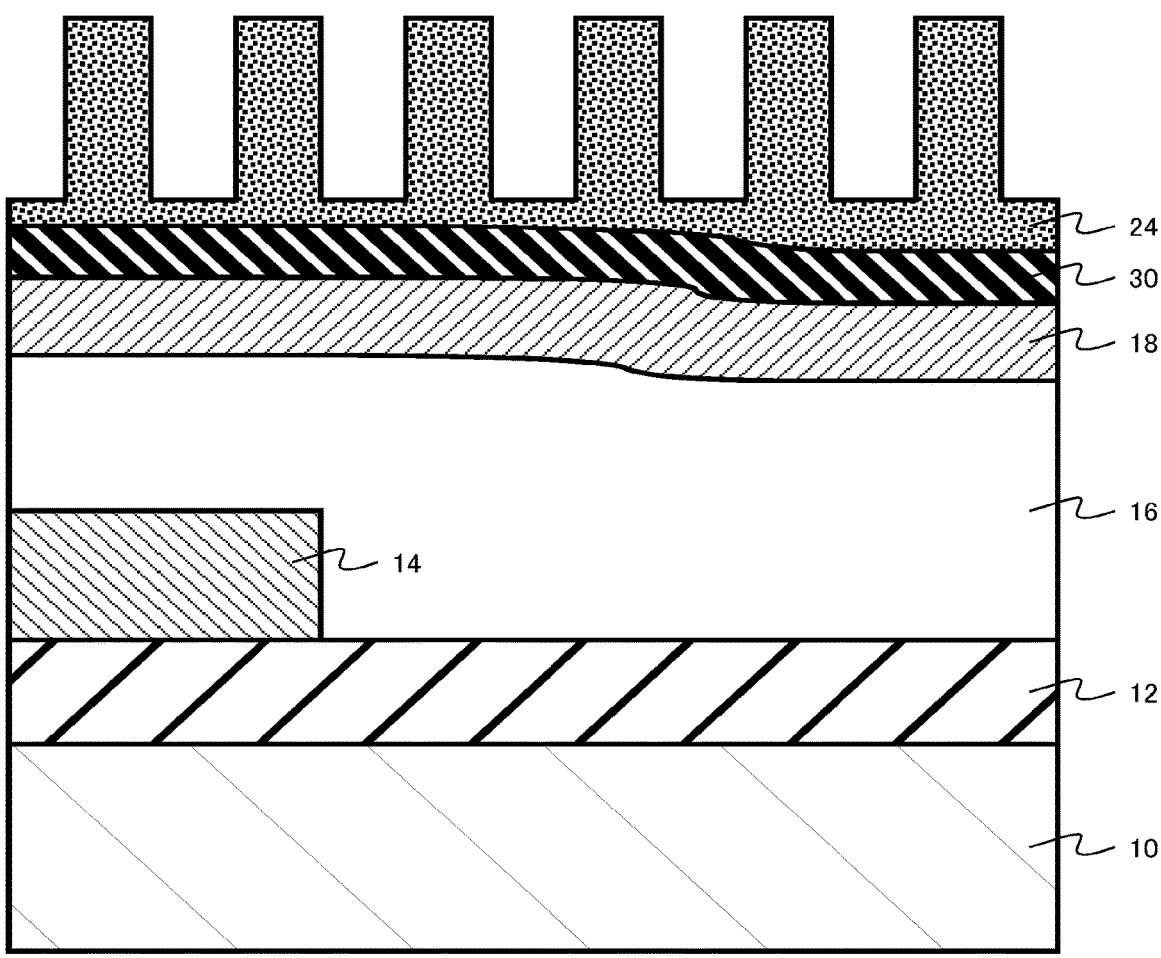
FIG. 40 is a schematic cross-sectional view showing an example of the method for manufacturing the semiconductor device according to the fourth embodiment.

After forming the resist layer 24 to which the pattern of the template 22 has been transferred, the template 22 is separated from the resist layer 24 (FIG. 40).

Figure 41:
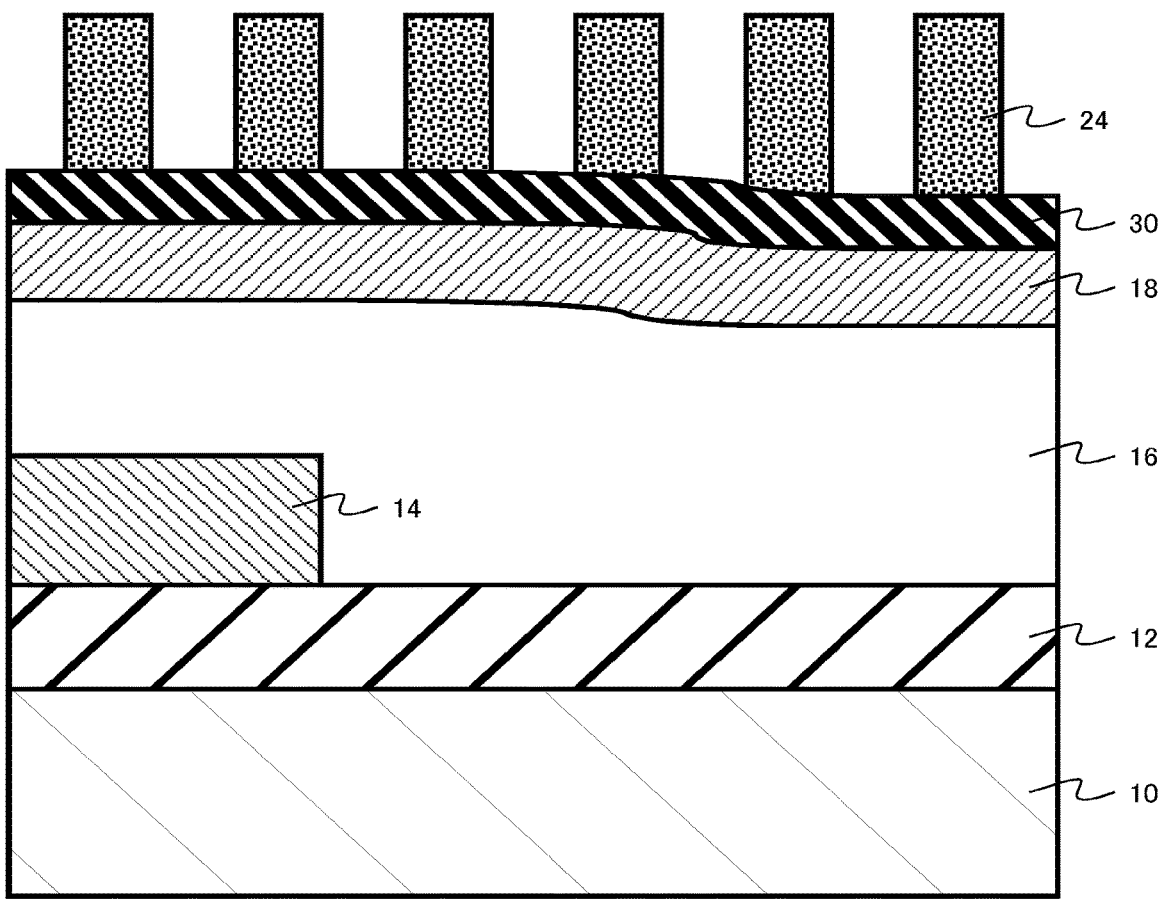
FIG. 41 is a schematic cross-sectional view showing an example of the method for manufacturing the semiconductor device according to the fourth embodiment.

Next, the entire surface of the resist layer 24 is etched, so that the thin resist layer 24 remaining in a space portion of a line pattern is removed (FIG. 41). The entire surface etching is performed using, for example, a known reactive ion etching device.

Figure 42:
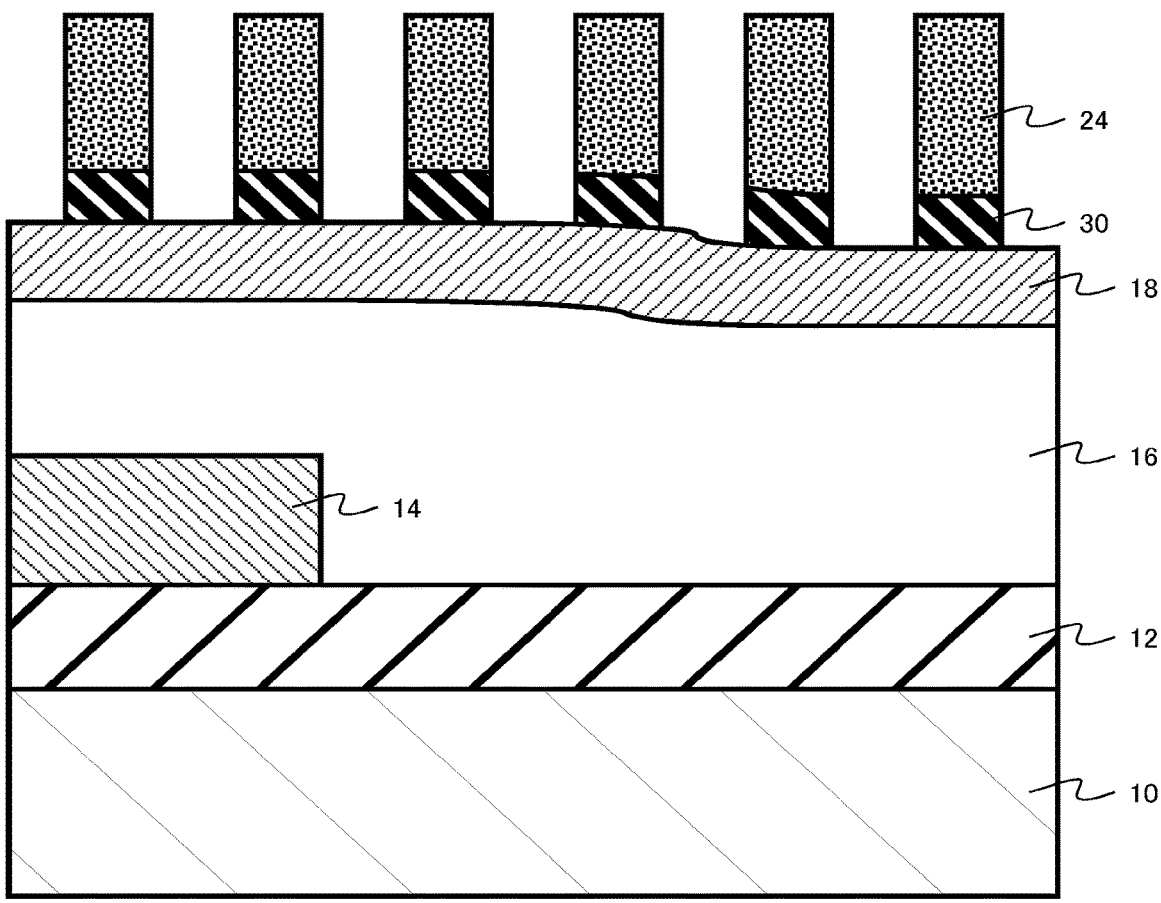
FIG. 42 is a schematic cross-sectional view showing an example of the method for manufacturing the semiconductor device according to the fourth embodiment.

Next, the hard mask layer 30 is etched using the resist layer 24 as a mask (FIG. 42). The etching of the hard mask layer 30 is performed using, for example, the known reactive ion etching device.

Figure 43:
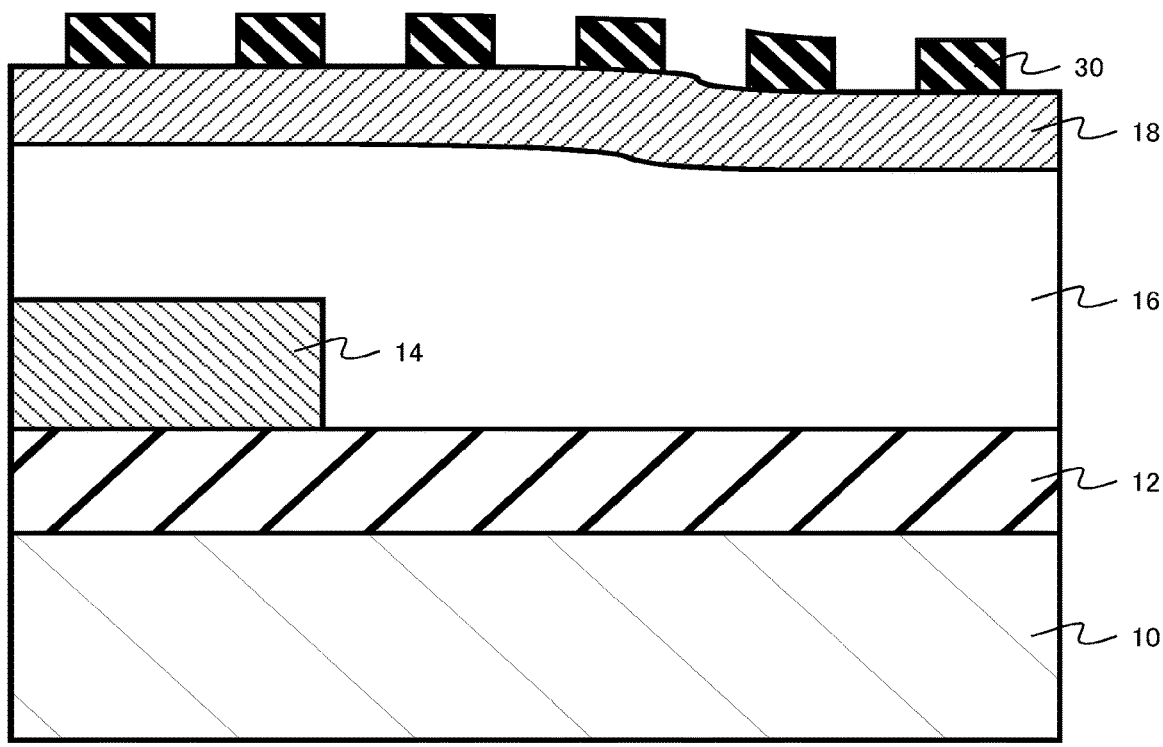
FIG. 43 is a schematic cross-sectional view showing an example of the method for manufacturing the semiconductor device according to the fourth embodiment.

Next, the resist layer 24 remaining on the patterned hard mask layer 30 is removed (FIG. 43). It is also possible not to remove the resist layer 24.

Figure 44:
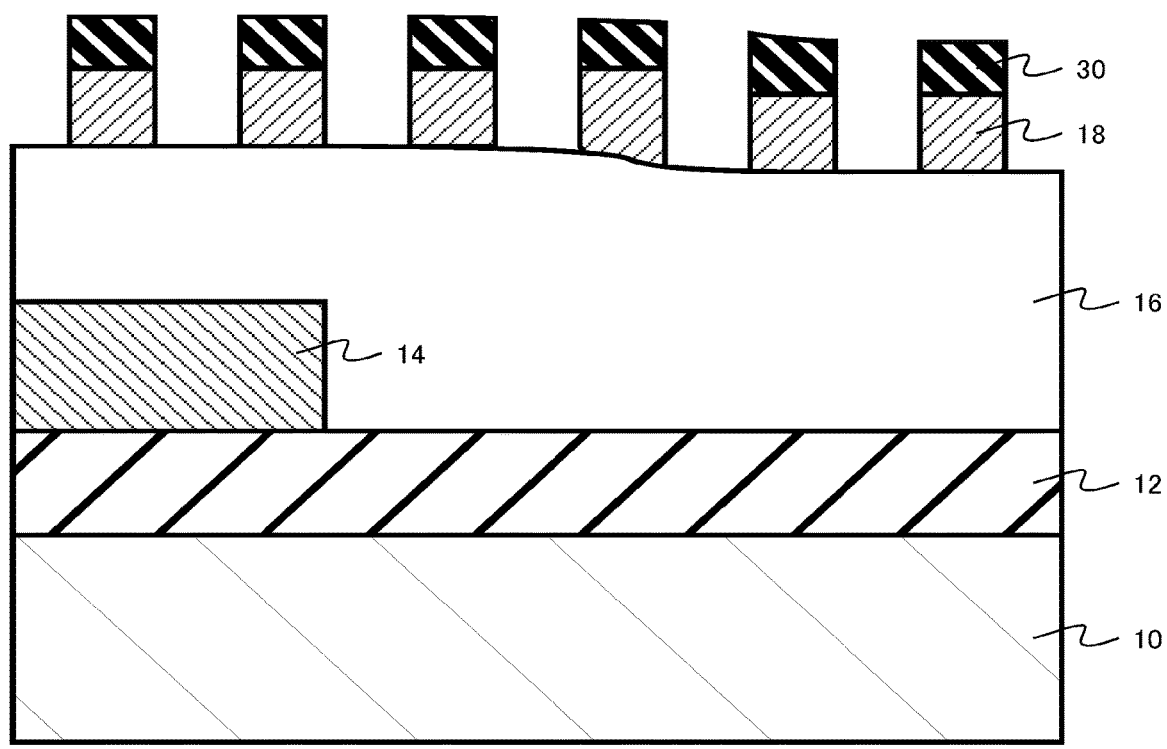
FIG. 44 is a schematic cross-sectional view showing an example of the method for manufacturing the semiconductor device according to the fourth embodiment.

Next, the second metal layer 18 is etched using the patterned hard mask layer 30 as a mask (FIG. 44). The etching of the second metal layer 18 is performed using, for example, the known reactive ion etching device.

Figure 45:
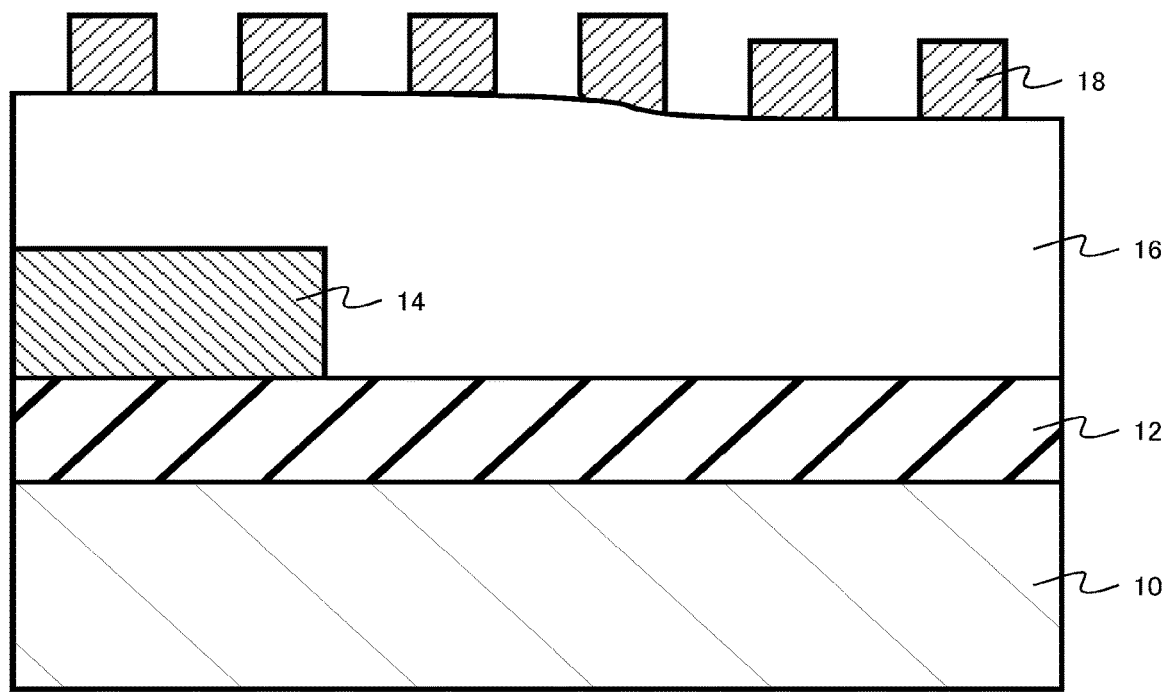
FIG. 45 is a schematic cross-sectional view showing an example of the method for manufacturing the semiconductor device according to the fourth embodiment.

Next, the hard mask layer 30 remaining on the second metal layer 18 is removed (FIG. 45).

The pattern of the second metal layer 18 is formed on the semiconductor substrate 10 by the method for manufacturing the semiconductor device described above.

In the method for manufacturing the semiconductor device according to the fourth embodiment, from the viewpoint of reducing the surface step after polishing the second insulating layer 16, a storage elastic modulus of a polishing pad 17 is preferably 500 MPa or more and is more preferably 750 MPa or more.

In the method for manufacturing the semiconductor device according to the fourth embodiment, from the viewpoint of reducing the surface step after polishing of the second insulating layer 16, when the second insulating layer 16 is polished, it is preferable to polish the second insulating layer 16 while cooling the polishing pad 17. When the second insulating layer 16 is polished, the second insulating layer 16 is preferably polished while the polishing pad 17 is maintained at 50° C. or lower, and the second insulating layer 16 is more preferably polished while the polishing pad 17 is maintained at 40° C. or less.

In the method for manufacturing the semiconductor device according to the fourth embodiment, when the resist 20 is supplied to the surface of the hard mask layer 30, the resist 20 is preferably applied to the entire surface of the hard mask layer 30 by using the spin coating method. A time required for supplying the resist 20 can be reduced.

The first width w1 of the first plane P1 in the first direction perpendicular to the thickness direction of the semiconductor substrate 10 is preferably 1 mm or more. Further, the second width w2 of the second plane P2 in the first direction perpendicular to the thickness direction of the semiconductor substrate 10 is preferably 1 mm or more. When the widths of the first plane P1 and the second plane P2 are larger, the amount of the resist 20 on the second plane P2 is more likely to be insufficient. Therefore, the method for manufacturing the semiconductor device according to the fourth embodiment functions effectively.

As described above, according to the method for manufacturing the semiconductor device according to the fourth embodiment, it is possible to suppress the occurrence of pattern defects, similarly to the method for manufacturing the semiconductor device according to the first embodiment.

Fifth Embodiment

A method for manufacturing a semiconductor device according to a fifth embodiment includes: forming a first layer on a semiconductor substrate, a surface of the first layer having a first plane of which distance from the semiconductor substrate is a first distance and a second plane of which distance from the semiconductor substrate is a second distance smaller than the first distance, and a difference between the first distance and the second distance being 30 nm or more; performing planarization processing on the first layer to have the difference of less than 30 nm; forming a second layer directly on the first layer after performing the planarization processing; supplying a resist to the second layer; bringing a template having a pattern into contact with the resist to form a resist layer to which the pattern has been transferred; etching the second layer using the resist layer as a mask; and etching the first layer using the etched second layer as a mask. The method for manufacturing the semiconductor device according to the fifth embodiment is different from a method for manufacturing a semiconductor device according to the first and the third embodiments in that the first layer is etched using the etched second layer as the mask. Hereinafter, description of contents overlapping with those of the first and third embodiments may be partially omitted.

FIGS. 46 to 56 are schematic cross-sectional views showing an example of the method for manufacturing the semiconductor device according to the fifth embodiment. In the method for manufacturing the semiconductor device according to the fifth embodiment, a chemical mechanical polishing method (CMP method) is used in the planarization processing.

Figure 46:
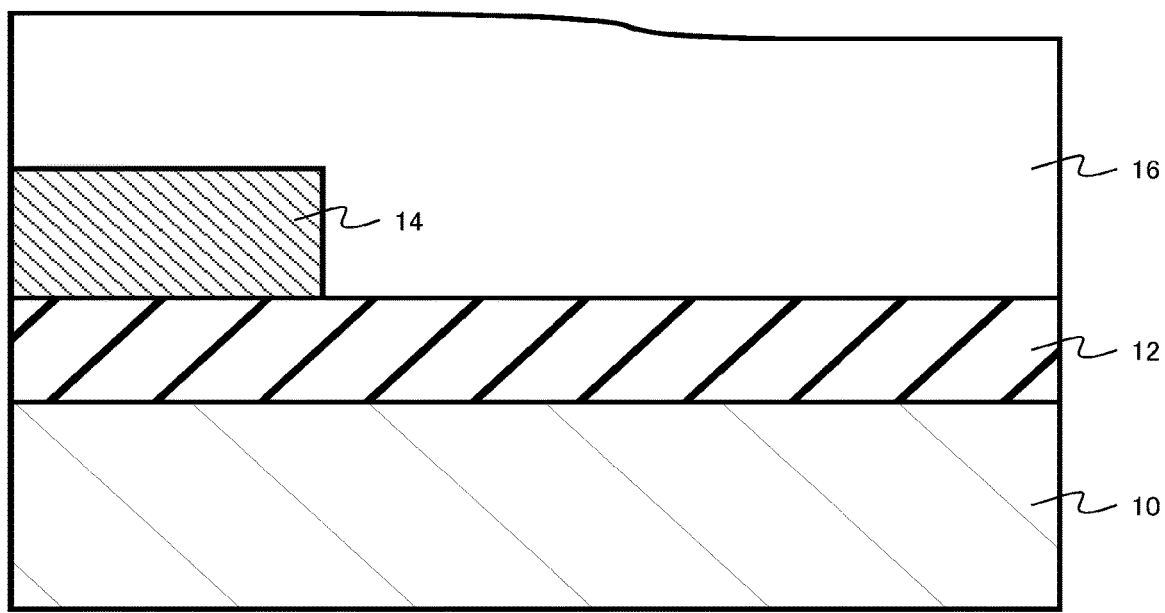
FIG. 46 is a schematic cross-sectional view showing an example of a method for manufacturing a semiconductor device according to a fifth embodiment.

The method for manufacturing the semiconductor device according to the fifth embodiment is the same as the method for manufacturing the semiconductor device according to the first and third embodiments until a second insulating layer 16 is polished using the chemical mechanical polishing method so that a surface step Δd is less than 30 nm (FIG. 46).

The second insulating layer 16 is an example of a first layer. The second insulating layer 16 is a processed layer on which a pattern is formed using a nanoimprint method.

Figure 47:
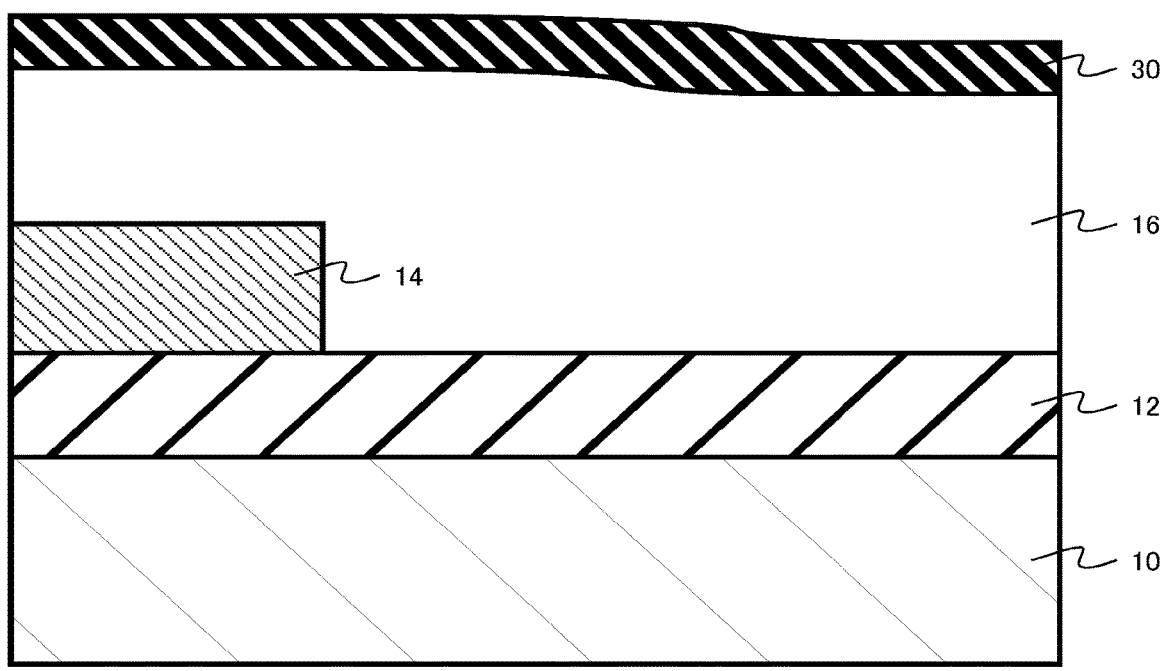
FIG. 47 is a schematic cross-sectional view showing an example of the method for manufacturing the semiconductor device according to the fifth embodiment.

A hard mask layer 30 is formed on a surface of the second insulating layer 16 (FIG. 47). The hard mask layer 30 is an example of the second layer.

The hard mask layer 30 is, for example, an insulating layer or a metal layer formed by a CVD method. Further, the hard mask layer 30 is, for example, a stacked film of a carbon film and spin-on-glass (SOG) formed by a spin coating method.

Figure 48:
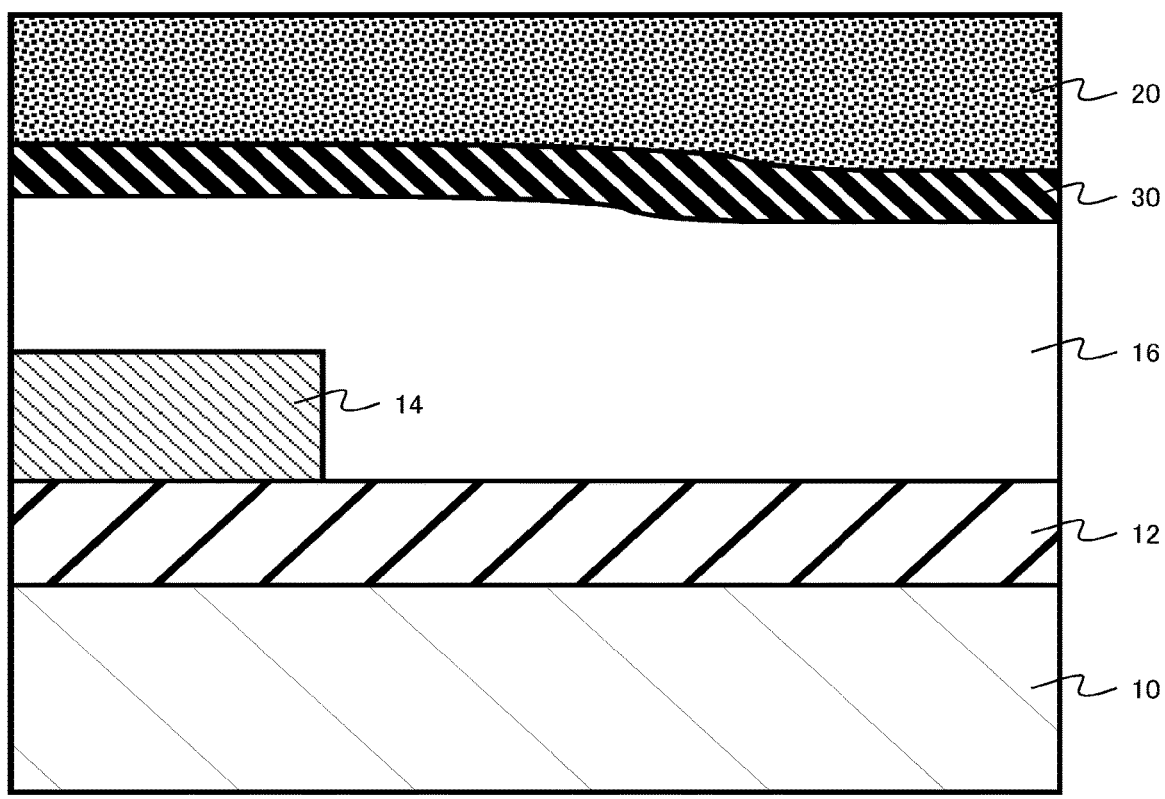
FIG. 48 is a schematic cross-sectional view showing an example of the method for manufacturing the semiconductor device according to the fifth embodiment.

Next, a resist 20 is supplied to a surface of the hard mask layer 30 (FIG. 48). The resist 20 is applied to the entire surface of the hard mask layer 30 using, for example, the spin coating method. Further, the resist 20 is dropped on the surface of the hard mask layer 30, for example, using an inkjet method.

The resist 20 is a resist used for the nanoimprint method. The resist 20 includes, for example, a photocurable resin or a thermosetting resin.

Figure 49:
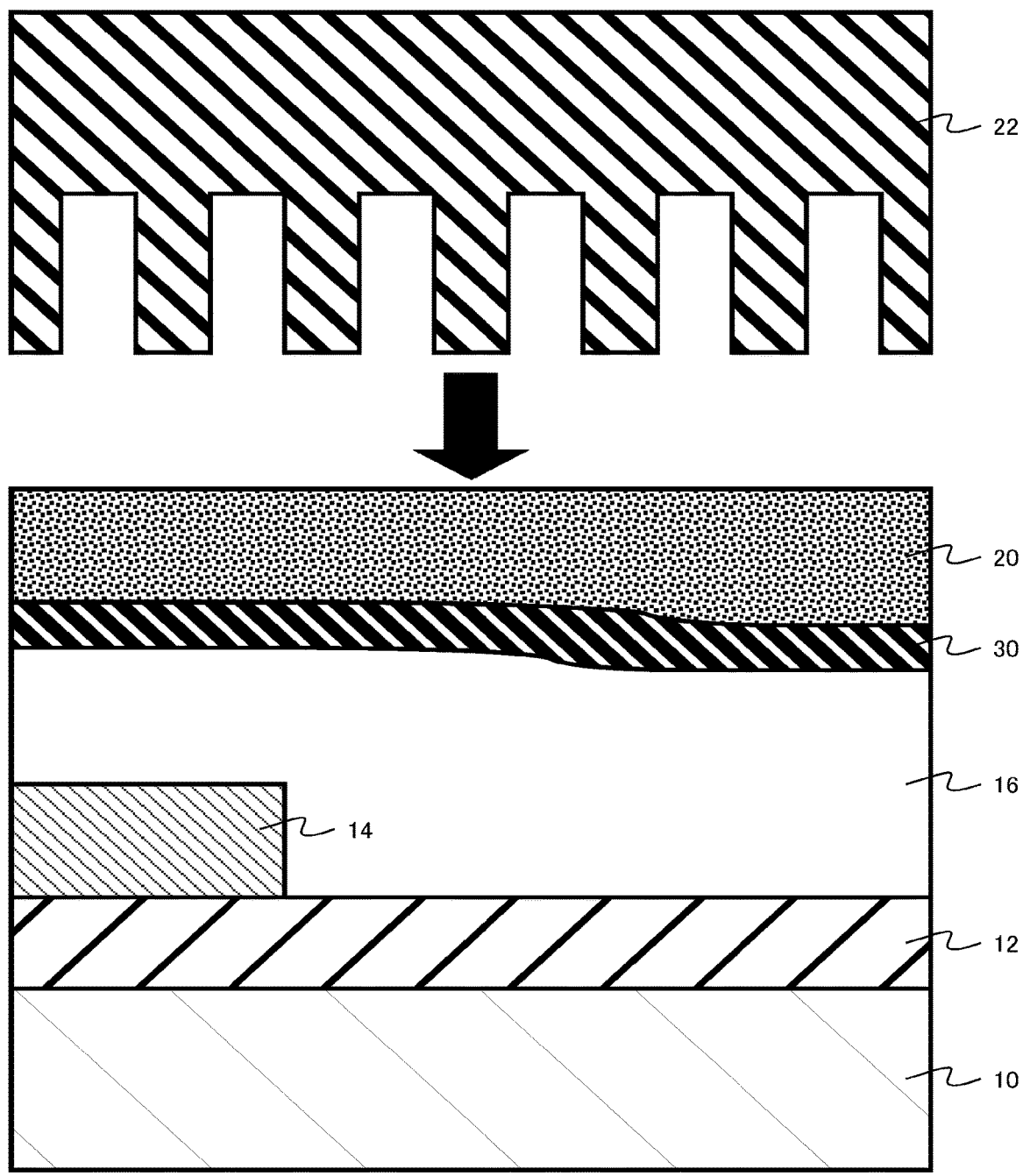
FIG. 49 is a schematic cross-sectional view showing an example of the method for manufacturing the semiconductor device according to the fifth embodiment.

Next, a template 22 (mold) having a pattern is brought into contact with the resist 20 on the surface of the hard mask layer 30 (FIG. 49). As a material of the template 22, for example, when the resist 20 includes a photocurable resin, a material transmitting light is used. The template 22 is, for example, quartz glass.

Figure 50:
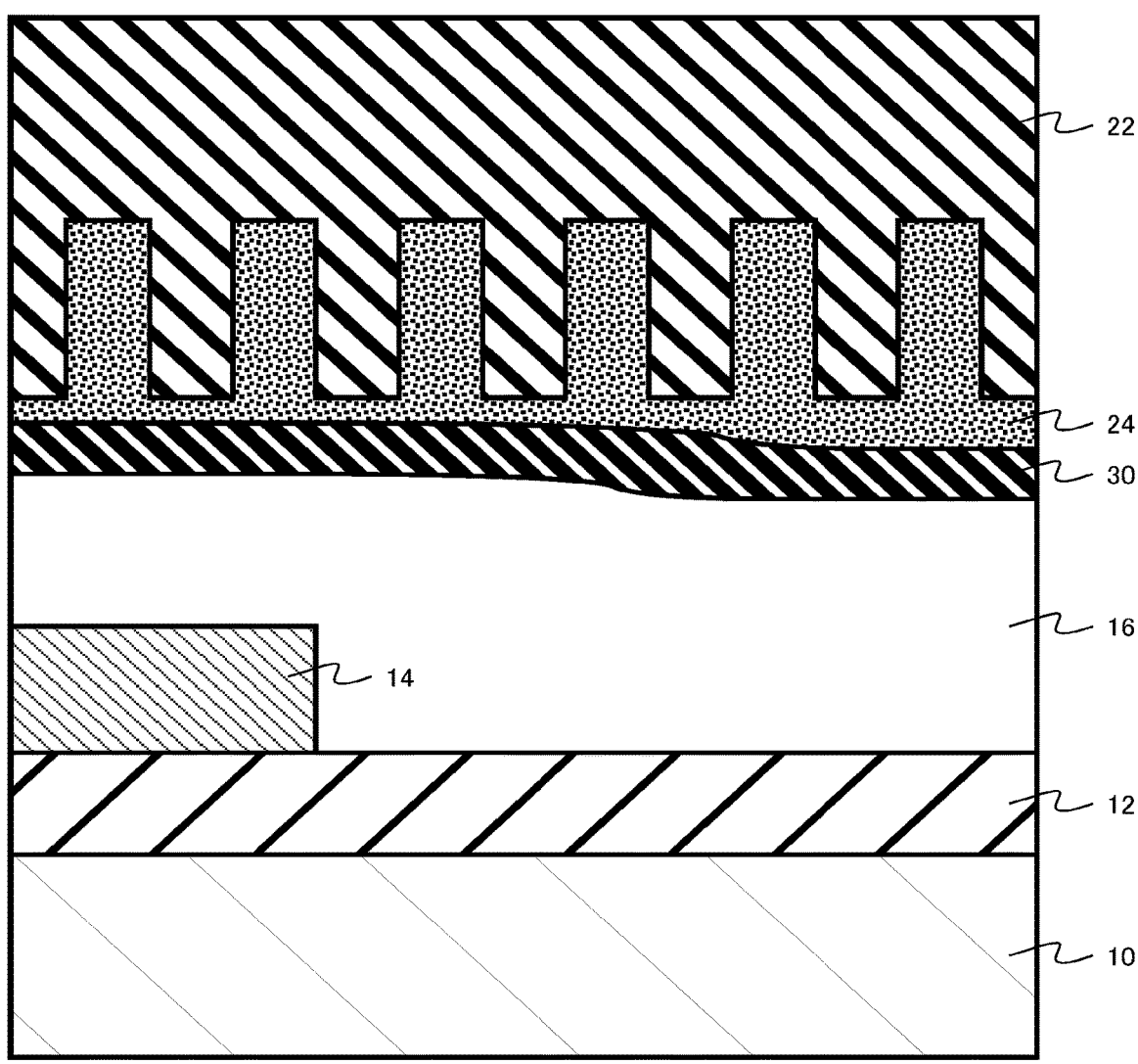
FIG. 50 is a schematic cross-sectional view showing an example of the method for manufacturing the semiconductor device according to the fifth embodiment.

By bringing the template 22 into contact with the resist 20 on the surface of the hard mask layer 30, the resist 20 is sucked up into a concave portion of the template 22. The pattern of the template 22 is transferred to the resist 20, and a resist layer 24 is formed on the surface of the hard mask layer 30 (FIG. 50).

Figure 51:
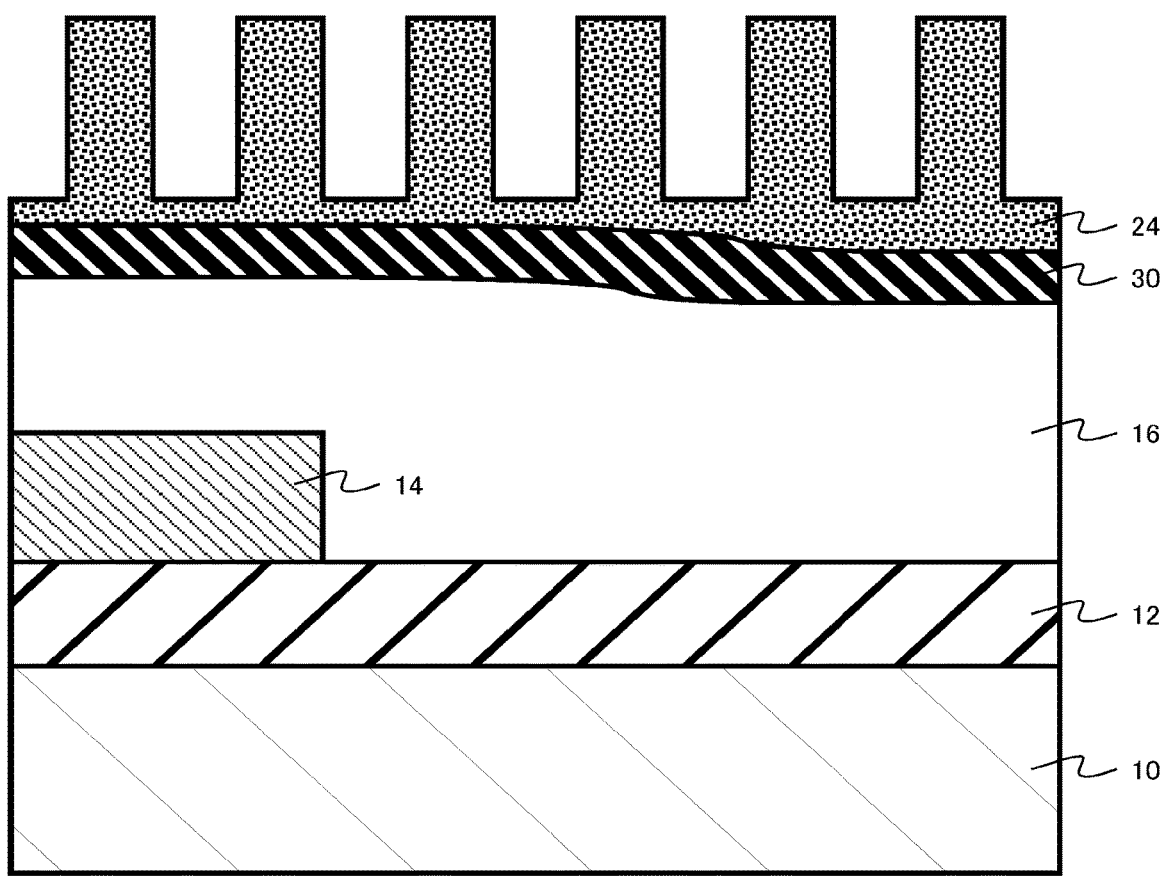
FIG. 51 is a schematic cross-sectional view showing an example of the method for manufacturing the semiconductor device according to the fifth embodiment.

After forming the resist layer 24 to which the pattern of the template 22 has been transferred, the template 22 is separated from the resist layer 24 (FIG. 51).

Figure 52:
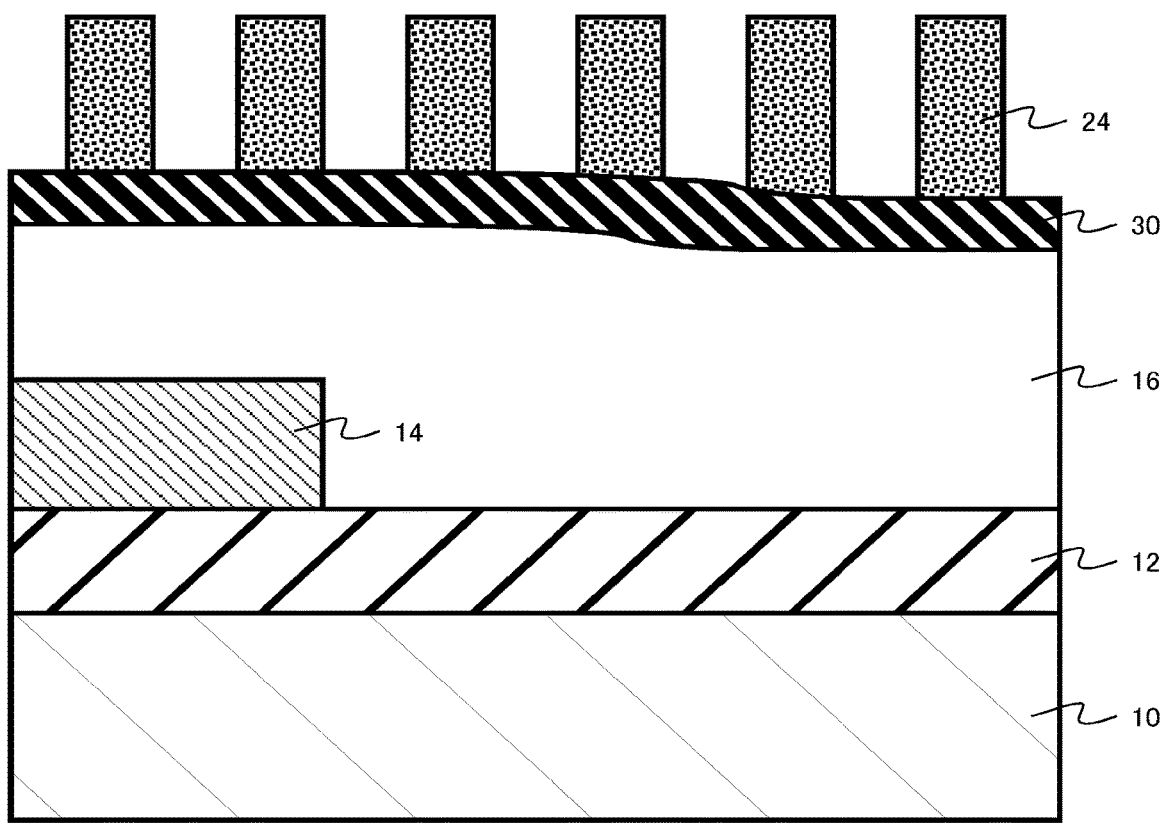
FIG. 52 is a schematic cross-sectional view showing an example of the method for manufacturing the semiconductor device according to the fifth embodiment.

Next, the entire surface of the resist layer 24 is etched, so that the thin resist layer 24 remaining in a space portion of a line pattern is removed (FIG. 52). The entire surface etching is performed using, for example, a known reactive ion etching device.

Figure 53:
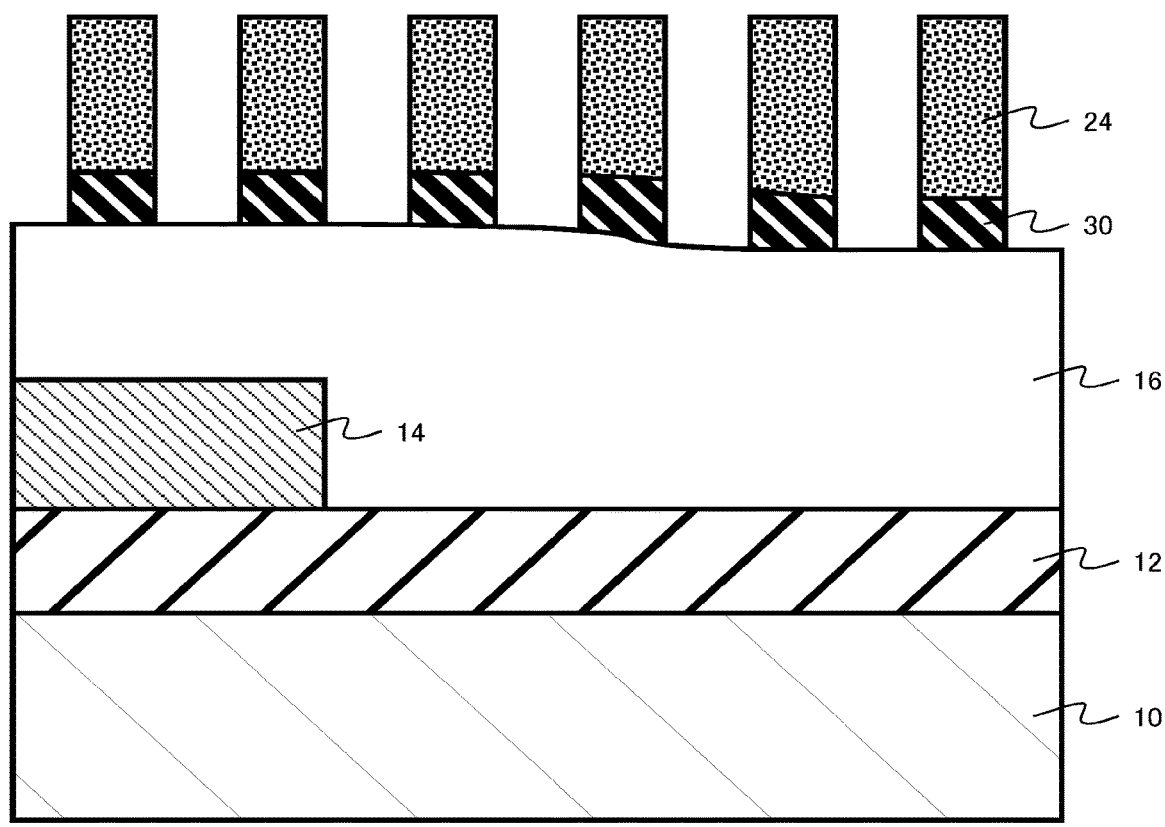
FIG. 53 is a schematic cross-sectional view showing an example of the method for manufacturing the semiconductor device according to the fifth embodiment.

Next, the hard mask layer 30 is etched using the resist layer 24 as a mask (FIG. 53). The etching of the hard mask layer 30 is performed using, for example, the known reactive ion etching device.

Figure 54:
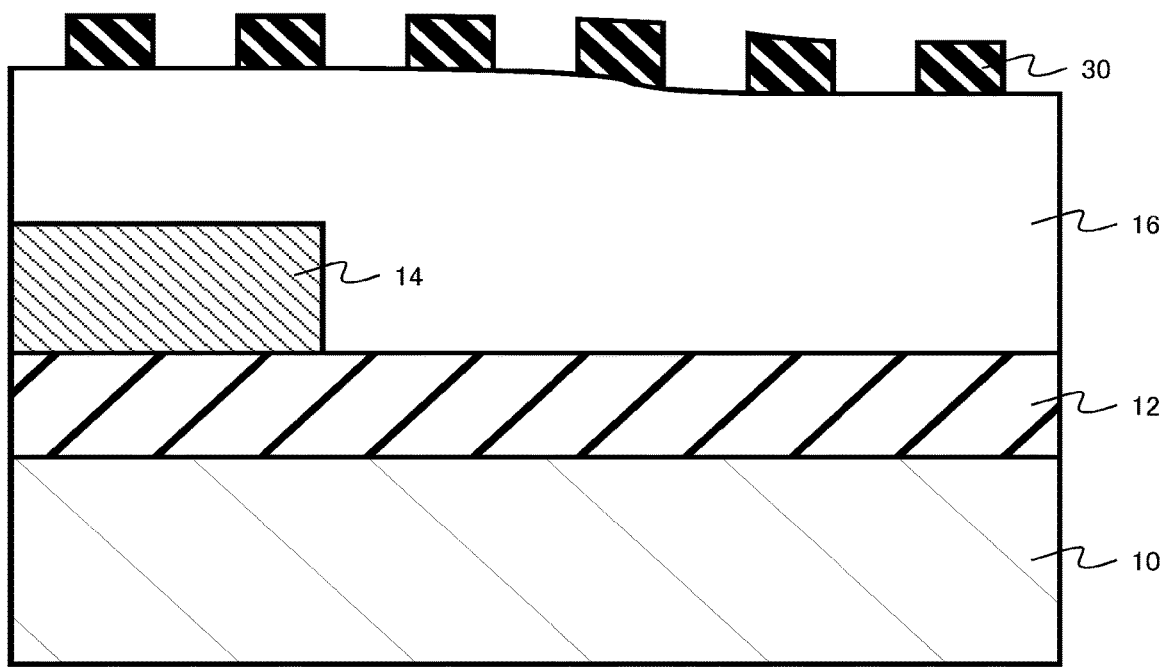
FIG. 54 is a schematic cross-sectional view showing an example of the method for manufacturing the semiconductor device according to the fifth embodiment.

Next, the resist layer 24 remaining on the patterned hard mask layer 30 is removed (FIG. 54). It is also possible not to remove the resist layer 24.

Figure 55:
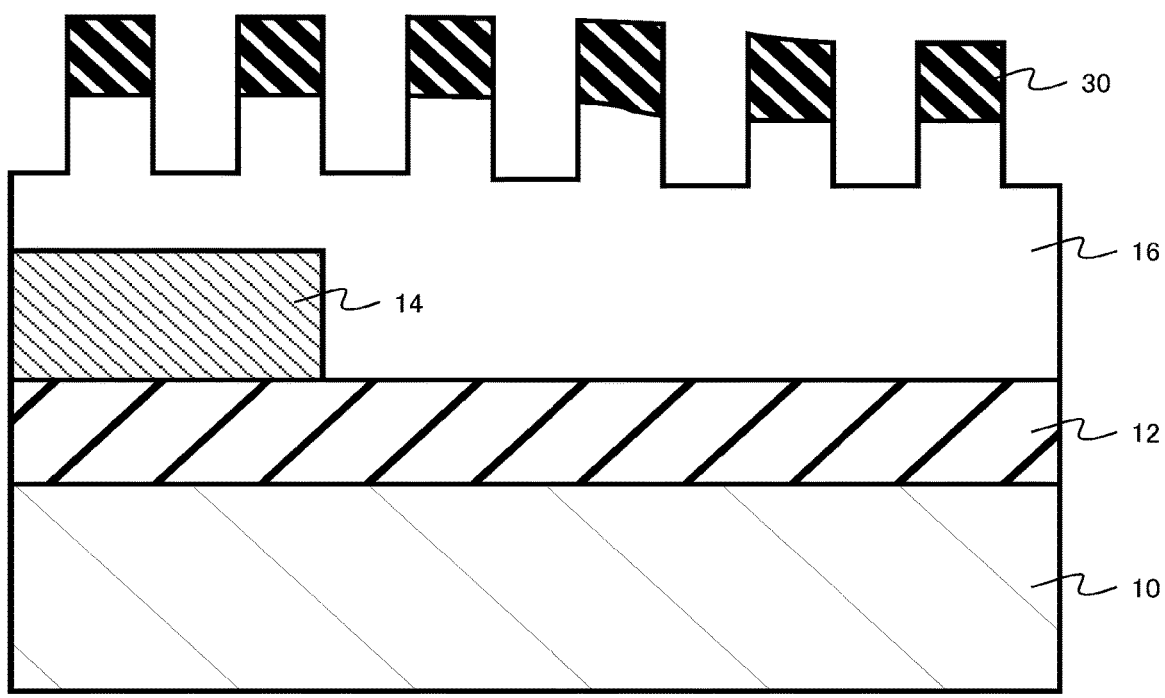
FIG. 55 is a schematic cross-sectional view showing an example of the method for manufacturing the semiconductor device according to the fifth embodiment.

Next, the second insulating layer 16 is etched using the patterned hard mask layer 30 as a mask (FIG. 55). The second insulating layer 16 is patterned by etching. A groove is formed on the surface of the second insulating layer 16. The etching of the second insulating layer 16 is performed using, for example, the known reactive ion etching device.

Figure 56:
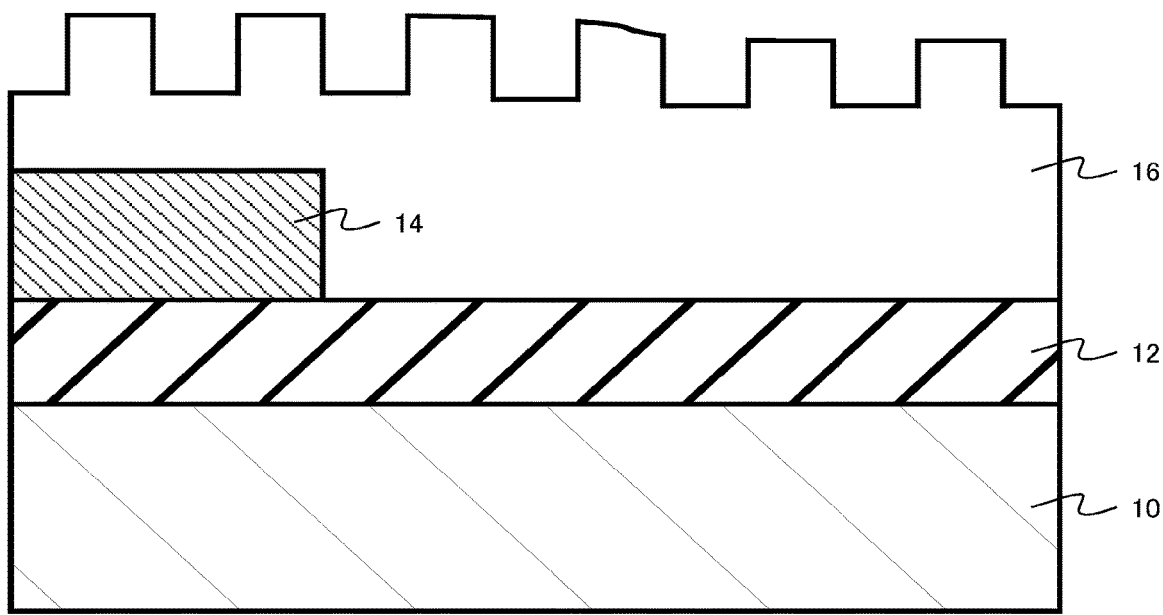
FIG. 56 is a schematic cross-sectional view showing an example of the method for manufacturing the semiconductor device according to the fifth embodiment.

Next, the hard mask layer 30 remaining on the patterned second insulating layer 16 is removed (FIG. 56).

The pattern of the second insulating layer 16 is formed on the semiconductor substrate 10 by the method for manufacturing the semiconductor device described above.

Then, for example, a metal wiring layer can be formed by embedding a metal in the groove on the surface of the second insulating layer 16.

In the method for manufacturing the semiconductor device according to the fifth embodiment, from the viewpoint of reducing the surface step after polishing the second insulating layer 16, a storage elastic modulus of a polishing pad 17 is preferably 500 MPa or more and is more preferably 750 MPa or more.

In the method for manufacturing the semiconductor device according to the fifth embodiment, from the viewpoint of reducing the surface step after polishing of the second insulating layer 16, when the second insulating layer 16 is polished, it is preferable to polish the second insulating layer 16 while cooling the polishing pad 17. When the second insulating layer 16 is polished, the second insulating layer 16 is preferably polished while the polishing pad 17 is maintained at 50° C. or lower, and the second insulating layer 16 is more preferably polished while the polishing pad 17 is maintained at 40° C. or less.

In the method for manufacturing the semiconductor device according to the fifth embodiment, when the resist 20 is supplied to the surface of the hard mask layer 30, the resist 20 is preferably applied to the entire surface of the hard mask layer 30 by using the spin coating method. A time required for supplying the resist 20 can be reduced.

The first width w1 of the first plane P1 in the first direction perpendicular to the thickness direction of the semiconductor substrate 10 is preferably 1 mm or more. Further, the second width w2 of the second plane P2 in the first direction perpendicular to the thickness direction of the semiconductor substrate 10 is preferably 1 mm or more. When the widths of the first plane P1 and the second plane P2 are larger, the amount of the resist 20 on the second plane P2 is more likely to be insufficient. Therefore, the method for manufacturing the semiconductor device according to the fifth embodiment functions effectively.

As described above, according to the method for manufacturing the semiconductor device according to the fifth embodiment, it is possible to suppress the occurrence of pattern defects, similarly to the method for manufacturing the semiconductor device according to the first embodiment.

Sixth Embodiment

A method for manufacturing a semiconductor device according to a sixth embodiment includes: forming a first layer on a semiconductor substrate, a surface of the first layer having a first plane of which distance from the semiconductor substrate is a first distance and a second plane of which distance from the semiconductor substrate is a second distance smaller than the first distance, and a difference between the first distance and the second distance being 30 nm or more; performing planarization processing on the first layer to have the difference of less than 30 nm; forming a second layer directly on the first layer after performing the planarization processing; forming a third layer directly on the second layer; supplying a resist to the third layer; bringing a template having a pattern into contact with the resist to form a resist layer to which the pattern has been transferred; etching the third layer using the resist layer as a mask; forming a sidewall layer on a side of the etched third layer; selectively removing the third layer with respect to the sidewall layer and the second layer after forming the sidewall layer; and etching the second layer using the sidewall layer as a mask. The method for manufacturing the semiconductor device according to the sixth embodiment is different from a method for manufacturing a semiconductor device according to the first embodiment in that the third layer is formed directly on the second layer, the resist is supplied to the third layer, the template having the pattern is brought into contact with the resist to form the resist layer to which the pattern has been transferred, the third layer is etched using the resist layer as the mask, the sidewall layer is formed on the side of the etched third layer, the third layer is selectively removed with respect to the sidewall layer and the second layer after forming the sidewall layer, and the second layer is etched using the sidewall layer as the mask. Hereinafter, description of contents overlapping with those of the first embodiment may be partially omitted.

FIGS. 57 to 70 are schematic cross-sectional views showing an example of the method for manufacturing the semiconductor device according to the sixth embodiment. In the method for manufacturing the semiconductor device according to the sixth embodiment, a chemical mechanical polishing method (CMP method) is used in the planarization processing.

Figure 57:
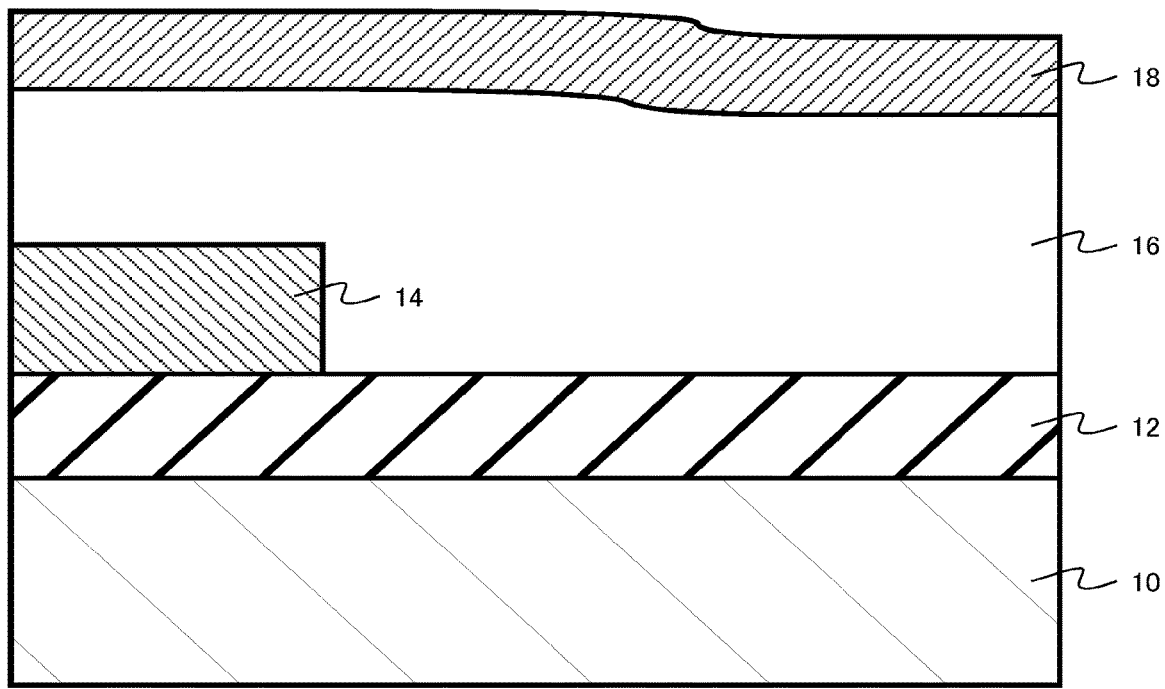
FIG. 57 is a schematic cross-sectional view showing an example of a method for manufacturing a semiconductor device according to a sixth embodiment.

The method for manufacturing the semiconductor device according to the sixth embodiment is the same as the method for manufacturing the semiconductor device according to the first embodiment until a second insulating layer 16 is polished using the chemical mechanical polishing method so that a surface step Δd is less than 30 nm, and a second metal layer 18 is formed on the second insulating layer 16 (FIG. 57). The second insulating layer 16 is an example of a first layer. The second metal layer 18 is an example of a second layer.

The second metal layer 18 is a processed layer on which a pattern is formed using a nanoimprint method. Further, a pattern of the second metal layer 18 is formed by double patterning technology using a spacer process.

Figure 58:
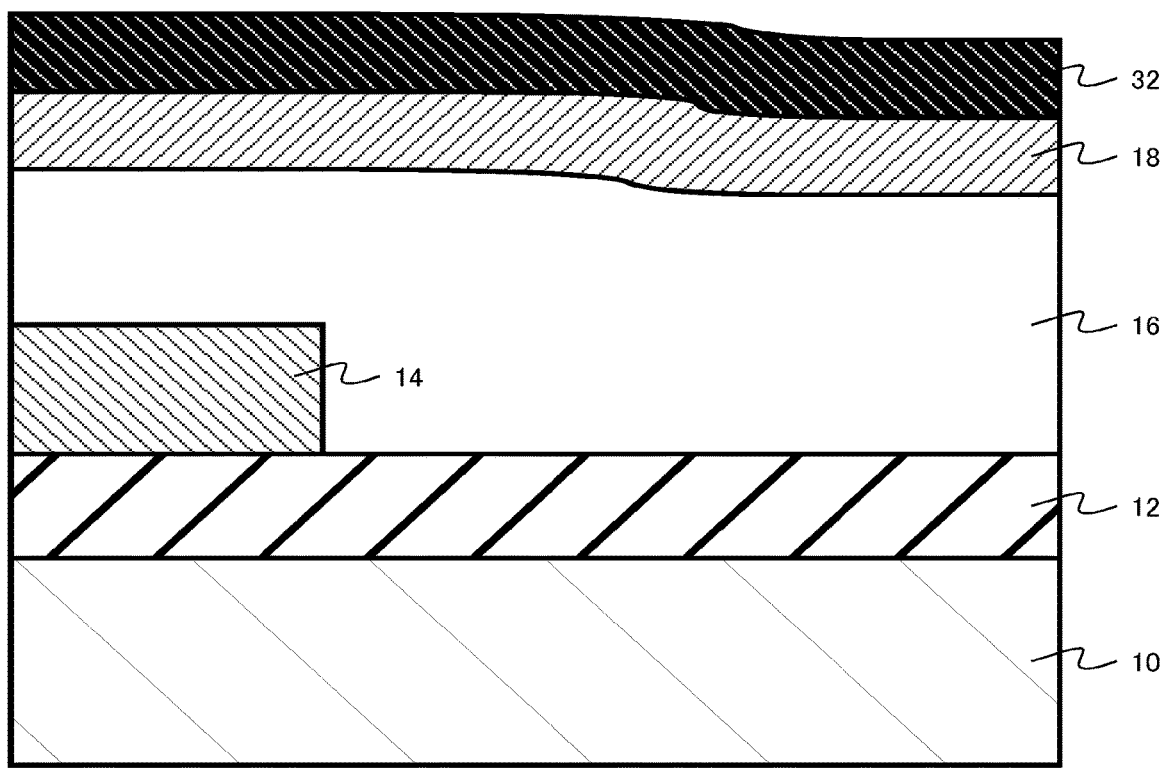
FIG. 58 is a schematic cross-sectional view showing an example of the method for manufacturing the semiconductor device according to the sixth embodiment.

A sacrificial layer 32 is formed on a surface of the second metal layer 18 (FIG. 58). The sacrificial layer 32 is an example of the third layer. The sacrificial layer 32 is, for example, a stacked film of a carbon film and an insulating film formed by using a spin coating method.

Figure 59:
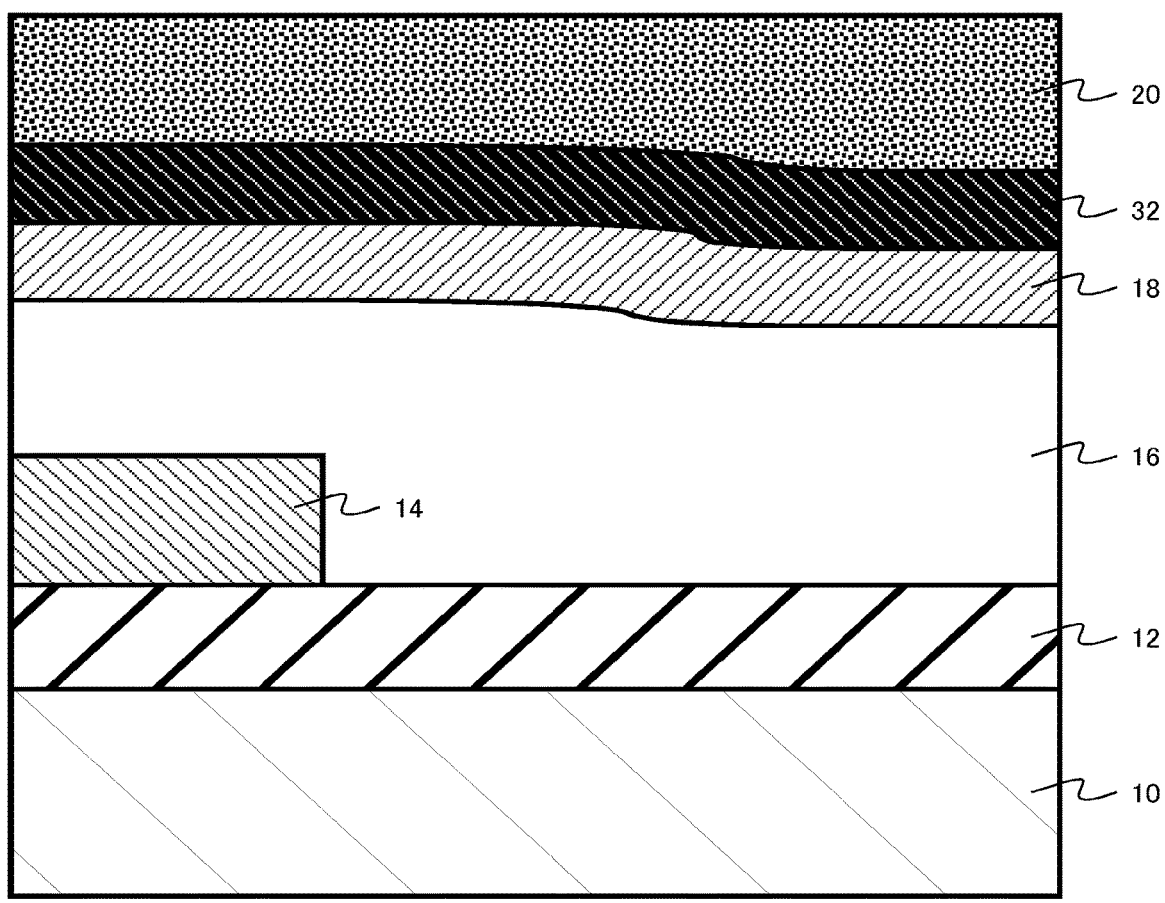
FIG. 59 is a schematic cross-sectional view showing an example of the method for manufacturing the semiconductor device according to the sixth embodiment.

Next, a resist 20 is supplied to a surface of the sacrificial layer 32 (FIG. 59). The resist 20 is applied to the entire surface of the sacrificial layer 32 by using, for example, the spin coating method. Further, the resist 20 is dropped on the surface of the sacrificial layer 32 by using, for example, an inkjet method.

The resist 20 is a resist used for the nanoimprint method. The resist 20 includes, for example, a photocurable resin or a thermosetting resin.

Figure 60:
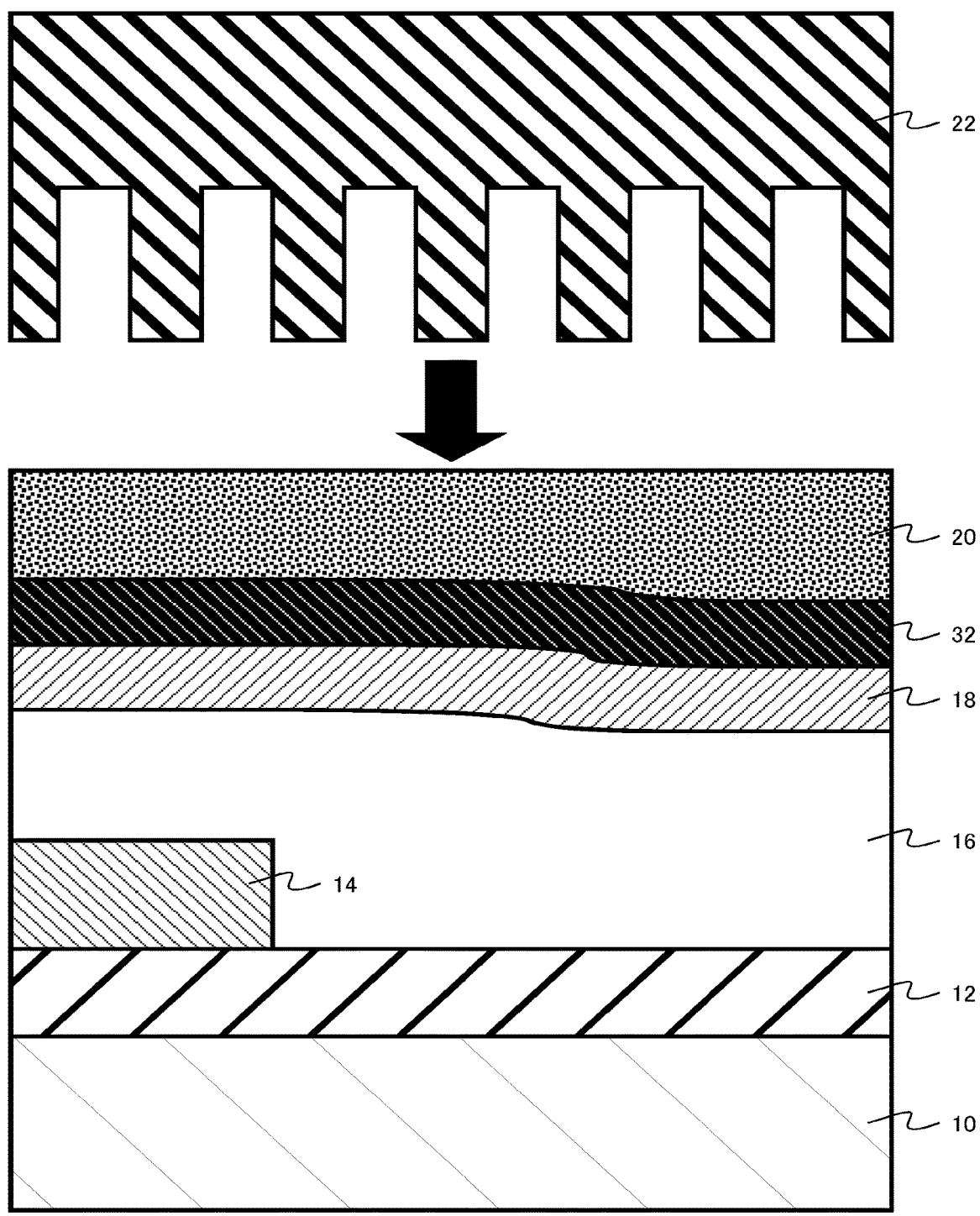
FIG. 60 is a schematic cross-sectional view showing an example of the method for manufacturing the semiconductor device according to the sixth embodiment.

Next, a template 22 (mold) having a pattern is brought into contact with the resist 20 on the surface of the sacrificial layer 32 (FIG. 60). As a material of the template 22, for example, when the resist 20 includes a photocurable resin, a material transmitting light is used. The template 22 is, for example, quartz glass.

Figure 61:
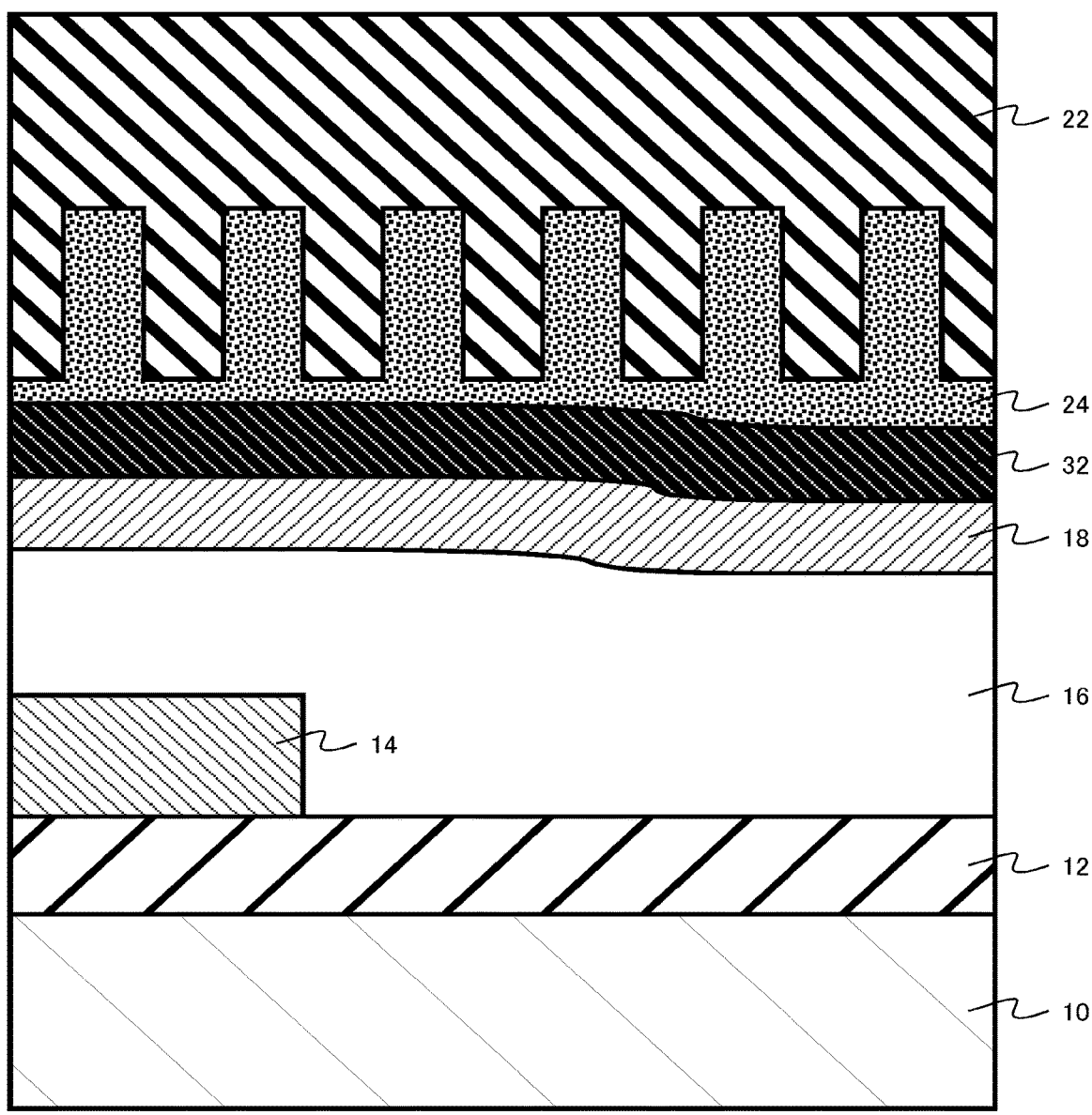
FIG. 61 is a schematic cross-sectional view showing an example of the method for manufacturing the semiconductor device according to the sixth embodiment.

By bringing the template 22 into contact with the resist 20 on the surface of the sacrificial layer 32, the resist 20 is sucked up into a concave portion of the template 22. The pattern of the template 22 is transferred to the resist 20, and a resist layer 24 is formed on the surface of the sacrificial layer 32 (FIG. 61).

Figure 62:
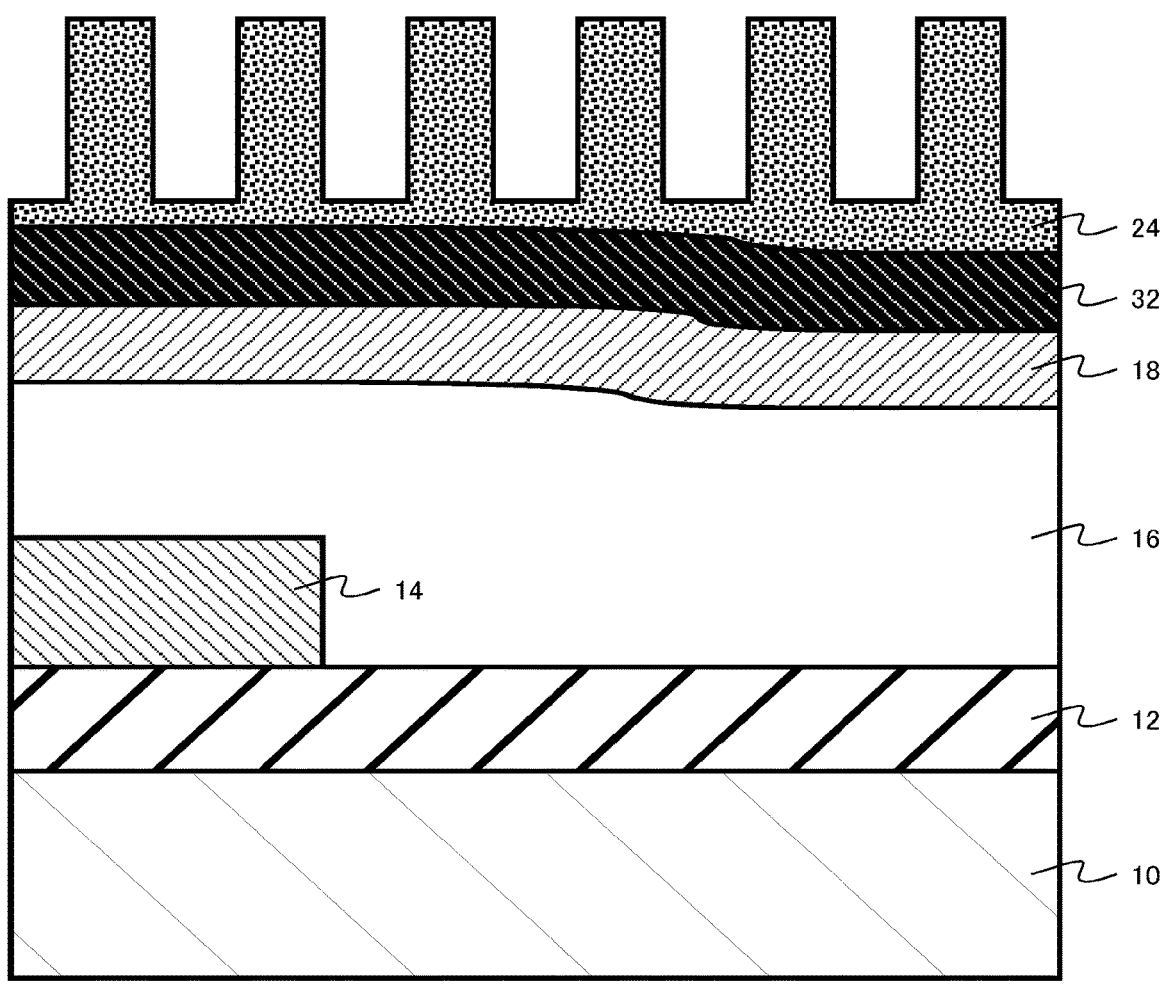
FIG. 62 is a schematic cross-sectional view showing an example of the method for manufacturing the semiconductor device according to the sixth embodiment.

After forming the resist layer 24 to which the pattern of the template 22 has been transferred, the template 22 is separated from the resist layer 24 (FIG. 62).

Figure 63:
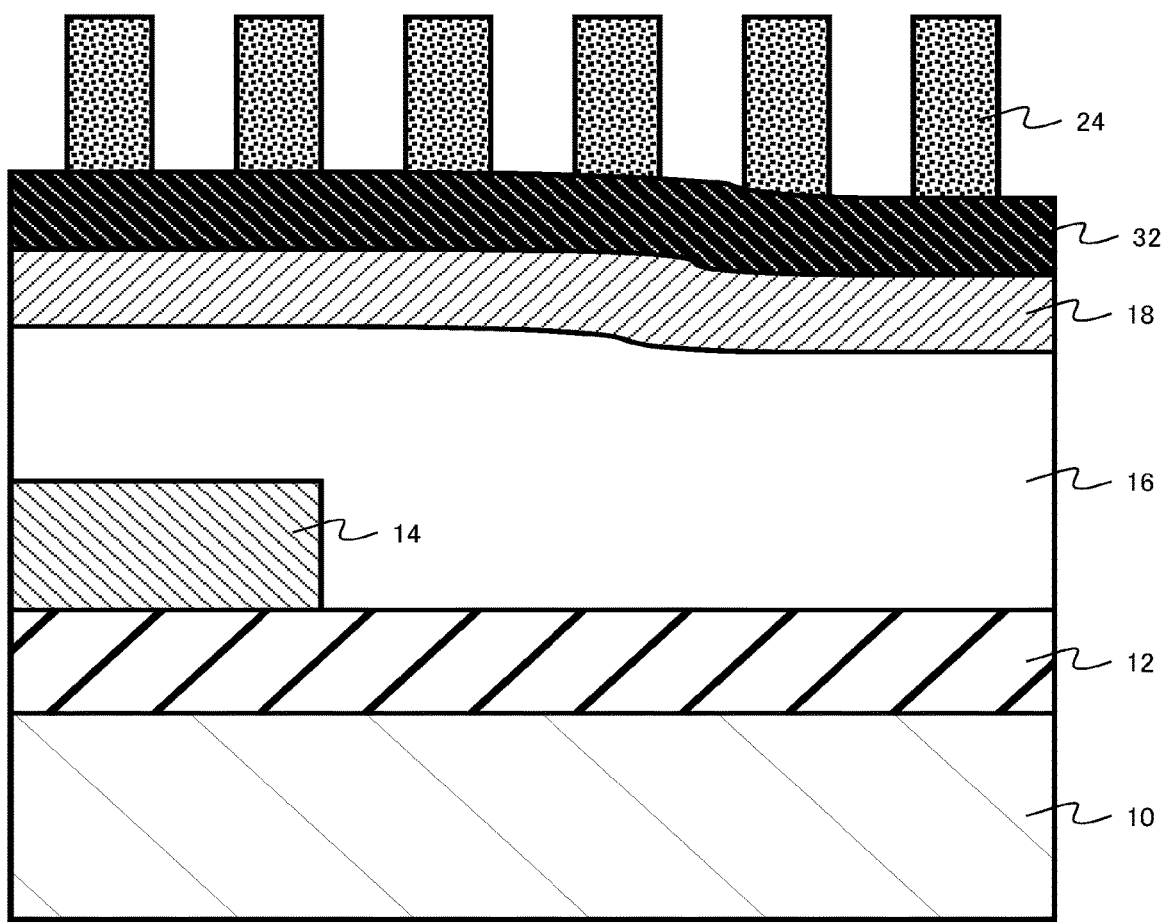
FIG. 63 is a schematic cross-sectional view showing an example of the method for manufacturing the semiconductor device according to the sixth embodiment.

Next, the entire surface of the resist layer 24 is etched, so that the thin resist layer 24 remaining in a space portion of a line pattern is removed (FIG. 63). The entire surface etching is performed using, for example, a known reactive ion etching device.

Figure 64:
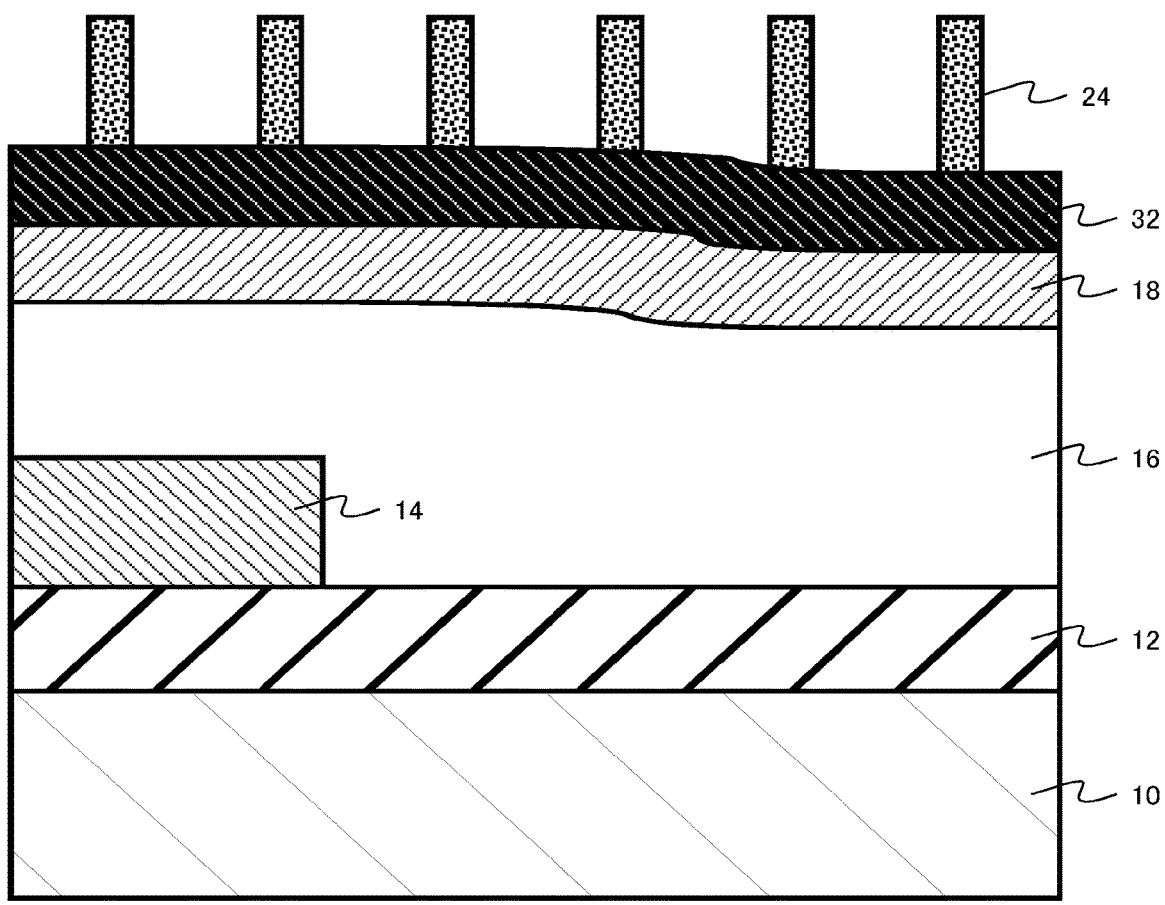
FIG. 64 is a schematic cross-sectional view showing an example of the method for manufacturing the semiconductor device according to the sixth embodiment.

Next, slimming processing is performed on the resist layer 24 to reduce a width of the resist layer 24 (FIG. 64). In the slimming processing, for example, asking using oxygen plasma is used.

Figure 65:
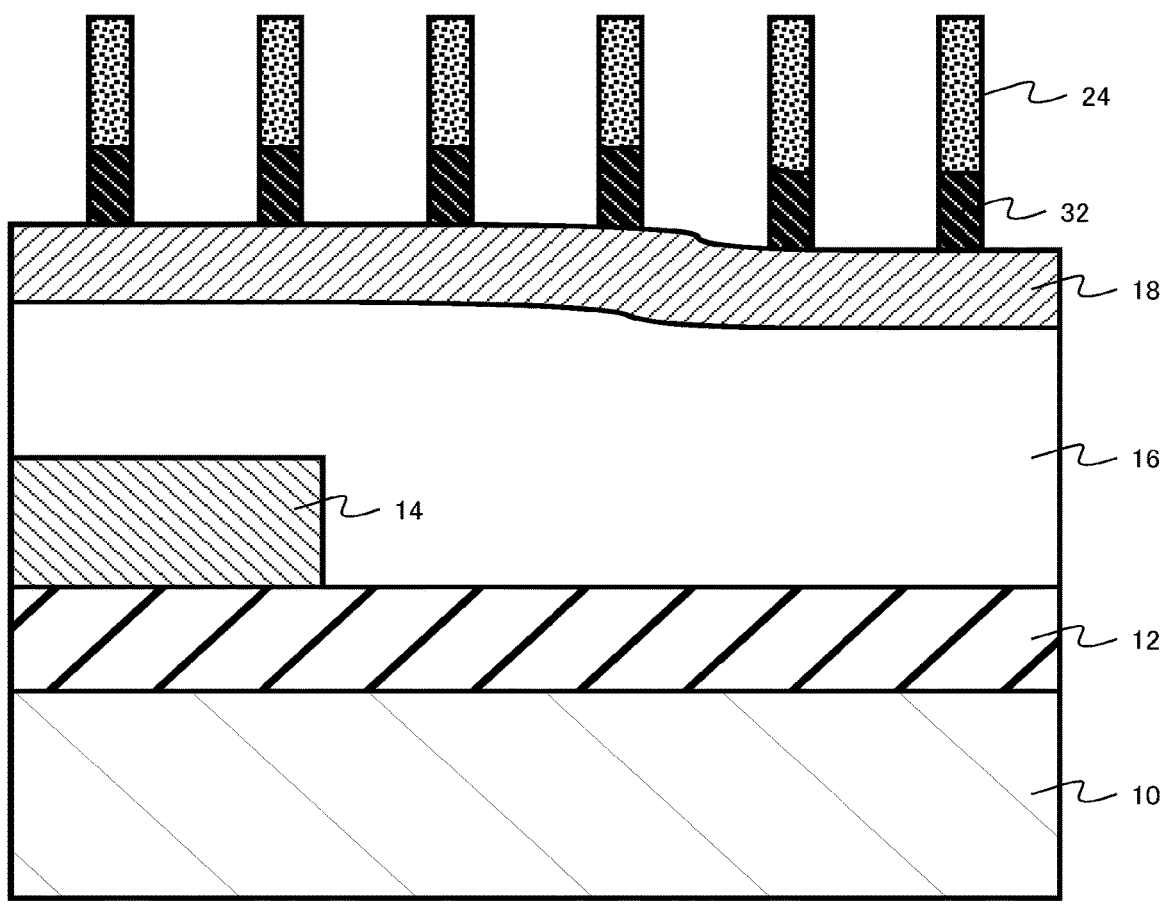
FIG. 65 is a schematic cross-sectional view showing an example of the method for manufacturing the semiconductor device according to the sixth embodiment.

Next, the sacrificial layer 32 is etched using the resist layer 24 as a mask (FIG. 65). The etching of the sacrificial layer 32 is performed using, for example, the known reactive ion etching device.

Figure 66:
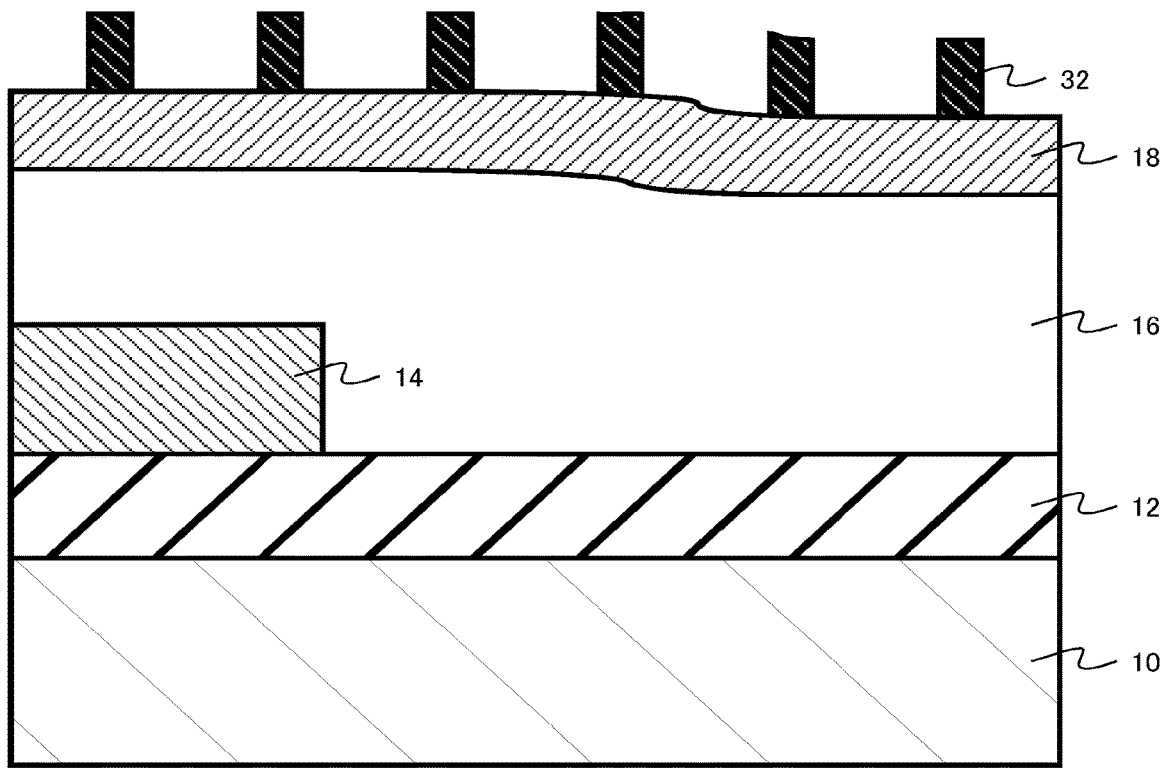
FIG. 66 is a schematic cross-sectional view showing an example of the method for manufacturing the semiconductor device according to the sixth embodiment.

Next, the resist layer 24 remaining on the patterned sacrificial layer 32 is removed (FIG. 66).

Figure 67:
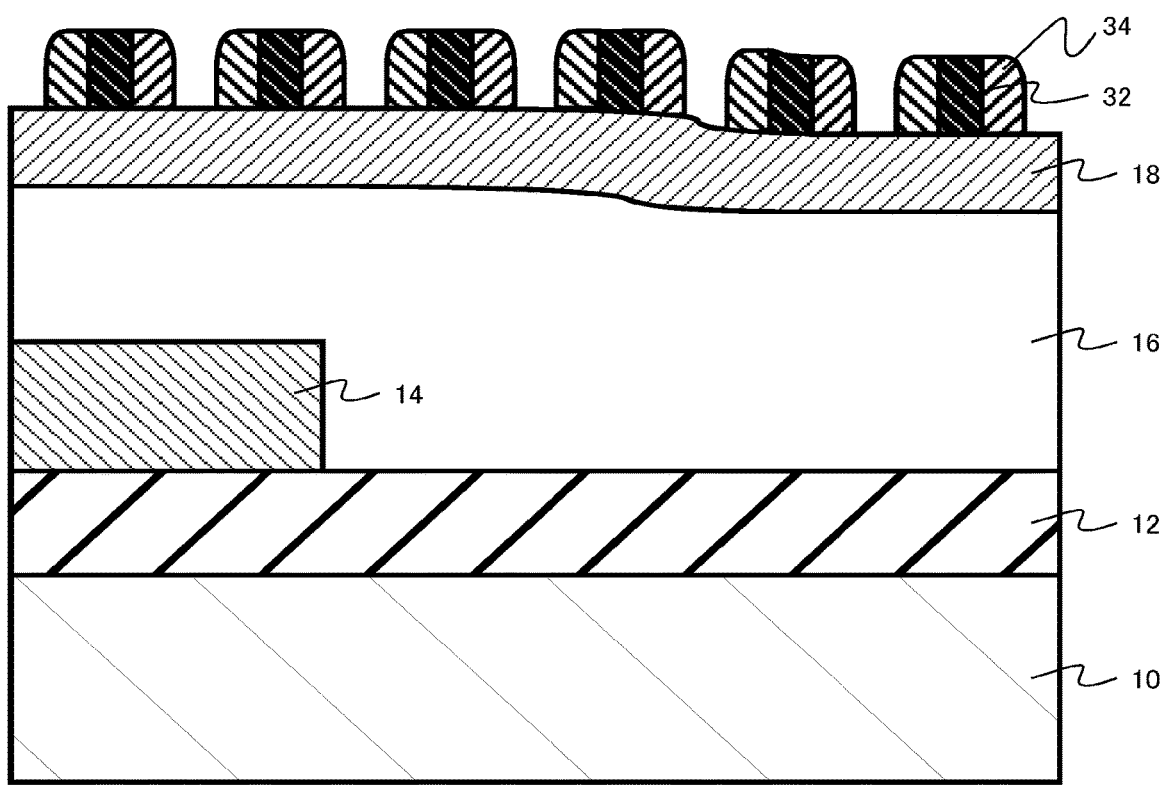
FIG. 67 is a schematic cross-sectional view showing an example of the method for manufacturing the semiconductor device according to the sixth embodiment.

Next, a sidewall layer 34 is formed on the side of the etched third layer (FIG. 67). The sidewall layer 34 is formed by a spacer process. The sidewall layer 34 is formed by, for example, depositing an insulating film by a CVD method and performing reactive ion etching on the insulating film.

Figure 68:
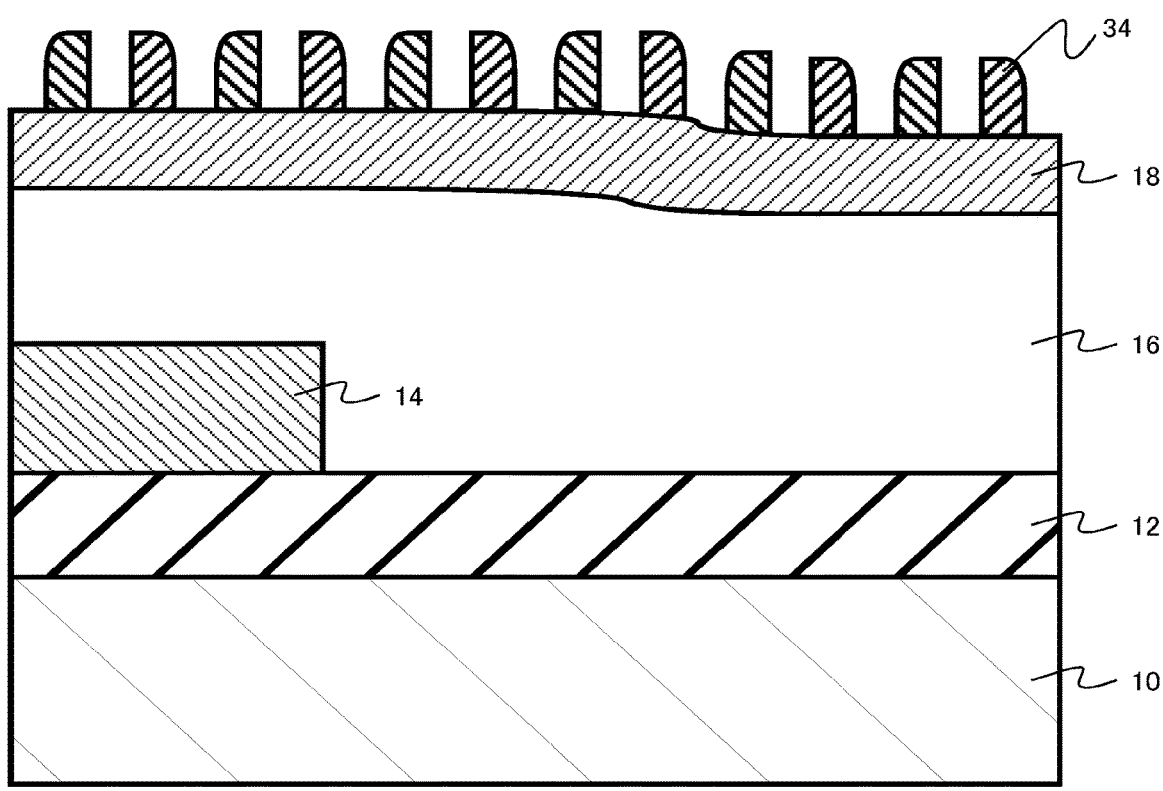
FIG. 68 is a schematic cross-sectional view showing an example of the method for manufacturing the semiconductor device according to the sixth embodiment.

Next, the sacrificial layer 32 is selectively removed with respect to the sidewall layer 34 and the second metal layer 18 (FIG. 68). The sacrificial layer 32 is removed using, for example, asking using oxygen plasma.

Figure 69:
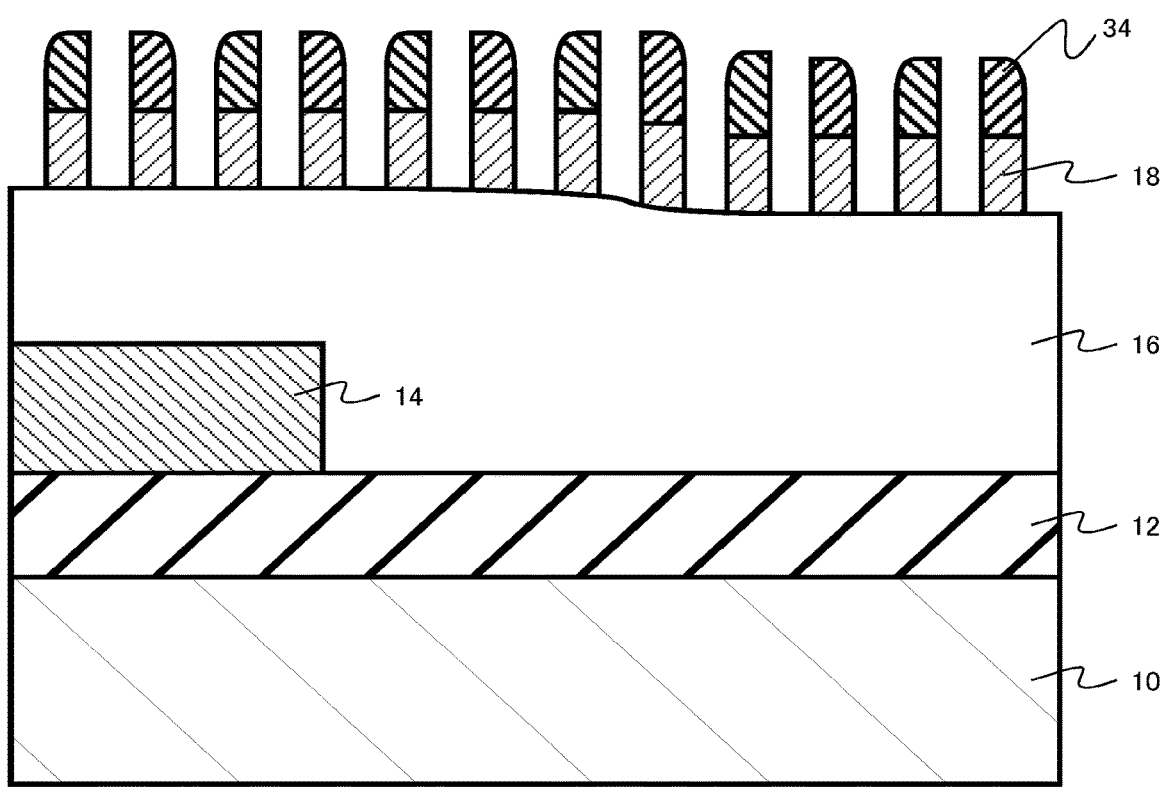
FIG. 69 is a schematic cross-sectional view showing an example of the method for manufacturing the semiconductor device according to the sixth embodiment.

Next, the second metal layer 18 is etched using the sidewall layer 34 as a mask (FIG. 69).

Figure 70:
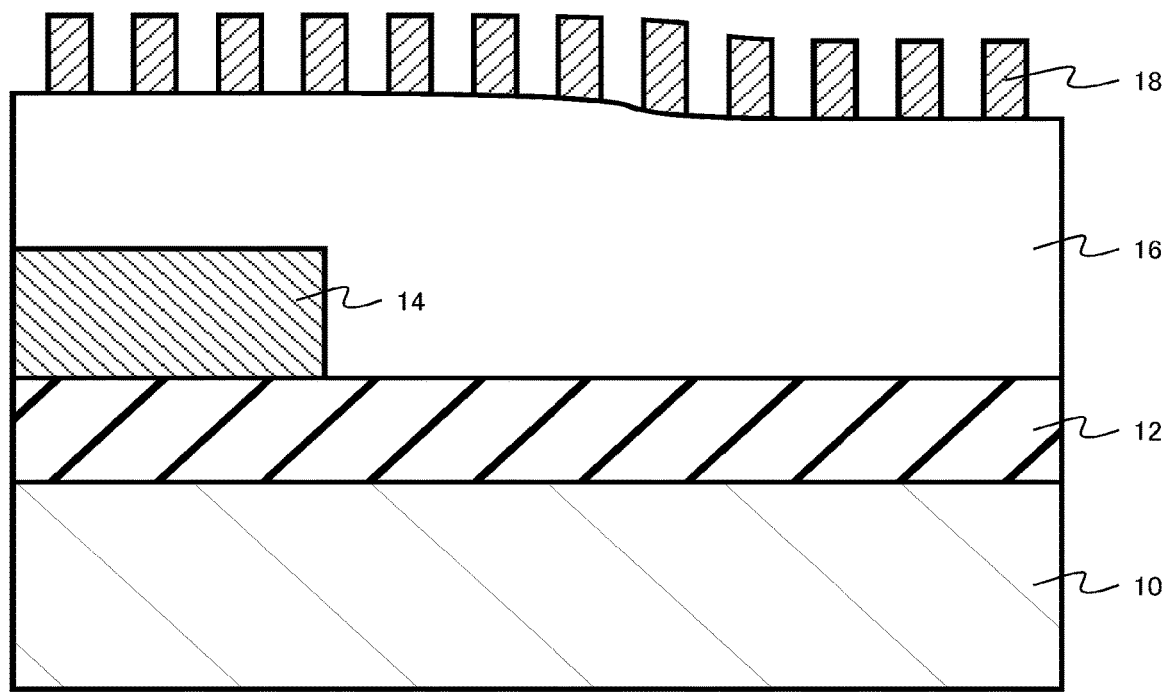
FIG. 70 is a schematic cross-sectional view showing an example of the method for manufacturing the semiconductor device according to the sixth embodiment.

Next, the sidewall layer 34 remaining on the second metal layer 18 is removed (FIG. 70). The sidewall layer 34 is removed by, for example, wet etching.

The pattern of the second metal layer 18 is formed on the semiconductor substrate 10 by the method for manufacturing the semiconductor device described above.

In the method for manufacturing the semiconductor device according to the sixth embodiment, from the viewpoint of reducing the surface step after polishing the second insulating layer 16, a storage elastic modulus of a polishing pad 17 is preferably 500 MPa or more and is more preferably 750 MPa or more.

In the method for manufacturing the semiconductor device according to the sixth embodiment, from the viewpoint of reducing the surface step after polishing of the second insulating layer 16, when the second insulating layer 16 is polished, it is preferable to polish the second insulating layer 16 while cooling the polishing pad 17. When the second insulating layer 16 is polished, the second insulating layer 16 is preferably polished while the polishing pad 17 is maintained at 50° C. or lower, and the second insulating layer 16 is more preferably polished while the polishing pad 17 is maintained at 40° C. or less.

In the method for manufacturing the semiconductor device according to the sixth embodiment, when the resist 20 is supplied to the surface of the sacrificial layer 32, it is preferable to apply the resist 20 to the entire surface of the sacrificial layer 32 by using a spin coating method. A time required for supplying the resist 20 can be reduced.

The first width w1 of the first plane P1 in the first direction perpendicular to the thickness direction of the semiconductor substrate 10 is preferably 1 mm or more. Further, the second width w2 of the second plane P2 in the first direction perpendicular to the thickness direction of the semiconductor substrate 10 is preferably 1 mm or more. When the widths of the first plane P1 and the second plane P2 are larger, the amount of the resist 20 on the second plane P2 is more likely to be insufficient. Therefore, the method for manufacturing the semiconductor device according to the sixth embodiment functions effectively.

As described above, according to the method for manufacturing the semiconductor device according to the sixth embodiment, it is possible to suppress the occurrence of pattern defects, similarly to the method for manufacturing the semiconductor device according to the first embodiment. Further, a fine pattern can be formed by applying the double patterning technology using the spacer process.

Seventh Embodiment

A method for manufacturing a semiconductor device according to a seventh embodiment includes: forming a first layer on a semiconductor substrate, a surface of the first layer having a first plane of which distance from the semiconductor substrate is a first distance and a second plane of which distance from the semiconductor substrate is a second distance smaller than the first distance, and a difference between the first distance and the second distance being 30 nm or more; performing planarization processing on the first layer to have the difference of less than 30 nm; forming a second layer directly on the first layer after performing the planarization processing; supplying a resist to the second layer; bringing a template having a pattern into contact with the resist to form a resist layer to which the pattern has been transferred; etching the second layer using the resist layer as a mask; forming a sidewall layer on a side of the etched second layer; selectively removing the second layer with respect to the sidewall layer and the first layer after forming the sidewall layer; and etching the first layer using the sidewall layer as a mask. The method for manufacturing the semiconductor device according to the seventh embodiment is different from a method for manufacturing a semiconductor device according to the third embodiment in that the second layer is formed directly on the first layer after performing the planarization processing, the resist is supplied to the second layer, the template having the pattern is brought into contact with the resist to form the resist layer to which the pattern has been transferred, the second layer is etched using the resist layer as the mask, the sidewall layer is formed on the side of the etched second layer, the second layer is selectively removed with respect to the sidewall layer and the first layer after forming the sidewall layer, and the first layer is etched using the sidewall layer as the mask. Hereinafter, description of contents overlapping with those of the third embodiment may be partially omitted.

FIGS. 71 to 84 are schematic cross-sectional views showing an example of the method for manufacturing the semiconductor device according to the seventh embodiment. In the method for manufacturing the semiconductor device according to the seventh embodiment, a chemical mechanical polishing method (CMP method) is used in the planarization processing.

Figure 71:
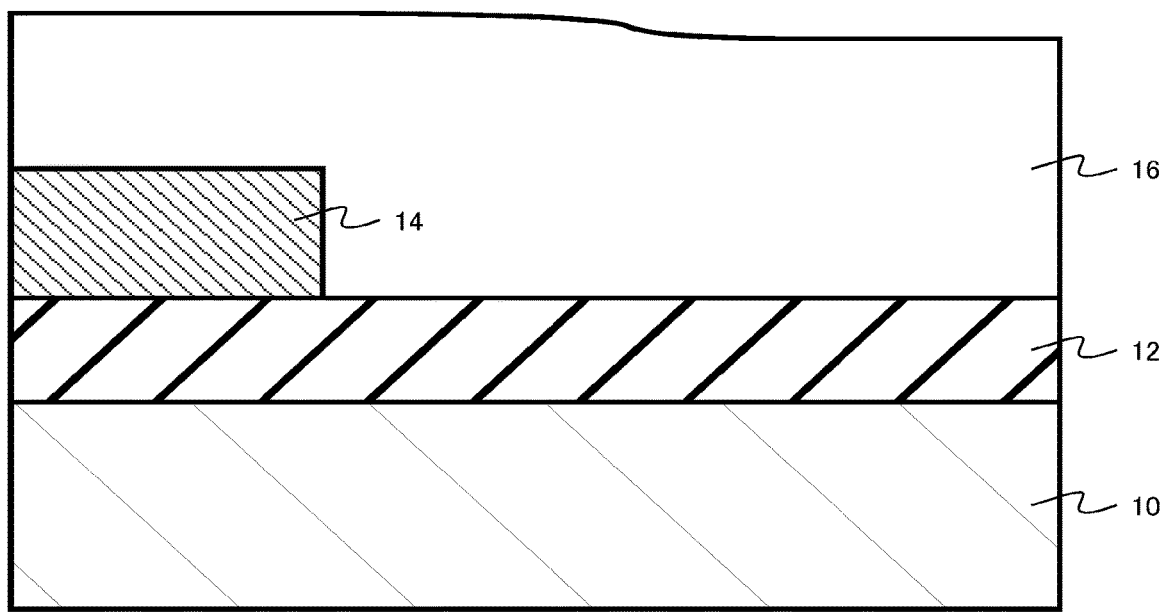
FIG. 71 is a schematic cross-sectional view showing an example of a method for manufacturing a semiconductor device according to a seventh embodiment.

The method for manufacturing the semiconductor device according to the seventh embodiment is the same as the method for manufacturing the semiconductor device according to the third embodiment until a second insulating layer 16 is polished using the chemical mechanical polishing method so that a surface step Δd is less than 30 nm (FIG. 71). The second insulating layer 16 is an example of a first layer.

The second insulating layer 16 is a processed layer on which a pattern is formed using a nanoimprint method. Further, a pattern of the second insulating layer 16 is formed by double patterning technology using a spacer process.

Figure 72:
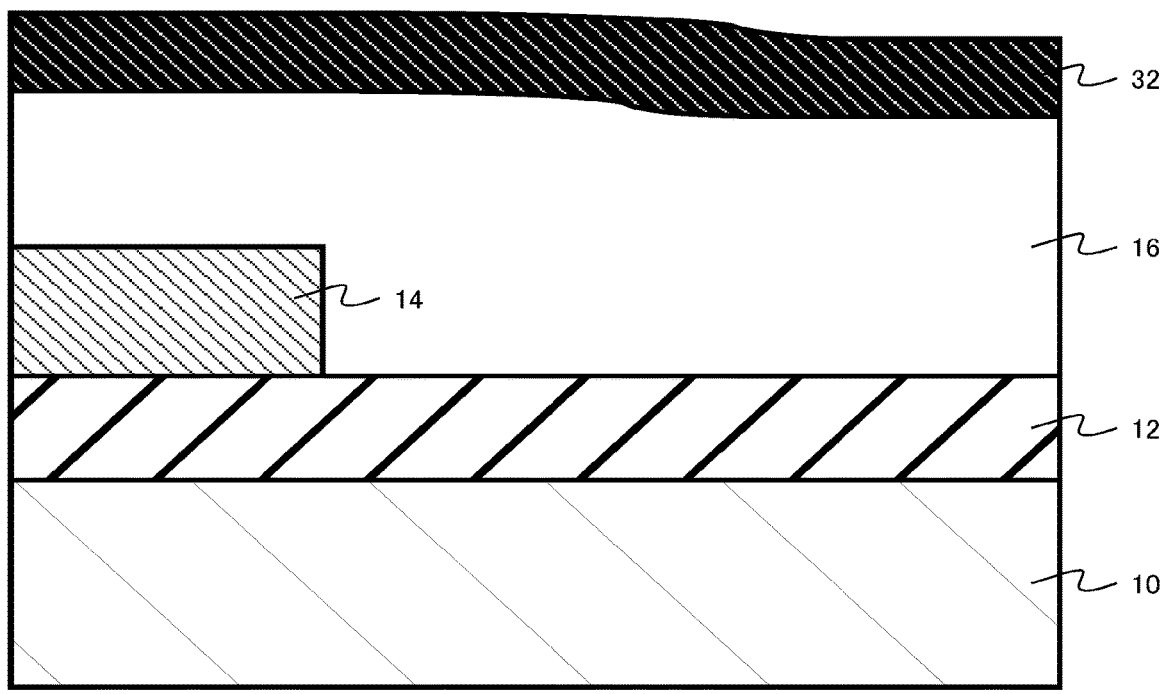
FIG. 72 is a schematic cross-sectional view showing an example of the method for manufacturing the semiconductor device according to the seventh embodiment.

A sacrificial layer 32 is formed on a surface of the second insulating layer 16 (FIG. 72). The sacrificial layer 32 is an example of the second layer. The sacrificial layer 32 is, for example, a stacked film of a carbon film and an insulating film formed by using a spin coating method.

Figure 73:
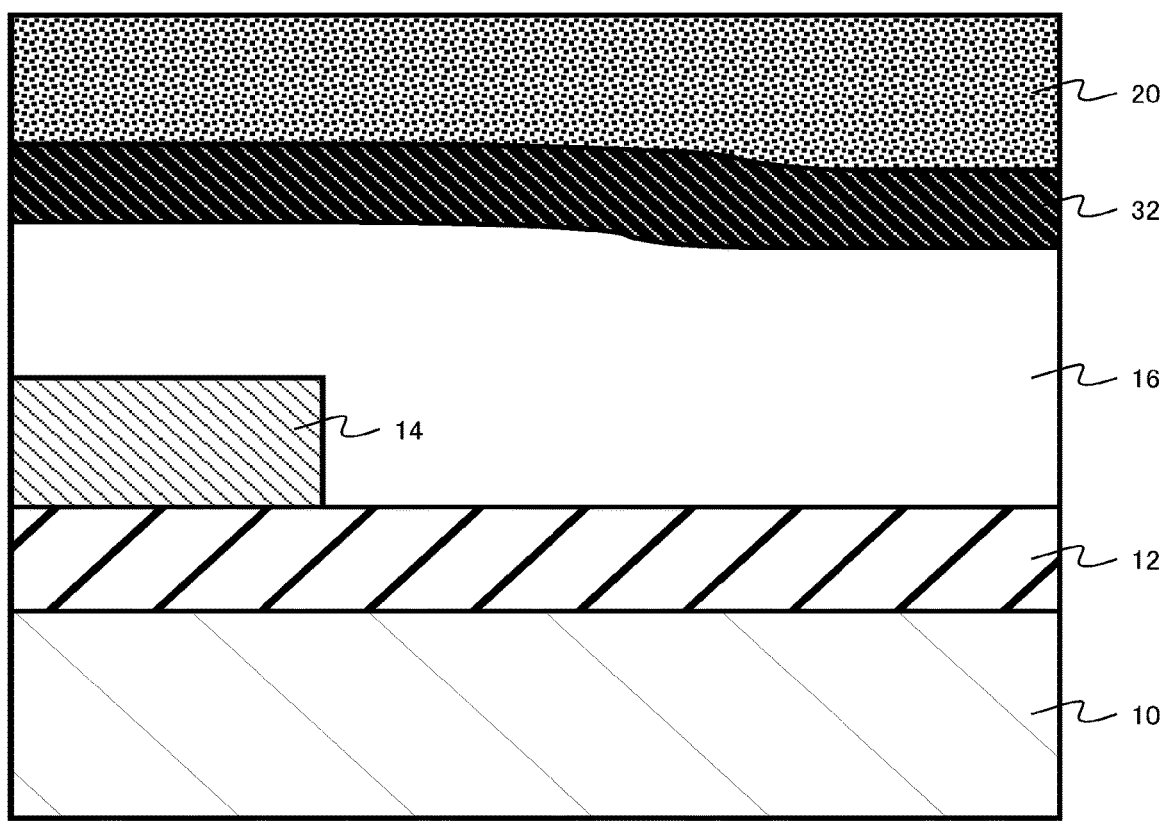
FIG. 73 is a schematic cross-sectional view showing an example of the method for manufacturing the semiconductor device according to the seventh embodiment.

Next, a resist 20 is supplied to a surface of the sacrificial layer 32 (FIG. 73). The resist 20 is applied to the entire surface of the sacrificial layer 32 by using, for example, the spin coating method. Further, the resist 20 is dropped on the surface of the sacrificial layer 32 by using, for example, an inkjet method.

The resist 20 is a resist used for the nanoimprint method. The resist 20 includes, for example, a photocurable resin or a thermosetting resin.

Figure 74:
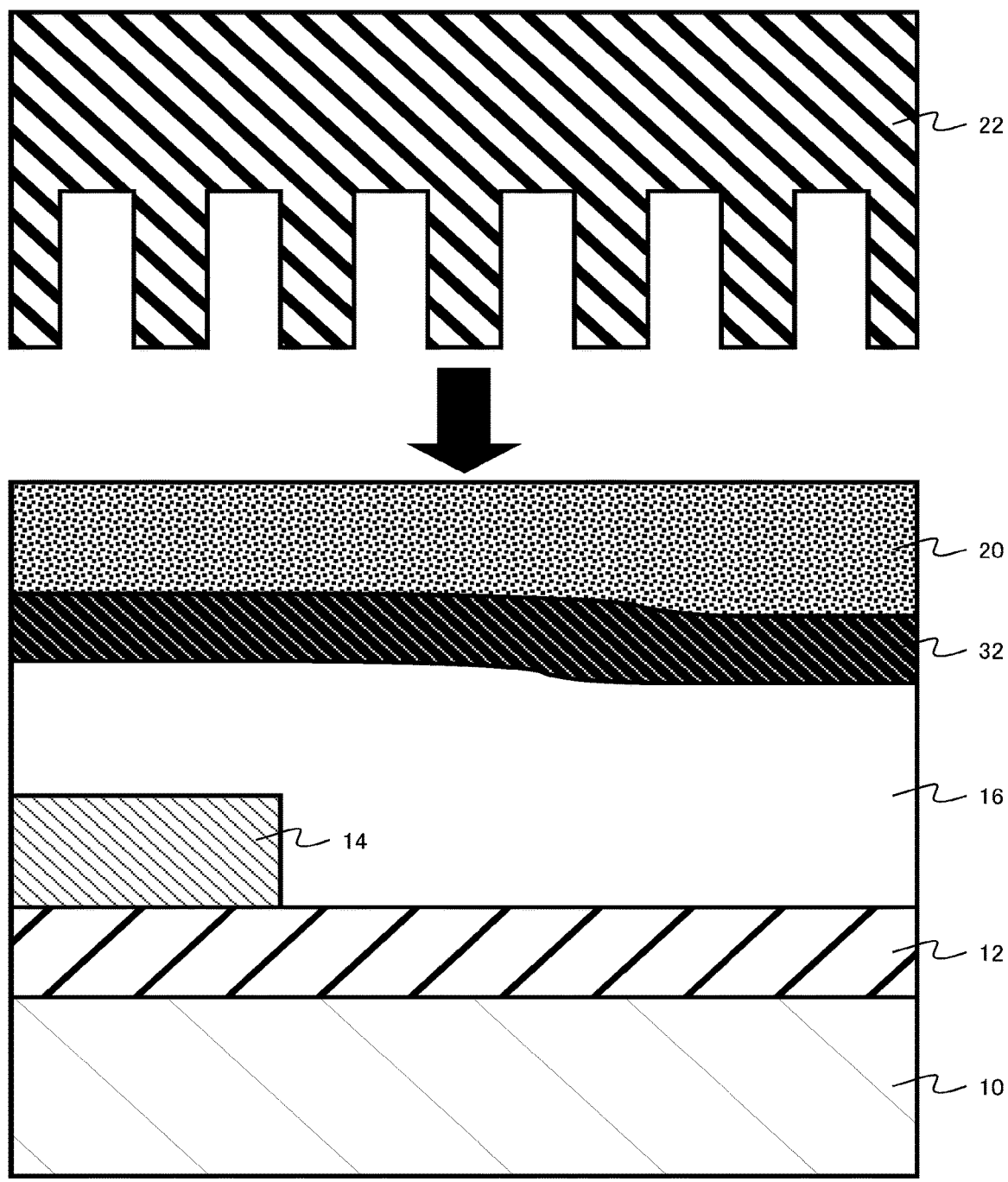
FIG. 74 is a schematic cross-sectional view showing an example of the method for manufacturing the semiconductor device according to the seventh embodiment.

Next, a template 22 (mold) having a pattern is brought into contact with the resist 20 on the surface of the sacrificial layer 32 (FIG. 74). As a material of the template 22, for example, when the resist 20 includes a photocurable resin, a material transmitting light is used. The template 22 is, for example, quartz glass.

Figure 75:
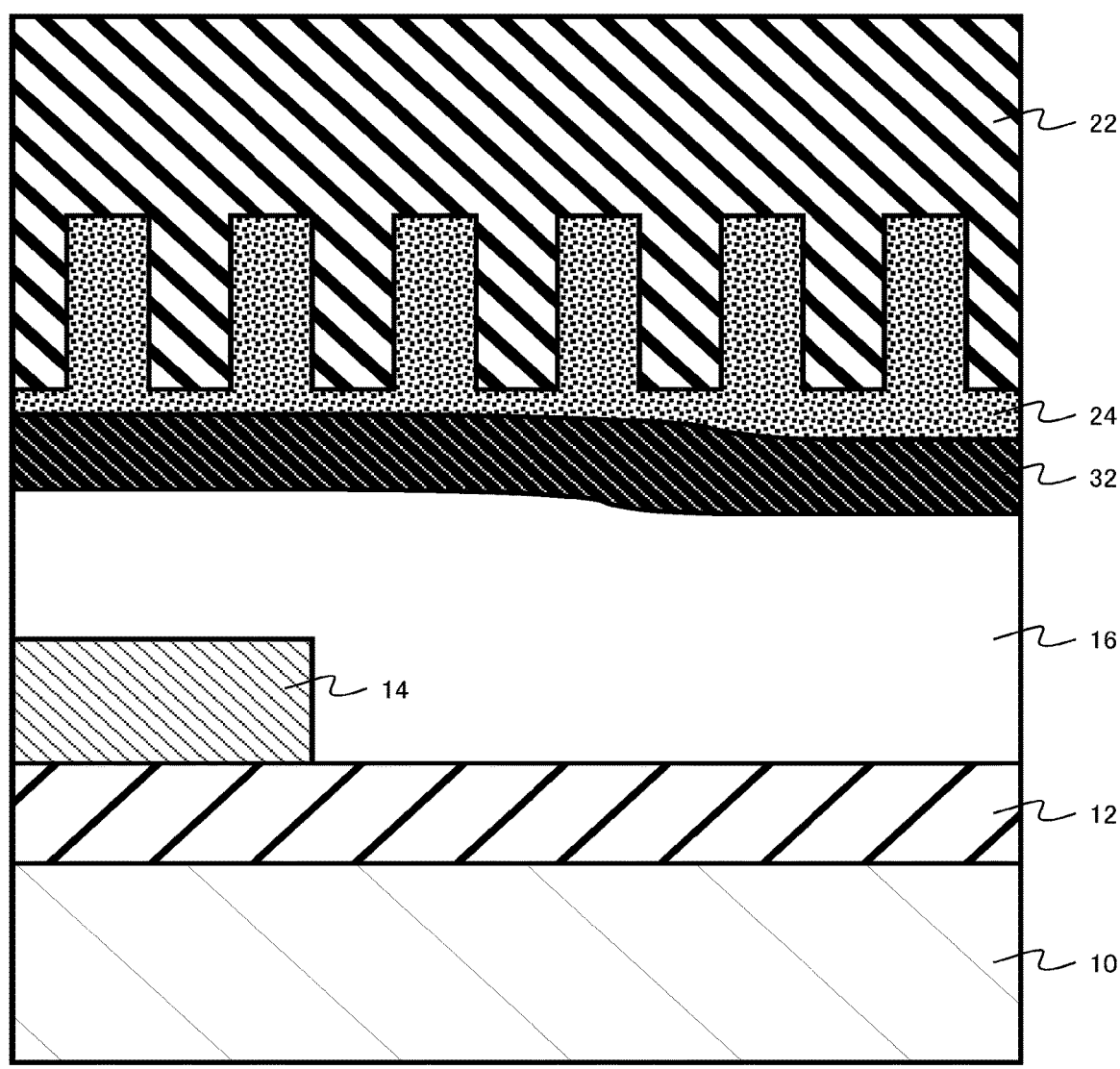
FIG. 75 is a schematic cross-sectional view showing an example of the method for manufacturing the semiconductor device according to the seventh embodiment.

By bringing the template 22 into contact with the resist 20 on the surface of the sacrificial layer 32, the resist 20 is sucked up into a concave portion of the template 22. The pattern of the template 22 is transferred to the resist 20, and a resist layer 24 is formed on the surface of the sacrificial layer 32 (FIG. 75).

Figure 76:
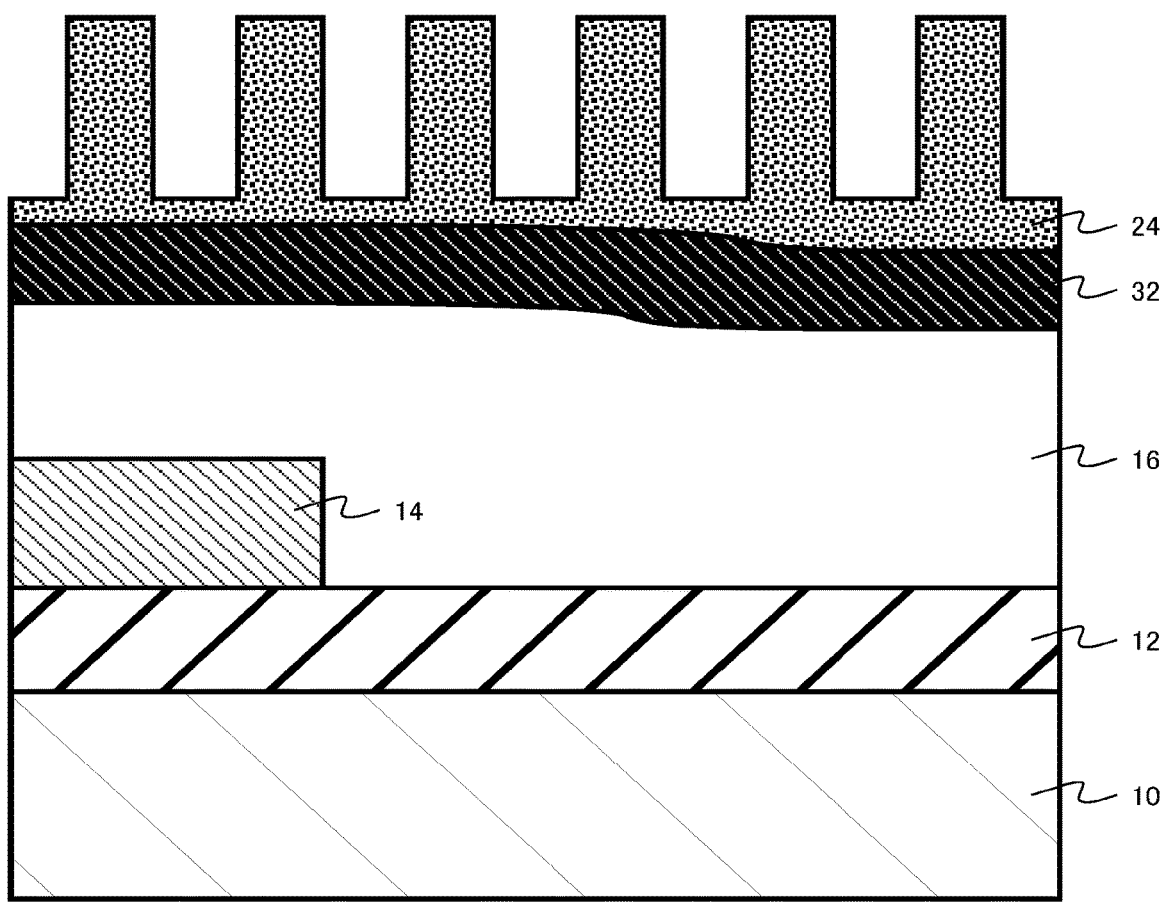
FIG. 76 is a schematic cross-sectional view showing an example of the method for manufacturing the semiconductor device according to the seventh embodiment.

After forming the resist layer 24 to which the pattern of the template 22 has been transferred, the template 22 is separated from the resist layer 24 (FIG. 76).

Figure 77:
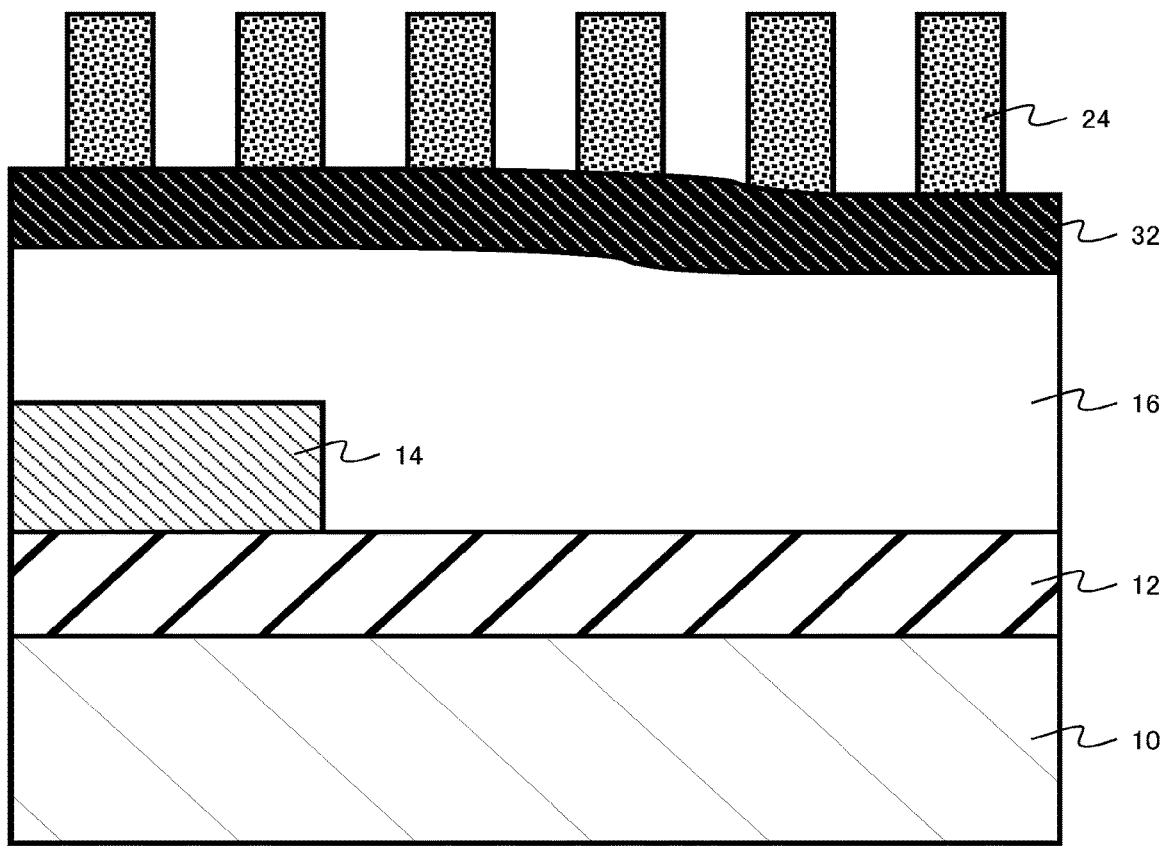
FIG. 77 is a schematic cross-sectional view showing an example of the method for manufacturing the semiconductor device according to the seventh embodiment.

Next, the entire surface of the resist layer 24 is etched, so that the thin resist layer 24 remaining in a space portion of a line pattern is removed (FIG. 77). The entire surface etching is performed using, for example, a known reactive ion etching device.

Figure 78:
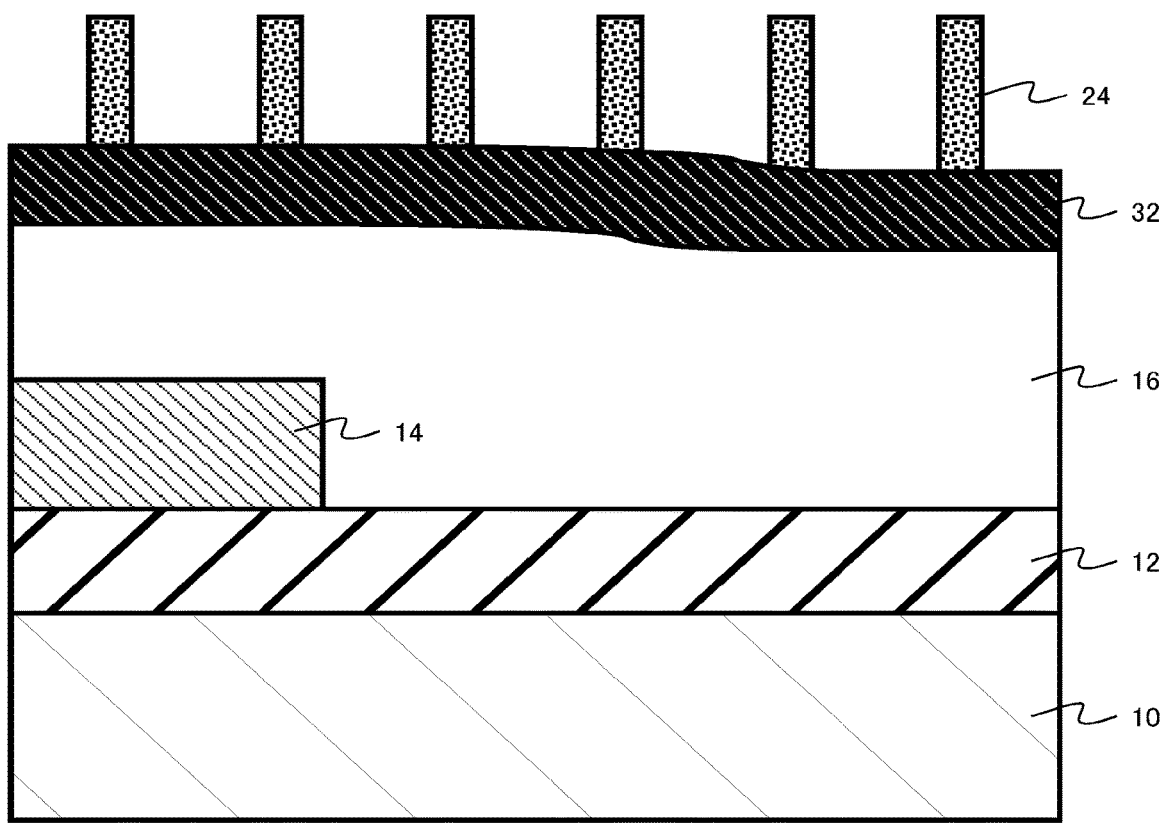
FIG. 78 is a schematic cross-sectional view showing an example of the method for manufacturing the semiconductor device according to the seventh embodiment.

Next, slimming processing is performed on the resist layer 24 to reduce a width of the resist layer 24 (FIG. 78). In the slimming processing, for example, asking using oxygen plasma is used.

Figure 79:
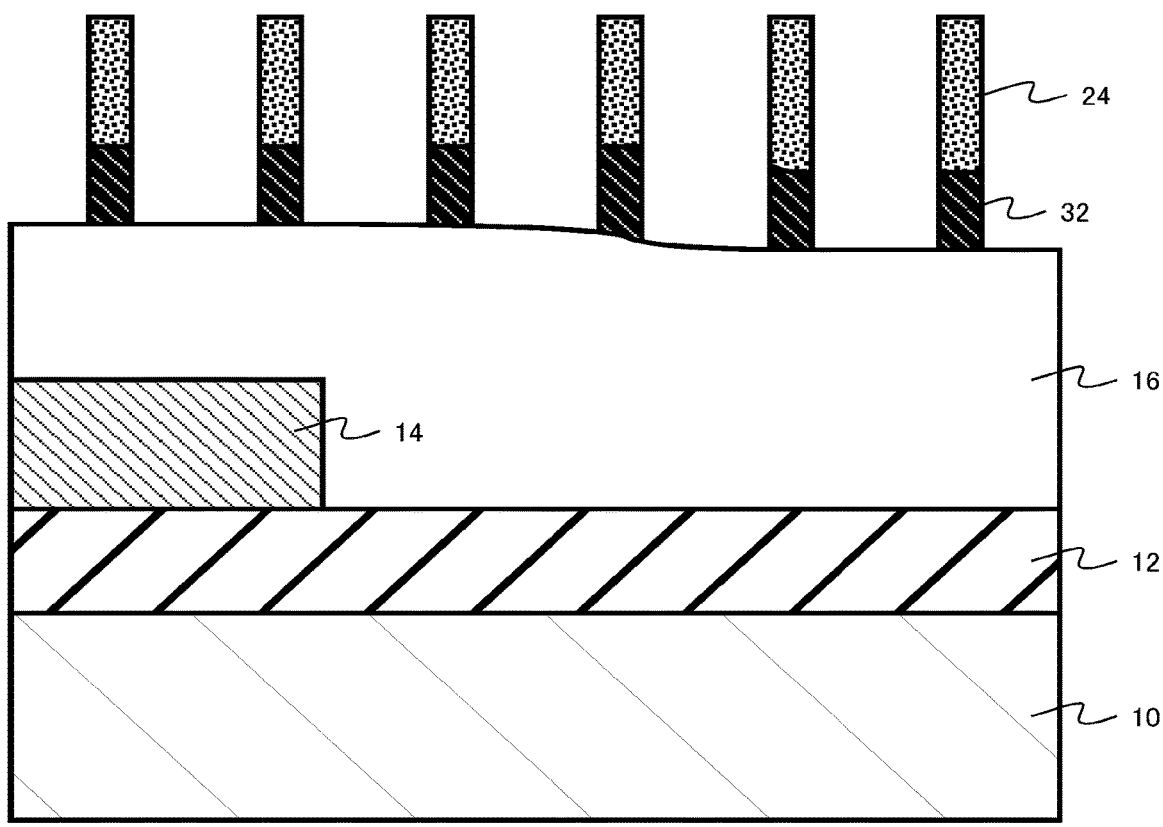
FIG. 79 is a schematic cross-sectional view showing an example of the method for manufacturing the semiconductor device according to the seventh embodiment.

Next, the sacrificial layer 32 is etched using the resist layer 24 as a mask (FIG. 79). The etching of the sacrificial layer 32 is performed using, for example, the known reactive ion etching device.

Figure 80:
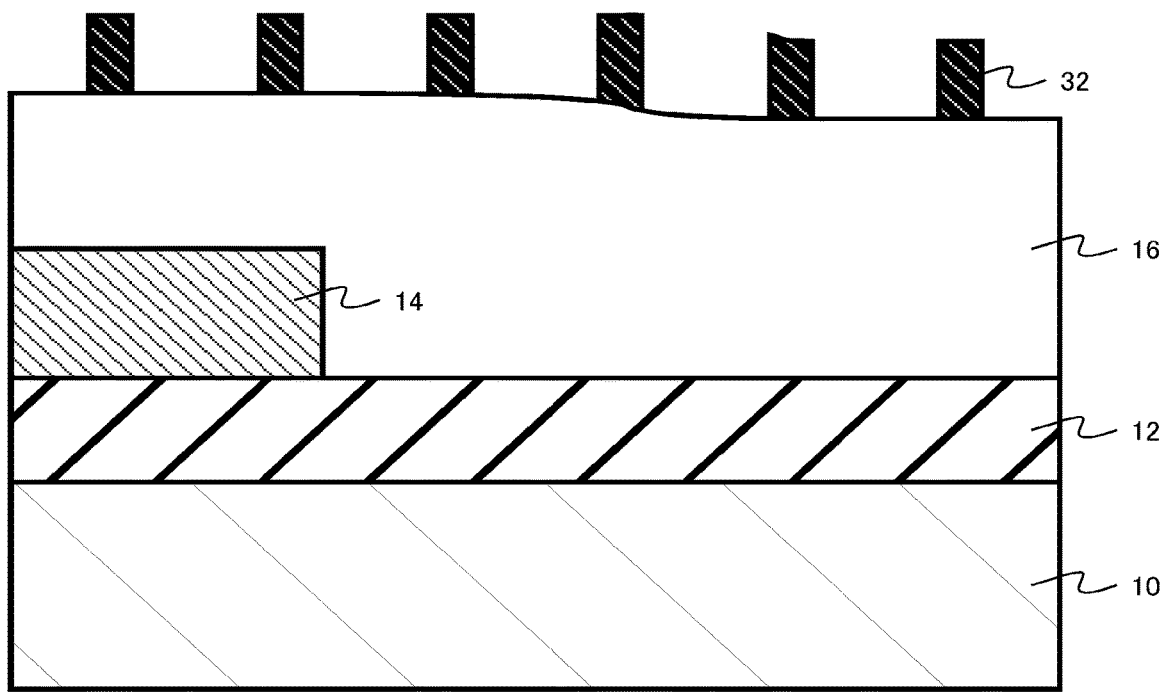
FIG. 80 is a schematic cross-sectional view showing an example of the method for manufacturing the semiconductor device according to the seventh embodiment.

Next, the resist layer 24 remaining on the patterned sacrificial layer 32 is removed (FIG. 80).

Figure 81:
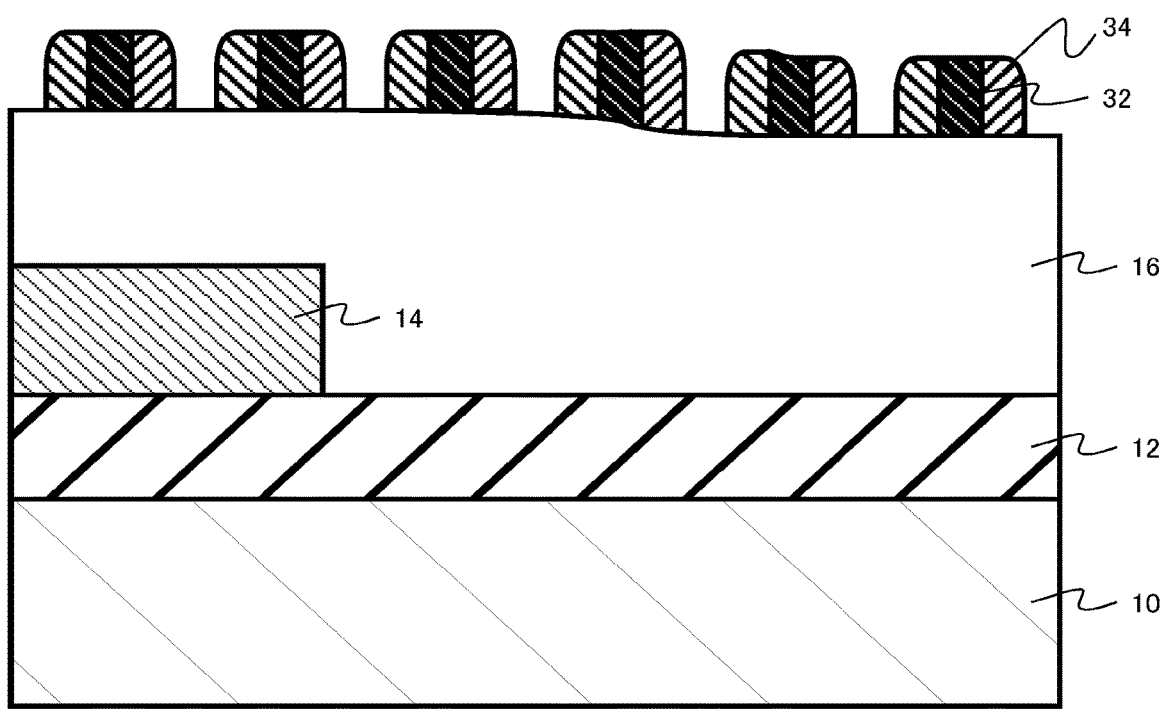
FIG. 81 is a schematic cross-sectional view showing an example of the method for manufacturing the semiconductor device according to the seventh embodiment.

Next, a sidewall layer 34 is formed on the side of the etched second layer (FIG. 81). The sidewall layer 34 is formed by a spacer process. The sidewall layer 34 is formed by, for example, depositing an insulating film by a CVD method and performing reactive ion etching on the insulating film.

Figure 82:
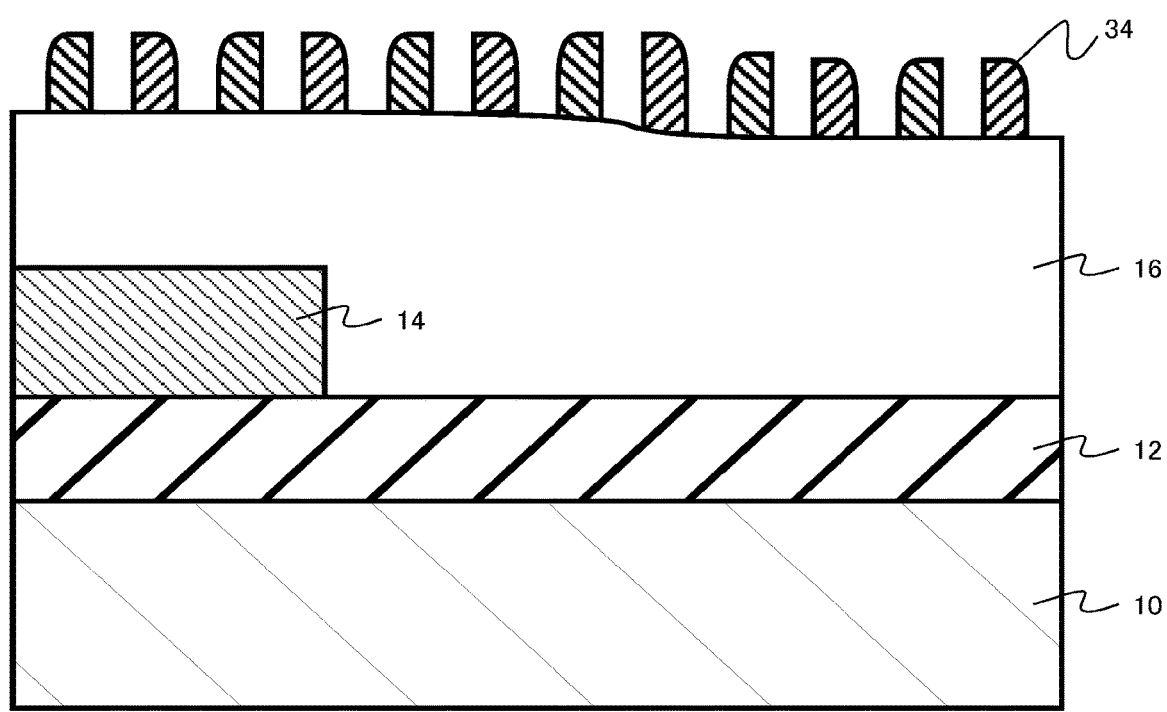
FIG. 82 is a schematic cross-sectional view showing an example of the method for manufacturing the semiconductor device according to the seventh embodiment.

Next, the sacrificial layer 32 is selectively removed with respect to the sidewall layer 34 and the second insulating layer 16 (FIG. 82). The sacrificial layer 32 is removed using, for example, asking using oxygen plasma.

Figure 83:
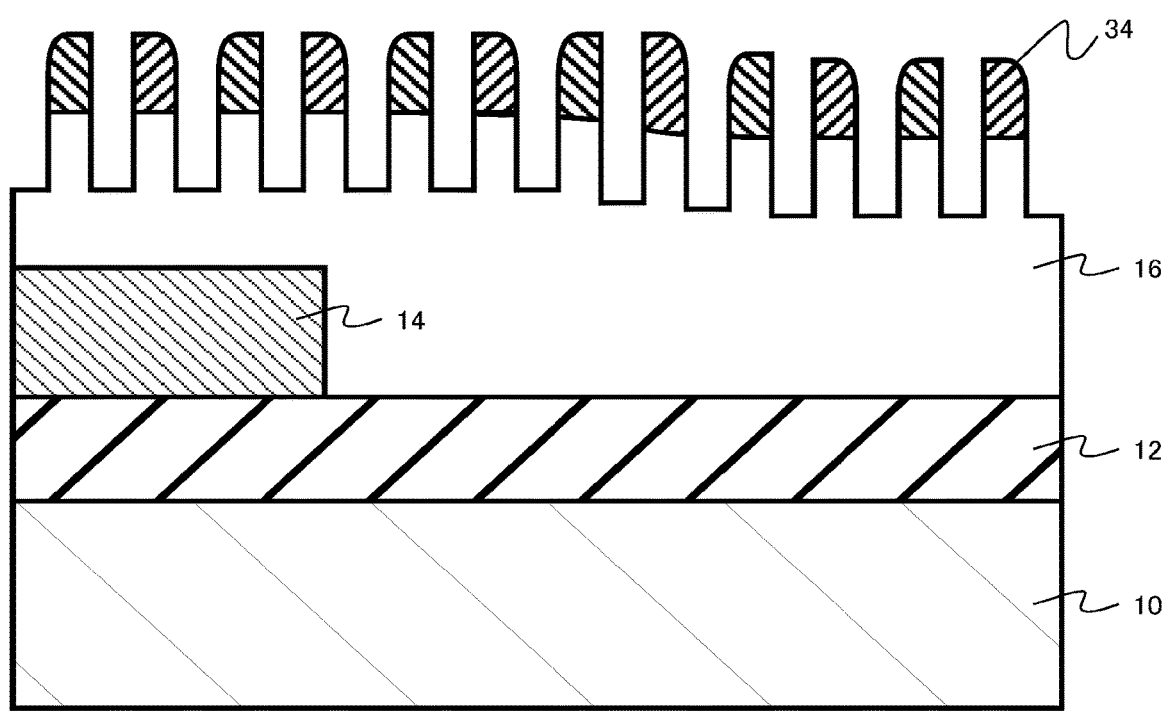
FIG. 83 is a schematic cross-sectional view showing an example of the method for manufacturing the semiconductor device according to the seventh embodiment.

Next, the second insulating layer 16 is etched using the sidewall layer 34 as a mask (FIG. 83).

Figure 84:
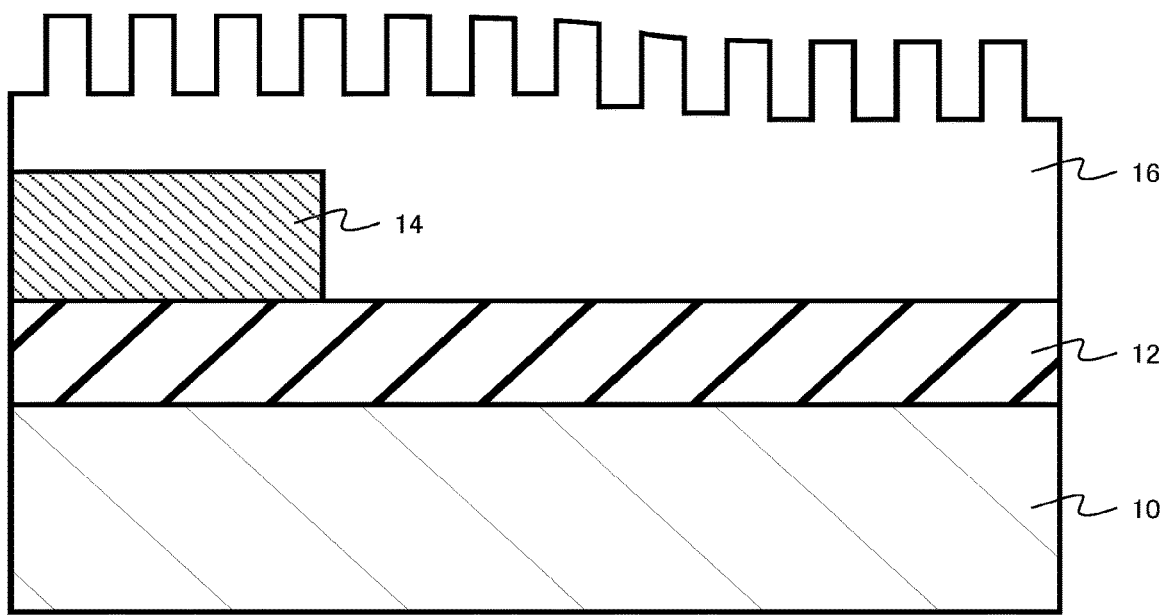
FIG. 84 is a schematic cross-sectional view showing an example of the method for manufacturing the semiconductor device according to the seventh embodiment.

Next, the sidewall layer 34 remaining on the second insulating layer 16 is removed (FIG. 84). The sidewall layer 34 is removed by, for example, wet etching.

The pattern of the second insulating layer 16 is formed on the semiconductor substrate 10 by the method for manufacturing the semiconductor device described above.

In the method for manufacturing the semiconductor device according to the seventh embodiment, from the viewpoint of reducing the surface step after polishing the second insulating layer 16, a storage elastic modulus of a polishing pad 17 is preferably 500 MPa or more and is more preferably 750 MPa or more.

In the method for manufacturing the semiconductor device according to the seventh embodiment, from the viewpoint of reducing the surface step after polishing of the second insulating layer 16, when the second insulating layer 16 is polished, it is preferable to polish the second insulating layer 16 while cooling the polishing pad 17. When the second insulating layer 16 is polished, the second insulating layer 16 is preferably polished while the polishing pad 17 is maintained at 50° C. or lower, and the second insulating layer 16 is more preferably polished while the polishing pad 17 is maintained at 40° C. or less.

In the method for manufacturing the semiconductor device according to the seventh embodiment, when the resist 20 is supplied to the surface of the sacrificial layer 32, it is preferable to apply the resist 20 to the entire surface of the sacrificial layer 32 by using a spin coating method. A time required for supplying the resist 20 can be reduced.

The first width w1 of the first plane P1 in the first direction perpendicular to the thickness direction of the semiconductor substrate 10 is preferably 1 mm or more. Further, the second width w2 of the second plane P2 in the first direction perpendicular to the thickness direction of the semiconductor substrate 10 is preferably 1 mm or more. When the widths of the first plane P1 and the second plane P2 are larger, the amount of the resist 20 on the second plane P2 is more likely to be insufficient. Therefore, the method for manufacturing the semiconductor device according to the seventh embodiment functions effectively.

As described above, according to the method for manufacturing the semiconductor device according to the seventh embodiment, it is possible to suppress the occurrence of pattern defects, similarly to the method for manufacturing the semiconductor device according to the first embodiment. Further, a fine pattern can be formed by applying the double patterning technology using the spacer process.

In the first, second, fourth, and sixth embodiments, the case where the second layer to be the processed layer is the metal layer and the pattern is formed on the metal layer has been described as an example. However, the present disclosure is also applicable to the case where the second layer is an insulating layer and a pattern is formed on the insulating layer, for example.

In the first to seventh embodiments, the case where the line-and-space pattern is formed in the processed layer has been described as an example. However, the present disclosure is also applicable to the case where a contact hole is formed in the processed layer.

Further, in the second embodiment, the case where the semiconductor memory in which the memory cells are arranged three-dimensionally is the three-dimensional NAND flash memory has been described as an example. However, the present disclosure is also applicable to other memory such as a resistance change type memory, a dynamic random access memory, and a ferroelectric memory in the case of a semiconductor memory in which memory cells are arranged three-dimensionally.

In the first to seventh embodiments, the case where the chemical mechanical polishing method is used in the planarization processing has been described as an example. However, a method different from the chemical mechanical polishing method may be used in the planarization processing. For example, it is also possible to use chemical planarization using an oxidizing catalyst and a basic catalyst in the planarization processing.

While certain embodiments have been described, these embodiments have been presented by way of example only, and are not intended to limit the scope of the inventions. Indeed, the method for manufacturing the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, the method comprising:
    forming a first layer on a semiconductor substrate, a surface of the first layer having a first plane of which distance from the semiconductor substrate is a first distance and a second plane of which distance from the semiconductor substrate is a second distance smaller than the first distance, and a difference between the first distance and the second distance being 30 nm or more;
    performing planarization processing on the first layer to have the difference of less than 30 nm;
    forming a second layer directly on the first layer after the performing the planarization processing;
    supplying a resist on the second layer;
    bringing a template having a pattern into contact with the resist to form a resist layer to which the pattern has been transferred; and
    etching the second layer using the resist layer as a mask.

2. The method for manufacturing a semiconductor device according to claim 1, further comprising:
    etching the first layer using the second layer as a mask after the etching the second layer.

3. The method for manufacturing a semiconductor device according to claim 1, further comprising:
    forming a sidewall layer on a side of the second layer after the etching the second layer;

removing selectively the second layer with respect to the sidewall layer and the first layer after the forming the sidewall layer; and etching the first layer using the sidewall layer as a mask.

4. The method for manufacturing a semiconductor device according to claim 1, wherein a chemical mechanical polishing method is used in the performing the planarization processing.

5. The method for manufacturing a semiconductor device according to claim 4, wherein, in the performing the planarization processing, a polishing pad is brought into contact with a surface of the first layer to polish the first layer while cooling the polishing pad.

6. The method for manufacturing a semiconductor device according to claim 4, wherein, in the performing the planarization processing, a polishing pad is brought into contact with a surface of the first layer to polish the first layer while maintaining a temperature of the polishing pad at 50° C. or lower.

7. The method for manufacturing a semiconductor device according to claim 4, wherein, in the performing the planarization processing, a polishing pad having a storage elastic modulus of 500 MPa or more is brought into contact with a surface of the first layer.

8. The method for manufacturing a semiconductor device according to claim 1, wherein, in the supplying the resist, the resist is applied using a spin coating method.

9. The method for manufacturing a semiconductor device according to claim 1, wherein a first width of the first plane in a first direction perpendicular to a thickness direction of the semiconductor substrate is 1 mm or more, and a second width of the second plane in the first direction is 1 mm or more.

10. The method for manufacturing a semiconductor device according to claim 1, further comprising:
before the forming the first layer, forming a first memory cell array and a second memory cell array on the semiconductor substrate so as to be separated from each other in a direction perpendicular to a thickness direction of the semiconductor substrate, wherein
the first memory cell array and the first layer are located between the first plane and the semiconductor substrate, and the first layer sandwiched between the first memory cell array and the second memory cell array is located between the second plane and the semiconductor substrate.

11. A method for manufacturing a semiconductor device, the method comprising:
forming a first layer on a semiconductor substrate, a surface of the first layer having a first plane of which distance from the semiconductor substrate is a first distance and a second plane of which distance from the semiconductor substrate is a second distance smaller than the first distance, and a difference between the first distance and the second distance being 30 nm or more;
performing planarization processing on the first layer to have the difference of less than 30 nm;
supplying a resist on the first layer after the performing the planarization processing;
bringing a template having a pattern into contact with the resist to form a resist layer to which the pattern has been transferred; and
etching the first layer using the resist layer as a mask.

12. The method for manufacturing a semiconductor device according to claim 11, wherein a chemical mechanical polishing method is used in the performing the planarization processing.

13. The method for manufacturing a semiconductor device according to claim 12, wherein, in the performing the planarization processing, a polishing pad is brought into contact with a surface of the first layer to polish the first layer while cooling the polishing pad.

14. The method for manufacturing a semiconductor device according to claim 12, wherein, in the performing the planarization processing, a polishing pad is brought into contact with a surface of the first layer to polish the first layer while maintaining a temperature of the polishing pad at 50° C. or lower.

15. The method for manufacturing a semiconductor device according to claim 12, wherein, in the performing the planarization processing, a polishing pad having a storage elastic modulus of 500 MPa or more is brought into contact with a surface of the first layer.

16. A method for manufacturing a semiconductor device, the method comprising:
forming a first layer on a semiconductor substrate, a surface of the first layer having a first plane of which distance from the semiconductor substrate is a first distance and a second plane of which distance from the semiconductor substrate is a second distance smaller than the first distance, and a difference between the first distance and the second distance being 30 nm or more;
performing planarization processing on the first layer to have the difference of less than 30 nm;
forming a second layer directly on the first layer after the performing the planarization processing;
forming a third layer directly on the second layer;
supplying a resist on the third layer;
bringing a template having a pattern into contact with the resist to form a resist layer to which the pattern has been transferred; and
etching the third layer using the resist layer as a mask.

17. The method for manufacturing a semiconductor device according to claim 16, further comprising:
etching the second layer using the third layer as a mask after the etching the third layer.

18. The method for manufacturing a semiconductor device according to claim 16, further comprising:
forming a sidewall layer on a side of the third layer after the etching the third layer;
removing selectively the third layer with respect to the sidewall layer and the second layer after the forming the sidewall layer; and
etching the second layer using the sidewall layer as a mask.

19. The method for manufacturing a semiconductor device according to claim 16, wherein a chemical mechanical polishing method is used in the processing the planarization processing.

20. The method for manufacturing a semiconductor device according to claim 19, wherein, in the performing the planarization processing, a polishing pad is brought into contact with a surface of the first layer to polish the first layer while cooling the polishing pad.

* * * * *